United States Patent
Imai

[11] Patent Number: 6,160,291
[45] Date of Patent: Dec. 12, 2000

[54] SOI-MOS FIELD EFFECT TRANSISTOR WITH IMPROVED SOURCE/DRAIN STRUCTURE

[75] Inventor: Kiyotaka Imai, Tokyo, Japan

[73] Assignee: NEC Corporation, Tokyo, Japan

[21] Appl. No.: 09/047,504

[22] Filed: Mar. 25, 1998

[30] Foreign Application Priority Data

Mar. 26, 1997 [JP] Japan .................................. 9-072913

[51] Int. Cl.$^7$ .................................................. H01L 27/01
[52] U.S. Cl. ........................ 257/347; 257/348; 257/349; 257/350; 257/351; 257/352; 257/353; 257/354; 257/355
[58] Field of Search .................................... 257/347–355

[56] References Cited

FOREIGN PATENT DOCUMENTS 2-291175 11/1990 Japan .
4-14262 1/1992 Japan .

OTHER PUBLICATIONS

Yasuhiro Sato et al., "Characteristics of ¼–μm Gate Ultrathin–Film MOSFETS/SIMOX with Tungsten–Deposited Low–Resistance Source/Drain", Proceedings 1995 IEEE International SOI Conference, Oct. 1995, pp. 28–29.
F. Deng et al.., "Deep Salicidation Using Nickel For Suppressing the Floating Body Effect in Partially Depleted SOI–MOSFET", Proceedings 1996 IEEE International SOI Conference, Oct. 1996, pp. 78–79.

Primary Examiner—Fetsum Abraham
Attorney, Agent, or Firm—Young & Thompson

[57] ABSTRACT

The present invention provides a source/drain structure formed in a semiconductor layer which has source and drain regions of a first conductivity type and a body portion of a second conductivity type disposed between said source and drain regions. The body portion is positioned under a gate insulation film over which a gate electrode is provided. The source region has a first low resistive region which is lower in electrical resistivity than said source region and said drain region having a second low resistive region which is lower in electrical resistively than said source region. For the first present invention, it is important that a distance of an inside edge portion of the first low resistive region from a first interface between the source region and the body portion is shorter than a distance of an inside portion of the second low resistive region from a second interface between the drain region and the body portion.

79 Claims, 16 Drawing Sheets he present invention relates to an SOI-MOS field effect
SOI-MOS FIELD EFFECT TRANSISTOR WITH IMPROVED SOURCE/DRAIN STRUCTURE

BACKGROUND OF THE INVENTION

The present invention relates to an SOI-MOS field effect transistor and a method of forming the same.

One of conventional SOI-MOS field effect transistors will be described with reference to FIG. 3. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has n-type source/drain regions 10 and 9 and a p-type body portion 5 between the n-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion S. Side wall oxide films 8 are also provided on side walls of the gate electrode 7 and over the gate oxide film 6. An inter-layer insulator 11 is further provided over the field oxide films 4, the silicon-on-insulator layer 3 and the gate electrode 7 as well as over the side wall oxide films 8. Contact holes 12 are formed in the inter-layer insulator 11 so that the contact holes 12 are positioned over the source/drain regions 10 and 9. Contact layers are formed in the contact holes 12 so that the contact layers are in contact with the source/drain regions 10 and 9. Metal interconnections 13 are provided which are connected to the contact layers so that the metal interconnections 13 are electrically connected to the source/drain regions 10 and 9.

FIG. 1 is a graph illustrative of sub-threshold characteristics (Id-Vg characteristics) or current-voltage characteristics of the above first conventional SOI-MOS field effect transistor when applied with drain voltages of 1.5 V and 0.05 V. If the drain voltage of 0.05 V is applied to the drain electrode of the above first conventional SOI-MOS field effect transistor, then the sub-threshold characteristic is normal and free of any kink effect. If, however, the drain voltage of 1.5 V is applied to the drain electrode of the above first conventional SOI-MOS field effect transistor, then the sub-threshold characteristic exhibits a kink effect. It was known that such kink effect may appear when the drain voltage is not less than about 0.8 V. The following descriptions will focus on the mechanism of the kink effect.

When the above n-channel MOS field effect transistor is in the ON-state, electrons move from the n-type source region 10 through an inversion layer in the p-type body portion 5 to the n-type drain region 9. When electrons are injected into the drain region 9 from the inversion layer of the body portion 5, an impact ionization is caused at a drain edge portion of the inversion layer adjacent to the drain region 9. The impact ionization generates electron-hole pairs. Electrons generated by the impact ionization move into the drain region and are then absorbed therein, whilst the holes generated by the impact ionization are accumulated on an interface of the p-type body portion 5 to the n-type source region 10, wherein the p-type body portion 5 is electrically floated. The accumulation of the holes on the interface of the p-type body portion 5 to the n-type source region 10 rises a potential of the p-type body portion 5. A parasitic bipolar transistor is caused. The drain region 9 virtually corresponds to the collector region. The hole accumulated interface of the body portion to the source region serve as a base region. The source region 10 serves as an emitter. When a potential difference between the hole accumulated interface of the body portion to the source region and the source region 10 is increased beyond a threshold voltage of the parasitic bipolar transistor, then the parasitic bipolar transistor turns ON. As a result, the holes accumulated on the interface of the body portion 5 to the source region 10 are injected into the source region 10 at a current Ib. The injection current of the holes from the body portion 5 to the source region 10 causes an additional current from the source region 10 to the drain region 9 through the body portion 5 is caused, wherein the additional current is defined by the product of the above current value Ib and a current amplification factor of the parasitic bipolar transistor. Such the additional current caused by the parasitic bipolar transistor causes the kink effect as well illustrated in FIG. 1. This phenomenon is so called as a parasitic bipolar effect. In order to avoid this parasitic bipolar effect, it is effective to allow a leakage of current between the body portion and the source region so that the holes accumulated on the interface of the body portion to the source region 5 are allowed to flow into the source region 10, thereby to suppress the increase in potential of the body portion. Alternatively, it is also effective to decrease the current amplification factor of the parasitic bipolar transistor so as to decrease the additional current whereby the kink effect is suppressed.

In the Japanese laid-open patent publication No. 2-291175, there is disclosed a second conventional SOI-MOS field effect transistor, descriptions of which will hereinafter be made with reference to FIG. 4. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has n-type source/drain regions 10 and 9 and a p-type body portion 5 between the n-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. Side wall oxide films 8 are also provided on side walls of the gate electrode 7 and over the gate oxide film 6. A metal layer 15 is further provided which extends over the gate insulation film in the source side and over the source region 10 except in the vicinity of the body portion 5. An inter-layer insulator 11 is further provided over the field oxide films 4, the metal layer 15, the silicon-on-insulator layer 3 and the gate electrode 7 as well as over the side wall oxide films 8. Contact holes 12 are formed in the inter-layer insulator 11 so that the contact holes 12 are positioned over the metal layer 15 over the source region 10 and over the drain region 9. Contact layers are formed in the contact holes 12 so that the contact layers are in contact with the metal layer 15 over the source region 10 and the drain region 9. Metal interconnections 13 are provided which are connected to the contact layers so that the metal interconnections 13 are electrically connected to the source/drain regions 10 and 9.

The metal layer 15 has a lower resistivity than that of the source region 10. The provision of the metal layer 15 allows a leakage of current of holes or promotes that holes accumulated on the interface of the body portion 5 to the source region 10 are injected to the metal layer 15. Such leakage of the holes from the body portion to the source region results in a potential drop of the body portion. This prevents the increase in potential of the body portion. The suppression of the increase in potential of the body portion prevents the increase in potential difference between the body portion and the source region beyond the threshold voltage. This prevents the parasitic bipolar transistor from turning ON whereby no parasitic bipolar effect is caused.

Also, a distance between the metal layer 15 and the body portion 5 of the second conventional SOI-MOS field effect transistor shown in FIG. 4 is shorter than a distance between the contact layer and the body portion of the first conventional SOI-MOS field effect transistor shown in FIG. 3. The shortening of the distance between the metal layer and the body portion means shortening a width of the emitter of the parasitic bipolar transistor. It was known that a life-time of the holes injected from the interface into the source region until those recombination with electrons depends upon the distance between the metal layer and the body portion. If the distance between the metal layer and the body portion is shortened, then the life-time of the holes until the recombination is also shortened. If, however, the distance between the metal layer and the body portion is extended, then the life-time of the holes until the recombination is also extended. The current amplification factor of the parasitic bipolar transistor is defined by the life-time of the holes injected from the interface into the source region until those recombination with electrons. If the life-time of the holes is shortened, then the current amplification factor of the parasitic bipolar transistor is also dropped. If, however, the life-time of the holes is extended, then the current amplification factor of the parasitic bipolar transistor is also risen. The provision of the metal layer 15 shortens the distance between the metal layer 15 and the body portion 5. The shortening of the distance between the metal layer 15 and the body portion 5 results in shortening of the life-time of the holes injected from the interface into the source region until those recombination with electrons. The shortening of the life-time of the holes drops the current amplification factor of the parasitic bipolar transistor.

However, the above second conventional SOI-MOS field effect transistor has no metal layer over the drain region. This results in an increased resistance of the drain region 9. The increase in resistance of the drain region 9 of the SOI-MOS field effect transistor results in deterioration of characteristics of the SOI-MOS field effect transistor.

For scaling down the SOI-MOS field effect transistor, it is essential to form shallow source and drain regions. This means it essential to reduce the thickness of the silicon-on-insulator layer over the buried oxide film over the silicon substrate. The reduction in thickness of the silicon-on-insulator layer causes the increase in source-drain parasitic resistance of the SOI-MOS field effect transistor.

In order to settle the above problems, it was proposed to provide metal layers over the source/drain regions of the SOI-MOS field effect transistor, which is disclosed in Proceedings 1995 IEEE International SOI Conference, pp. 28–29, 1995 Sato et al. "Characteristics of ¼-mm Gate Ultra-thin Film MOSFETs/SIMOX With Tungsten-Deposited Low-Resistance Source/Drain". It was also proposed to form silicide layers over the source/drain regions of the SOI-MOS field effect transistor, which is disclosed in Proceedings 1996 IEEE International SOI Conference, pp. 78–79, 1996, Deng et al. "Deep Salicidation Using Nickel For Suppressing The Floating Body Effect In Partially Depleted SOI-MOSFET".

The above third conventional SOI-MOS field effect transistor will hereinafter be described with reference to FIG. 5.

A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has n-type source/drain regions 10 and 9 and a p-type body portion 5 between the n-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. The gate electrode 7 has an upper region which comprises a silicide layer. Side wall oxide films 8 are also provided on side walls of the gate electrode 7 and over the gate oxide film 6. Silicide layers 16 are further formed in upper regions of the source and drain regions 10 and 9 except in the vicinity of the body portion 5 by self-alignment technique. The silicide layers 16 may be considered to be salicide layers. An inter-layer insulator 11 is further provided over the field oxide films 4, the silicide layers 16 and the gate electrode 7 as well as over the side wall oxide films 8. Contact holes 12 are formed in the inter-layer insulator 11 so that the contact holes 12 are positioned over the metal layer 15 over the source region 10 and over the drain region 9. Contact layers are formed in the contact holes 12 so that the contact layers are in contact with the metal layer 15 over the source region 10 and the drain region 9. Metal interconnections 13 are provided which are connected to the contact layers so that the metal interconnections 13 are electrically connected to the source/drain regions 10 and 9.

The silicidation of the source and drain regions results in not only a reduction of the parasitic resistance of the source and drain regions but also a suppression of the parasitic bipolar transistor.

The provision of the silicide layers in the upper regions of the source and drain regions shortens the distance between the silicide layers 16 and the body portion 5. The life-time of the holes injected from the interface of the body portion 5 into the source region 10 until the recombination of the injected holes with electrons is defined by the distance between the silicide layers 16 and the body portion 5. For this reason, the shortening of the distance between the silicide layers 16 and the body portion 5 results in shortening of the life-time of the holes injected from the interface of the body portion 5 into the source region 10 until the recombination of the injected holes with electrons. The current amplification factor of the parasitic bipolar transistor is defined by the lifetime of the holes injected from the interface of the body portion 5 into the source region 10 until the recombination of the injected holes with electrons. Therefore, the shortening of the life-time of the holes injected from the interface of the body portion 5 into the source region 10 until the recombination of the injected holes with electrons results in a reduction in the current amplification factor of the parasitic bipolar transistor. The reduction in current amplification factor of the parasitic bipolar transistor suppresses the parasitic bipolar effect of the SOI-MOS field effect transistor.

In the above third conventional SOI-MOS field effect transistor, however, in order to reduce the parasitic resistances of the shallow source/drain regions, the silicide layers or salicide layers are formed in upper regions of the shallow source/drain regions.

Consequently, in order to reduce the parasitic resistances of the shallow source/drain regions, the silicide layers or salicide layers and also suppress the parasitic bipolar effect of the SOI-MOS field effect transistor, it is effective to form metal layers or silicide layers selectively in upper regions of the source/drain regions of the SOI-MOS field effect transistor, so that the life-time of the holes injected from the interface of the body portion 5 into the source region 10 until the recombination of the injected holes with electrons is shortened, whereby the current amplification factor of the parasitic bipolar transistor is suppressed and the parasitic bipolar effect of the SOI-MOS field effect transistor is thus suppressed.

The provisions of the metal layers or the silicide layers in the upper regions of the source and drain regions renders the SOI-MOS field effect transistor free from the kink effect as illustrated in FIG. 1. Notwithstanding, the drain region and the metal or silicide layer in the drain region are applied with the drain voltage which is usually a high voltage. Further, the distance between the body portion 5 and the silicide or metal layer of the drain region is shortened. Both the provision of the silicide layer or the metal layer in the upper region of the drain region and the application of the high voltage to the drain region results in allowance of a large leakage of current between the drain region 9 and the body portion 5. This large leakage of current between the drain region 9 and the body portion 5 causes a serious problem with a large OFF current of the SOI-MOS field effect transistor under zero gate voltage application, resulting in an increase in power consumption of the SOI-MOS field effect transistor. If, however, no metal layer nor silicide layer is provided in the drain region to settle the problem with the large leakage of current between the drain region and the body portion, then the above described other problems with increase in resistance of the drain as well as with the increase in parasitic resistance by the shallow p-n junctions of the source and drain regions or the difficulty in thickness of the silicon-on-insulator layer.

In the above circumstances, it had been required to develop a novel SOI-MOS field effect transistor free from all of the above problems.

SUMMARY OF THE INVENTION

Accordingly, it is an object of the present invention to provide a novel source/drain structure enabling an SOI-MOS field effect transistor to be free from all of the above problems.

It is a further object of the present invention to provide a novel source/drain structure of an SOI-MOS field effect transistor which is capable of reducing source/drain parasitic resistance.

It is a still further object of the present invention to provide a novel source/drain structure of an SOI-MOS field effect transistor which allows a reduction in thickness of a silicon-on-insulator layer.

It is yet a further object of the present invention to provide a novel source/drain structure of an SOI-MOS field effect transistor which allows shallow p-n junctions of source and drain regions.

It is a further more object of the present invention to provide a novel source/drain structure of an SOI-MOS field effect transistor which is capable of reducing a resistance of a drain region.

It is still more object of the present invention to provide a novel source/drain structure of an SOI-MOS field effect transistor which is capable of suppressing a leakage of current between a body portion and a drain region applied with a high drain voltage.

It is moreover object of the present invention to provide a novel source/drain structure of an SOI-MOS field effect transistor which is capable of reducing an OFF current under zero gate voltage application.

It is another object of the present invention to provide a novel source/drain structure of an SOI-MOS field effect transistor which is capable of reducing a power consumption of the transistor.

It is still another object of the present invention to provide a novel source/drain structure of an SOI-MOS field effect transistor which allows a leakage of current between a source region and a body portion.

It is yet another object of the present invention to provide a novel source/drain structure of an SOI-MOS field effect transistor which is capable of suppressing an excess potential rising of a body portion.

It is further another object of the present invention to provide a novel source/drain structure of an SOI-MOS field effect transistor which is capable of suppressing a parasitic bipolar effect of the SOI-MOS field effect transistor.

It is an additional object of the present invention to provide a novel source/drain structure enabling an SOI-MOS field effect transistor to be free from kink effect in sub-threshold characteristic.

It is a still additional object of the present invention to provide a novel source/drain structure of an SOI-MOS field effect transistor which is capable of reduction in current amplification factor of a parasitic bipolar effect of the SOI-MOS field effect transistor.

It is yet an additional object of the present invention to provide a novel source/drain structure of an SOI-MOS field effect transistor which is capable of shortening a life-time of holes injected from an interface of a body portion to a source region until recombination thereof with electrons.

It is a still further additional object of the present invention to provide a novel source/drain structure enabling a semiconductor device to be free from all of the above problems.

It is yet further additional object of the present invention to provide a novel source/drain structure of a semiconductor device which is capable of reducing source/drain parasitic resistance.

It is also additional object of the present invention to provide a novel source/drain structure of a semiconductor device which allows a reduction in thickness of a silicon-on-insulator layer.

It is also additional object of the present invention to provide a novel source/drain structure of a semiconductor device which allows shallow p-n junctions of source and drain regions.

It is also additional object of the present invention to provide a novel source/drain structure of a semiconductor device which is capable of reducing a resistance of a drain region.

It is also additional object of the present invention to provide a novel source/drain structure of a semiconductor device which is capable of suppressing a leakage of current between a body portion and a drain region applied with a high drain voltage.

It is also additional object of the present invention to provide a novel source/drain structure of a semiconductor device which is capable of reducing an OFF current under zero gate voltage application.

It is also additional object of the present invention to provide a novel source/drain structure of a semiconductor device which is capable of reducing a power consumption of the transistor.

It is also additional object of the present invention to provide a novel source/drain structure of a semiconductor device which allows a leakage of current between a source region and a body portion.

It is also additional object of the present invention to provide a novel source/drain structure of a semiconductor device which is capable of suppressing an excess potential rising of a body portion.

It is also additional object of the present invention to provide a novel source/drain structure of a semiconductor device which is capable of suppressing a parasitic bipolar effect of the semiconductor device.

It is also additional object of the present invention to provide a novel source/drain structure enabling a semiconductor device to be free from kink effect in sub-threshold characteristic.

It is also additional object of the present invention to provide a novel source/drain structure of a semiconductor device which is capable of reduction in current amplification factor of a parasitic bipolar effect of the semiconductor device.

It is also additional object of the present invention to provide a novel source/drain structure of a semiconductor device which is capable of shortening a life-time of holes injected from an interface of a body portion to a source region until recombination thereof with electrons.

It is also additional object of the present invention to provide a novel method of forming an improved source/drain structure enabling a semiconductor device to be free from all of the above problems.

It is also additional object of the present invention to provide a novel method of forming an improved source/drain structure of a semiconductor device which is capable of reducing source/drain parasitic resistance.

It is also additional object of the present invention to provide a novel method of forming an improved source/drain structure of a semiconductor device which allows a reduction in thickness of a silicon-on-insulator layer.

It is also additional object of the present invention to provide a novel method of forming an improved source/drain structure of a semiconductor device which allows shallow p-n junctions of source and drain regions.

It is also additional object of the present invention to provide a novel method of forming an improved source/drain structure of a semiconductor device which is capable of reducing a resistance of a drain region.

It is also additional object of the present invention to provide a novel method of forming an improved source/drain structure of a semiconductor device which is capable of suppressing a leakage of current between a body portion and a drain region applied with a high drain voltage.

It is also additional object of the present invention to provide a novel method of forming an improved source/drain structure of a semiconductor device which is capable of reducing an OFF current under zero gate voltage application.

It is also additional object of the present invention to provide a novel method of forming an improved source/drain structure of a semiconductor device which is capable of reducing a power consumption of the transistor.

It is also additional object of the present invention to provide a novel method of forming an improved source/drain structure of a semiconductor device which allows a leakage of current between a source region and a body portion.

It is also additional object of the present invention to provide a novel method of forming an improved source/drain structure of a semiconductor device which is capable of suppressing an excess potential rising of a body portion.

It is also additional object of the present invention to provide a novel method of forming an improved source/drain structure of a semiconductor device which is capable of suppressing a parasitic bipolar effect of the semiconductor device.

It is also additional object of the present invention to provide a novel method of forming an improved source/drain structure enabling a semiconductor device to be free from kink effect in sub-threshold characteristic.

It is also additional object of the present invention to provide a novel method of forming an improved source/drain structure of a semiconductor device which is capable of reduction in current amplification factor of a parasitic bipolar effect of the semiconductor device.

It is also additional object of the present invention to provide a novel method of forming an improved source/drain structure of a semiconductor device which is capable of shortening a life-time of holes injected from an interface of a body portion to a source region until recombination thereof with electrons.

The above and other objects, features and advantages of the present invention will be apparent from the following descriptions.

The first present invention provides a source/drain structure formed in a semiconductor layer which has source and drain regions of a first conductivity type and a body portion of a second conductivity type disposed between said source and drain regions. The body portion is positioned under a gate insulation film over which a gate electrode is provided. The source region has a first low resistive region which is lower in electrical resistivity than said source region and said drain region having a second low resistive region which is lower in electrical resistively than said source region. For the first present invention, it is important that a distance of an inside edge portion of the first low resistive region from a first interface between the source region and the body portion is shorter than a distance of an inside portion of the second low resistive region from a second interface between the drain region and the body portion.

The second present invention also provides a semiconductor device which comprises a semiconductor substrate, a buried insulation layer provided on the semiconductor substrate, a silicon layer provided on the buried insulation layer, so that the silicon layer is electrically isolated from the semiconductor substrate and also has source and drain regions of a first conductivity type and a body portion of a second conductivity type disposed between the source and drain regions, and wherein the source region has a first low resistive region which is lower in electrical resistivity than the source region and the drain region having a second low resistive region which is lower in electrical resistively than the source region, a gate insulation film extending over the body portion and over inside portions of the source and drain regions in the vicinity of the body portion, and a gate electrode on the gate insulation film so that the gate electrode is positioned over the body portion. For the above second present invention, it is important that a distance of an inside edge portion of the first low resistive region from a first interface between the source region and the body portion is shorter than a distance of an inside portion of the second low resistive region from a second interface between the drain region and the body portion.

The third present invention also provides an SOI-MOS field effect transistor as follows. A buried insulation layer is provided on a silicon substrate. A silicon layer is provided on the buried insulation layer so that the silicon layer is electrically isolated from the silicon substrate. The silicon layer has source and drain regions of a first conductivity type and a body portion of a second conductivity type disposed between the source and drain regions. The source region has a first low resistive region which is lower in electrical resistivity than the source region and the drain region has a second low resistive region which is lower in electrical resistively than the source region. A gate insulation film extends over the body portion and over inside portions of the source and drain regions in the vicinity of the body portion. A gate electrode is provided on the gate insulation film so that the gate electrode is positioned over the body portion. A first side wall insulation film is provided on a first side wall of the gate electrode and in the vicinity of the source region. A second side wall insulation film is formed on a second side wall of the gate electrode and in the vicinity of the drain region. An inter-layer insulator extends over the silicon layers and the gate electrode wall as well as over the first and second side wall insulation films. A source contact layer is provided in the inter-layer insulator and the source contact layer has a bottom portion which is in contact with the first low resistive region of the source region and also has a top portion which is connected to a first interconnection extending over the inter-layer insulator. A drain contact layer is provided in the inter-layer insulator and the drain contact layer has a bottom portion which is in contact with the second low resistive region of the drain region and also has a top portion which is connected to a second interconnection extending over the inter-layer insulator. For the third present invention, it is important that a distance of an inside edge portion of the first low resistive region from a first interface between the source region and the body portion is shorter than a distance of an inside portion of the second low resistive region from a second interface between the drain region and the body portion.

The fourth present invention also provides a source/drain structure formed in a semiconductor layer which has source and drain regions of a first conductivity type and an electrically floating portion of a second conductivity type disposed between the source and drain regions. The electrically floating portion is positioned over a buried insulation layer over a semiconductor substrate and is also positioned under a gate insulation film over which a gate electrode is provided. The source region has a first low resistive region which is lower in electrical resistivity than the source region and the drain region has a second low resistive region which is lower in electrical resistively than the source region. For the fourth present invention, it is important that a distance of an inside edge portion of the first low resistive region from a first interface between the source region and the electrically floating portion is shorter than a distance of an inside portion of the second low resistive region from a second interface between the drain region and the electrically floating portion.

BRIEF DESCRIPTION OF THE DRAWINGS

Preferred embodiments according to the present invention will be described in detail with reference to the accompanying drawings.

DISCLOSURE OF THE INVENTION

Figure 1:
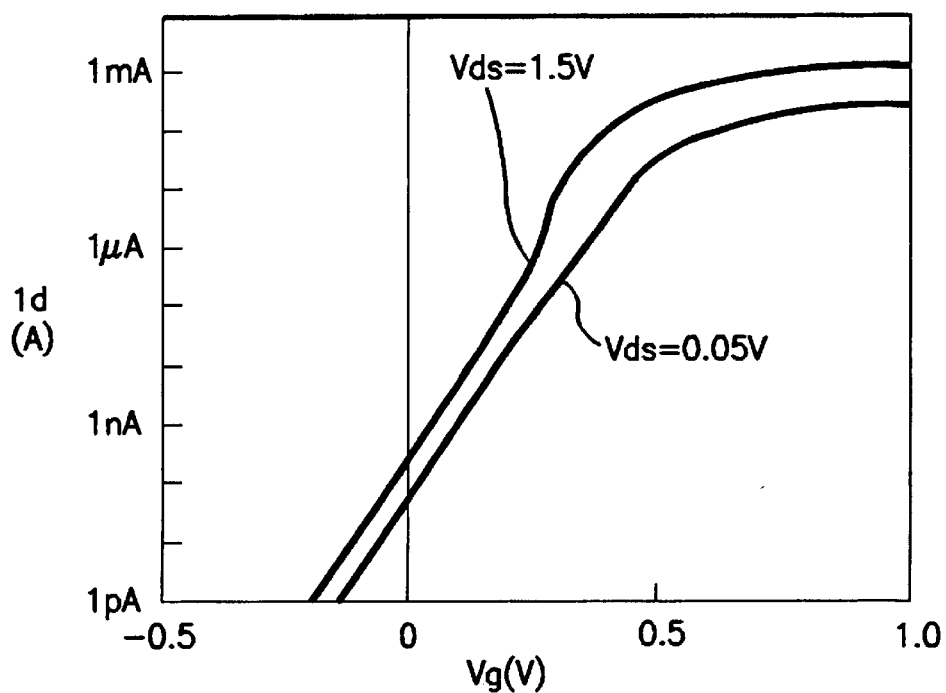
FIG. 1 is a graph illustrative of sub-threshold characteristics (Id-Vg characteristics) or current-voltage characteristics of the above first conventional SOI-MOS field effect transistor when applied with drain voltages of 1.5 V and 0.05 V.
Figure 2:
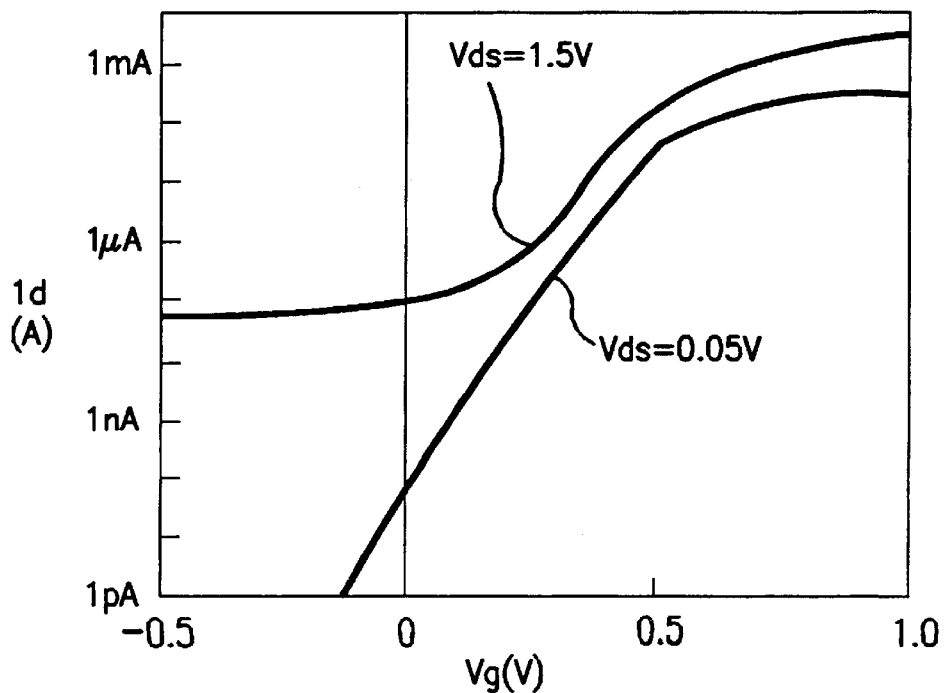
FIG. 2 is a graph illustrative of sub-threshold characteristics (Id-Vg characteristics) or current-voltage characteristics of the above conventional SOI-MOS field effect transistor when applied with drain voltages of 1.5 V and 0.05 V.
Figure 3:
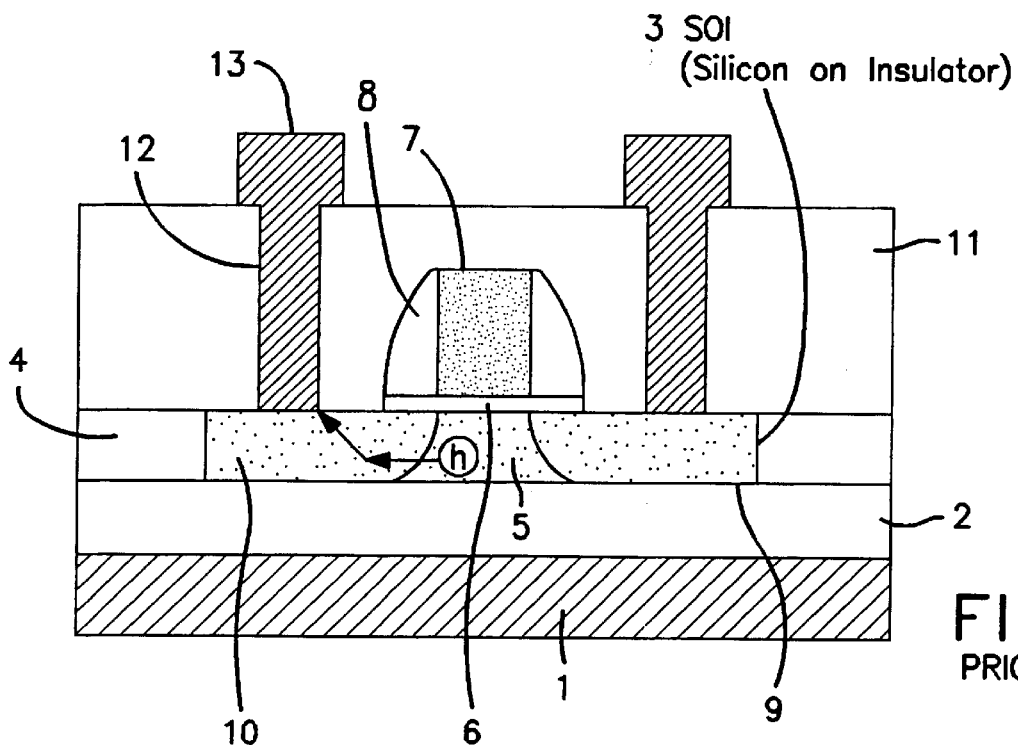
FIG. 3 is a fragmentary cross sectional elevation view illustrative of the above first conventional SOI-MOS field effect transistor.
Figure 4:
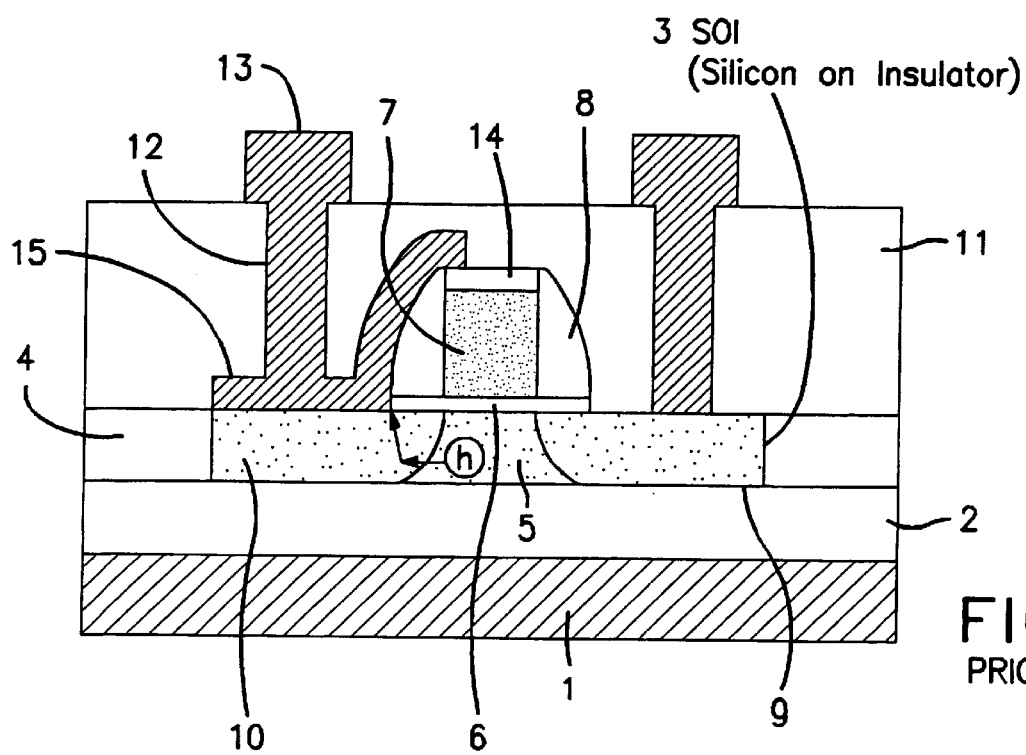
FIG. 4 is a fragmentary cross sectional elevation view illustrative of the above second conventional SOI-MOS field effect transistor.
Figure 5:
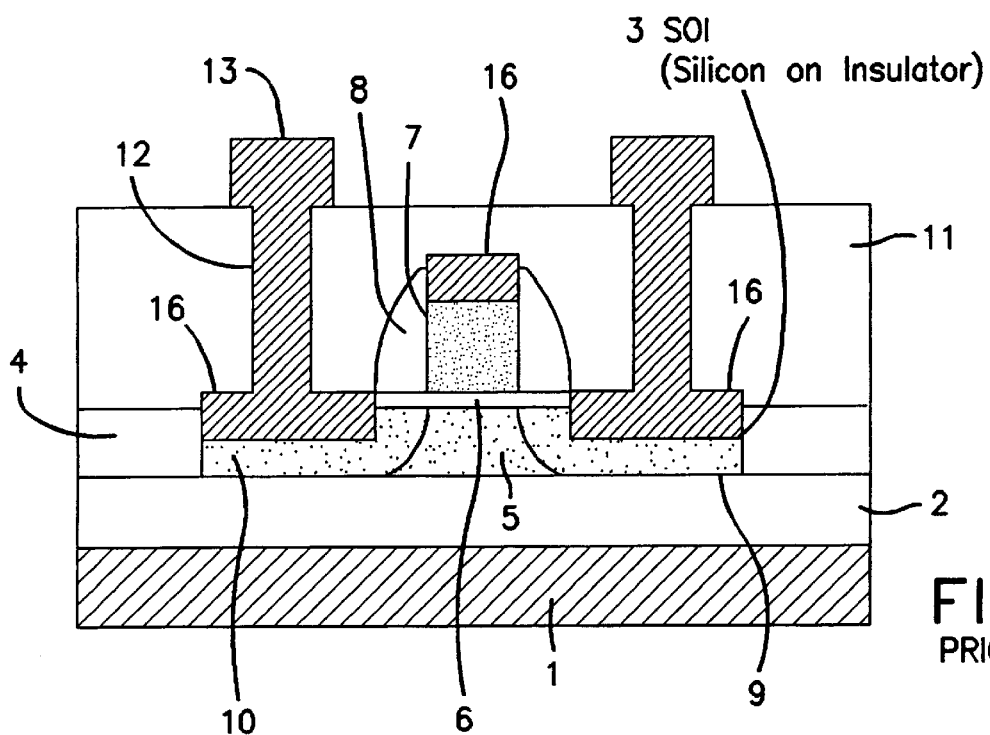
FIG. 5 is a fragmentary cross sectional elevation view illustrative of the above third conventional SOI-MOS field effect transistor.

The first present invention provides a source/drain structure formed in a semiconductor layer which has source and drain regions of a first conductivity type and a body portion of a second conductivity type disposed between said source and drain regions. The body portion is positioned under a gate insulation film over which a gate electrode is provided. The source region has a first low resistive region which is lower in electrical resistivity than said source region and said drain region having a second low resistive region which is lower in electrical resistively than said source region. For the first present invention, it is important that a distance of an inside edge portion of the first low resistive region from a first interface between the source region and the body portion is shorter than a distance of an inside portion of the second low resistive region from a second interface between the drain region and the body portion.

The provision is, therefore, made of the first low resistive region in the source region at a short distance of the inside edge portion of the first low resistive region from the first interface between the source region and the body portion thereby to shorten the distance between the first low resistive region and the body portion. The life-time of the holes injected from the first interface of the body portion into the source region until the recombination of the injected holes with electrons is defined by the short distance of the inside edge portion of the first low resistive region from the first interface between the source region and the body portion. For this reason, the shortening of the distance of the inside edge portion of the first low resistive region from the first interface between the source region and the body portion does result in shortening of the life-time of the holes injected from the first interface of the body portion into the source region until the recombination of the injected holes with electrons. The current amplification factor of the parasitic bipolar transistor caused in the semiconductor layer is defined by the life-time of the holes injected from the first interface of the body portion into the source region until the recombination of the injected holes with electrons. Therefore, the shortening of the life-time of the holes injected from the first interface of the body portion into the source region until the recombination of the injected holes with electrons does result in a certain reduction in the current amplification factor of the parasitic bipolar transistor. The reduction in current amplification factor of the parasitic bipolar transistor suppresses the parasitic bipolar effect of the semiconductor device.

In order to reduce the parasitic resistances of the shallow source region including the first low resistive region and also to suppress the parasitic bipolar effect of the semiconductor device, it is effective to form the first low resistive region in the source region and the inside edge portion of the first low resistive region is positioned in the vicinity of or in contact with the first interface of the body portion to the source region, so that a relatively large leakage of current between the body portion and the source region is allowed, and further so that the life-time of the holes injected from the first interface of the body portion into the source region until the recombination of the injected holes with electrons is shortened, whereby the current amplification factor of the parasitic bipolar transistor is suppressed and the parasitic bipolar effect of the semiconductor device is thus suppressed. The provision of the first low resistive region in the source region and in the vicinity of or in contact with the first interface of the body portion to the source region renders the semiconductor device free from the kink effect.

On the other hand, the drain region has the second low resistive region which has the inside edge portion sufficiently distanced from the second interface of the body portion to the drain region. The drain region including the second low resistive region is applied with the drain voltage which is usually a high voltage. Further, the distance of the inside portion of the second low resistive region from the second interface between the drain region and the body portion is long. The provision of the second low resistive region in the drain region, so that the inside edge of the second low resistive region is sufficiently distanced from the second interface between the drain region and the body portion, does result in substantially no or sufficiently small leakage of current between the drain region and the body portion. This substantially no or sufficiently small leakage of current between the drain region and the body portion causes substantially no or sufficiently small OFF current of the semiconductor device under zero gate voltage application, resulting in a remarkable decrease in power consumption of the semiconductor device. The provisions of the first and second low resistive regions in the source and drain regions reduce in resistance of the source and drain regions as well as allows a reduction in parasitic resistance by the shallow p-n junctions of the source and drain regions.

Accordingly, the improved source/drain structure, such that the distance of the inside edge portion of the first low resistive region from the first interface between the source region and the body portion is shorter than the distance of the inside portion of the second low resistive region from the second interface between the drain region and the body portion, do render the semiconductor device free from all of the above problems as being engaged with the first, second and third conventional semiconductor devices and also do provide the following advantages.

The above improved source/drain structure is capable of reducing source/drain parasitic resistance of the semiconductor device.

The above improved source/drain structure also allows a reduction in thickness of the semiconductor layer. The above improved source/drain structure also allows shallow p-n junctions of the source and drain regions.

The above improved source/drain structure is also capable of reducing the resistance of the drain region.

The above improved source/drain structure is also capable of suppressing the leakage of current between the body portion and the drain region applied with a high drain voltage.

The above improved source/drain structure is also capable of reducing the OFF current under zero gate voltage application.

The above improved source/drain structure is also capable of reducing a power consumption of the semiconductor device.

The above improved source/drain structure also allows a leakage of current between the source region and the body portion.

The above improved source/drain structure is also capable of suppressing an excess potential rising of the body portion.

The above improved source/drain structure is also capable of suppressing a parasitic bipolar effect of the semiconductor device.

Figure 16:
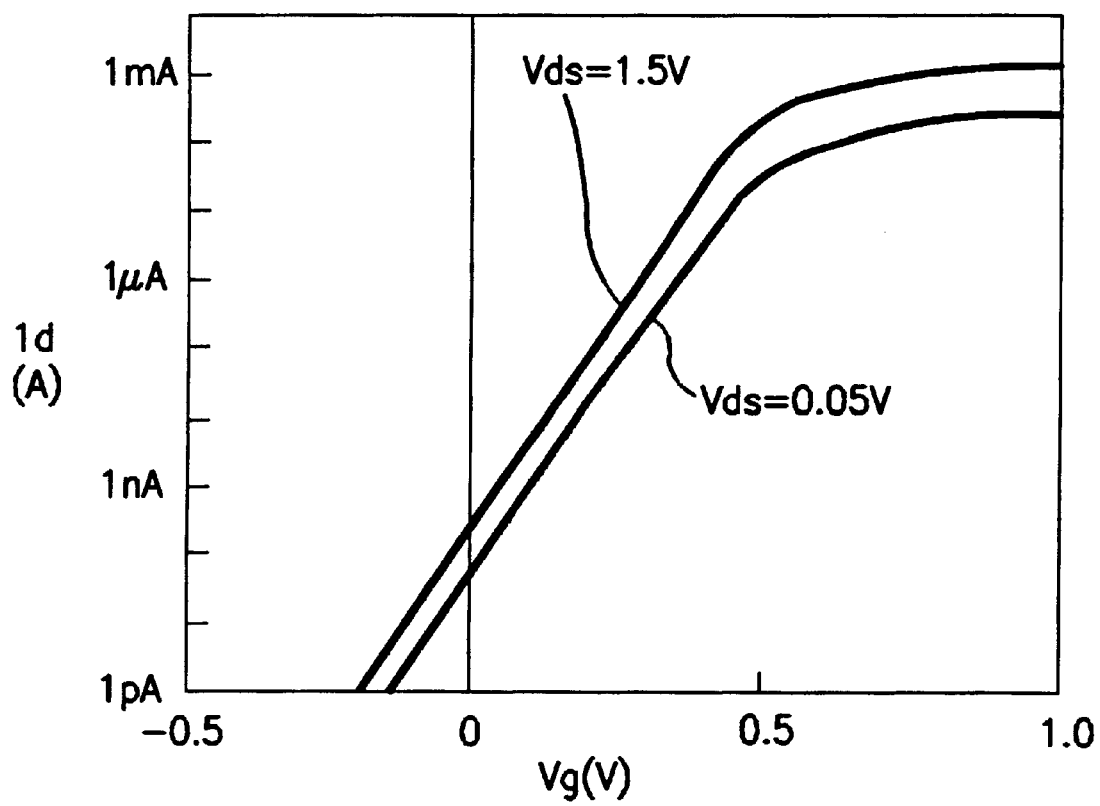
FIG. 16 is a graph illustrative of sub-threshold characteristics (Id-Vg characteristics) or current-voltage characteristics of a novel semiconductor device in accordance with the present invention when applied with drain voltages of 1.5 V and 0.05 V.

The above improved source/drain structure also enables the semiconductor device to be free from kink effect in sub-threshold characteristic which can be understood from FIG. 16 being illustrative of sub-threshold characteristics (Id-Vg characteristics) or current-voltage characteristics of the above novel semiconductor device when applied with drain voltages of 1.5 V and 0.05 V.

The above improved source/drain structure is also capable of reduction in current amplification factor of a parasitic bipolar effect of the semiconductor device.

The above improved source/drain structure is also capable of shortening a life-time of holes injected from the first interface of the body portion to the source region until recombination thereof with electrons.

Furthermore, for the above first present invention, it may be preferable that the semiconductor layer comprises a silicon layer. In this case, it may also be preferable that the first and second low resistive regions comprise metal silicide layers. It may further be preferable that the first and second low resistive regions comprise refractory metal silicide layers.

It may also be preferable that the first and second low resistive regions comprise metal layers.

It may also be preferable that the first and second low resistive regions comprise semiconductor layers which have lower electrical resistivities than those of the source and drain regions.

It may also be preferable to further comprise a first side wall insulation film formed on a first side wall of the gate electrode and in the vicinity of the source region, and a second side wall insulation film formed on a second side wall of the gate electrode and in the vicinity of the drain region, wherein the first side wall insulation film has a first thickness which is substantially the same as the distance between the inside edge portion of the first low resistive region and the first interface and the second side wall insulation film has a second thickness which is substantially the same as the distance between the inside edge portion of the second low resistive region and the second interface.

It may also be preferable that the first and second low resistive regions selectively extend in upper regions of the source and drain regions. In this case, it may further be preferable that the first low resistive region is separated by a part of the source region from the first interface between the source region and the body portion. Alternatively, it may also be preferable that the first low resistive region has an inside edge portion, at least a part of which is in contact with the first interface between the source region and the body portion. Alternatively, it may also be preferable that the first low resistive region has an inside edge upper portion which is adjacent to but slightly distanced from the gate electrode.

It may also be preferable that the first and second low resistive regions deeply extend from top surfaces of the source and drain regions to bottom surfaces thereof. In this case, it may further be preferable that the first low resistive region is separated by a part of the source region from the first interface between the source region and the body portion. Alternatively, it may also be preferable that the first low resistive region has an inside edge portion, at least a part of which is in contact with the first interface between the source region and the body portion. Alternatively, it may also be preferable that the first low resistive region has an inside edge upper portion which is adjacent to but slightly distanced from the gate electrode.

It may also be preferable that the first and second low resistive regions deeply extend from top surfaces of the source and drain regions to deep levels slightly upper than bottom surfaces of the source and drain regions. In this case, it may further be preferable that the first low resistive region is separated by a part of the source region from the first interface between the source region and the body portion. Alternatively, it may also be preferable that the first low resistive region has an inside edge portion, at least a part of which is in contact with the first interface between the source region and the body portion. Alternatively, it may also be preferable that the first low resistive region has an inside edge upper portion which is adjacent to but slightly distanced from the gate electrode.

It may also be preferable that the first low resistive region has an inside edge portion, at least a part of which is in contact with the first interface between the source region and the body portion. In this case, it may further be preferable that the first and second low resistive regions selectively extend in upper regions of the source and drain regions. Alternatively, it may also be preferable that the first and second low resistive regions deeply extend from top surfaces of the source and drain regions to bottom surfaces thereof. Alternatively, it may also be preferable that the first and second low resistive regions deeply extend from top surfaces of the source and drain regions to deep levels slightly upper than bottom surfaces of the source and drain regions. Alternatively, it may also be preferable that the first low resistive region has an inside edge lower portion which is in contact with the first interface between the source region and the body portion, and that the first low resistive region also has an inside edge upper portion which is adjacent to but slightly distanced from the gate electrode.

It may also be preferable that the first low resistive region is separated by a part of the source region from the first interface between the source region and the body portion. Alternatively, it may also be preferable that the first and second low resistive regions selectively extend in upper regions of the source and drain regions. Alternatively, it may also be preferable that the first and second low resistive regions deeply extend from top surfaces of the source and drain regions to bottom surfaces thereof. Alternatively, it may also be preferable that the first and second low resistive regions deeply extend from top surfaces of the source and drain regions to deep levels slightly upper than bottom surfaces of the source and drain regions. Alternatively, it may also be preferable that the first low resistive region has an inside edge lower portion which is in contact with the first interface between the source region and the body portion, and that the first low resistive region also has an inside edge upper portion which is adjacent to but slightly distanced from the gate electrode.

It may also be preferable that the first low resistive region has an inside edge upper portion which is adjacent to but slightly distanced from the gate electrode. Alternatively, it may also be preferable that the first and second low resistive regions selectively extend in upper regions of the source and drain regions. Alternatively, it may also be preferable that the first and second low resistive regions deeply extend from top surfaces of the source and drain regions to bottom surfaces thereof. Alternatively, it may also be preferable that the first and second low resistive regions deeply extend from top surfaces of the source and drain regions to deep levels slightly upper than bottom surfaces of the source and drain regions. Alternatively, it may also be preferable that the first low resistive region has an inside edge lower portion which is in contact with the first interface between the source region and the body portion.

It may also be preferable that the distance of the inside edge portion of the first low resistive region from the first interface between the source region and the body portion is a half or less than the distance of the inside portion of the second low resistive region from the second interface between the drain region and the body portion.

It may also be preferable that the distance of the inside edge portion of the first low resistive region from the first interface between the source region and the body portion is in the range of 200–300 angstroms, whilst the distance of the inside portion of the second low resistive region from the second interface between the drain region and the body portion is about 1000 angstroms.

It may also be preferable that the semiconductor layer is a silicon-on-insulator layer which is formed on an buried insulation layer over a silicon substrate so that the body portion is electrically isolated from the silicon substrate.

It may also be preferable to further comprise a first contact layer having a bottom portion which is in contact with the first low resistive low resistive region and also having a top portion which is connected to a first interconnection, and a second contact layer having a bottom portion which is in contact with the second low resistive low resistive region and also having a top portion which is connected to a second interconnection.

It may also be possible that said first conductivity type is n-type and said second conductivity type is p-type.

It may also be possible that said first conductivity type is n-type and said second conductivity type is p-type.

It may also be possible that the first low resistive region has a bottom which lies at a deeper level than that of the second low resistive region.

It may also be possible to further comprise a first side wall insulation film formed on a first side wall of the gate electrode and in the vicinity of said source region, and a second side wall insulation film formed on a second side wall of the gate electrode and in the vicinity of said drain region, wherein the first side wall insulation film has a first thickness which is substantially the same as said distance between the inside edge portion of said first low resistive region and said first interface, and wherein the second side wall insulation film has a second thickness which is substantially the same as the first thickness of said first side wall insulation film and which is smaller than the distance between the inside edge portion of the second low resistive region and the second interface.

The second present invention also provides a semiconductor device which comprises a semiconductor substrate, a buried insulation layer provided on the semiconductor substrate, a silicon layer provided on the buried insulation layer, so that the silicon layer is electrically isolated from the semiconductor substrate and also has source and drain regions of a first conductivity type and a body portion of a second conductivity type disposed between the source and drain regions, and wherein the source region has a first low resistive region which is lower in electrical resistivity than the source region and the drain region having a second low resistive region which is lower in electrical resistively than the source region, a gate insulation film extending over the body portion and over inside portions of the source and drain regions in the vicinity of the body portion, and a gate electrode on the gate insulation film so that the gate electrode is positioned over the body portion. For the above second present invention, it is important that a distance of an inside edge portion of the first low resistive region from a first interface between the source region and the body portion is shorter than a distance of an inside portion of the second low resistive region from a second interface between the drain region and the body portion.

The provision is, therefore, made of the first low resistive region in the source region at a short distance of the inside edge portion of the first low resistive region from the first interface between the source region and the body portion, thereby to shorten the distance between the first low resistive region and the body portion. The life-time of the holes injected from the first interface of the body portion into the source region until the recombination of the injected holes with electrons is defined by the short distance of the inside edge portion of the first low resistive region from the first interface between the source region and the body portion. For this reason, the shortening of the distance of the inside edge portion of the first low resistive region from the first interface between the source region and the body portion does result in shortening of the life-time of the holes injected from the first interface of the body portion into the source region until the recombination of the injected holes with electrons. The current amplification factor of the parasitic bipolar transistor caused in the semiconductor layer is defined by the life-time of the holes injected from the first interface of the body portion into the source region until the recombination of the injected holes with electrons. Therefore, the shortening of the life-time of the holes injected from the first interface of the body portion into the source region until the recombination of the injected holes with electrons does result in a certain reduction in the current amplification factor of the parasitic bipolar transistor. The reduction in current amplification factor of the parasitic bipolar transistor suppresses the parasitic bipolar effect of the semiconductor device.

In order to reduce the parasitic resistances of the shallow source region including the first low resistive region and also to suppress the parasitic bipolar effect of the semiconductor device, it is effective to form the first low resistive region in the source region and the inside edge portion of the first low resistive region is positioned in the vicinity of or in contact with the first interface of the body portion to the source region, so that a relatively large leakage of current between the body portion and the source region is allowed, and further so that the life-time of the holes injected from the first interface of the body portion into the source region until the recombination of the injected holes with electrons is shortened, whereby the current amplification factor of the parasitic bipolar transistor is suppressed and the parasitic bipolar effect of the semiconductor device is thus suppressed. The provision of the first low resistive region in the source region and in the vicinity of or in contact with the first interface of the body portion to the source region renders the semiconductor device free from the kink effect.

On the other hand, the drain region has the second low resistive region which has the inside edge portion sufficiently distanced from the second interface of the body portion to the drain region. The drain region including the second low resistive region is applied with the drain voltage which is usually a high voltage. Further, the distance of the inside portion of the second low resistive region from the second interface between the drain region and the body portion is long. The provision of the second low resistive region in the drain region, so that the inside edge of the second low resistive region is sufficiently distanced from the second interface between the drain region and the body portion, does result in substantially no or sufficiently small leakage of current between the drain region and the body portion. This substantially no or sufficiently small leakage of current between the drain region and the body portion causes substantially no or sufficiently small OFF current of the semiconductor device under zero gate voltage application, resulting in a remarkable decrease in power consumption of the semiconductor device. The provisions of the first and second low resistive regions in the source and drain regions reduce in resistance of the source and drain regions as well as allows a reduction in parasitic resistance by the shallow p-n junctions of the source and drain regions.

Accordingly, the improved source/drain structure, such that the distance of the inside edge portion of the first low resistive region from the first interface between the source region and the body portion is shorter than the distance of the inside portion of the second low resistive region from the second interface between the drain region and the body portion, do render the semiconductor device free from all of the above problems as being engaged with the first, second and third conventional semiconductor devices and also do provide the following advantages.

The above improved source/drain structure is capable of reducing source/drain parasitic resistance of the semiconductor device.

The above improved source/drain structure also allows a reduction in thickness of the semiconductor layer.

The above improved source/drain structure also allows shallow p-n junctions of the source and drain regions.

The above improved source/drain structure is also capable of reducing the resistance of the drain region.

The above improved source/drain structure is also capable of suppressing the leakage of current between the body portion and the drain region applied with a high drain voltage.

The above improved source/drain structure is also capable of reducing the OFF current under zero gate voltage application.

The above improved source/drain structure is also capable of reducing a power consumption of the semiconductor device.

The above improved source/drain structure also allows a leakage of current between the source region and the body portion.

The above improved source/drain structure is also capable of suppressing an excess potential rising of the body portion.

The above improved source/drain structure is also capable of suppressing a parasitic bipolar effect of the semiconductor device.

The above improved source/drain structure also enables the semiconductor device to be free from kink effect in sub-threshold characteristic which can be understood from FIG. 16 being illustrative of sub-threshold characteristics (Id-Vg characteristics) or current-voltage characteristics of the above novel semiconductor device when applied with drain voltages of 1.5 V and 0.05 V.

The above improved source/drain structure is also capable of reduction in current amplification factor of a parasitic bipolar effect of the semiconductor device.

The above improved source/drain structure is also capable of shortening a life-time of holes injected from the first interface of the body portion to the source region until recombination thereof with electrons.

Furthermore, for the above first present invention, it may be preferable that the semiconductor layer comprises a silicon layer. In this case, it may also be preferable that the first and second low resistive regions comprise metal silicide layers. It may further be preferable that the first and second low resistive regions comprise refractory metal silicide layers.

It may also be preferable that the first and second low resistive regions comprise metal layers.

It may also be preferable that the first and second low resistive regions comprise semiconductor layers which have lower electrical resistivities than those of the source and drain regions.

It may also be preferable to further comprise a first side wall insulation film formed on a first side wall of the gate electrode and in the vicinity of the source region, and a second side wall insulation film formed on a second side wall of the gate electrode and in the vicinity of the drain region, wherein the first side wall insulation film has a first thickness which is substantially the same as the distance between the inside edge portion of the first low resistive region and the first interface and the second side wall insulation film has a second thickness which is substantially the same as the distance between the inside edge portion of the second low resistive region and the second interface.

It may also be preferable that the first and second low resistive regions selectively extend in upper regions of the source and drain regions. In this case, it may further be preferable that the first low resistive region is separated by a part of the source region from the first interface between the source region and the body portion. Alternatively, it may also be preferable that the first low resistive region has an inside edge portion, at least a part of which is in contact with the first interface between the source region and the body portion. Alternatively, it may also be preferable that the first low resistive region has an inside edge upper portion which is adjacent to but slightly distanced from the gate electrode.

It may also be preferable that the first and second low resistive regions deeply extend from top surfaces of the source and drain regions to bottom surfaces thereof. In this case, it may further be preferable that the first low resistive region is separated by a part of the source region from the first interface between the source region and the body portion. Alternatively, it may also be preferable that the first low resistive region has an inside edge portion, at least a part of which is in contact with the first interface between the source region and the body portion. Alternatively, it may also be preferable that the first low resistive region has an inside edge upper portion which is adjacent to but slightly distanced from the gate electrode.

It may also be preferable that the first and second low resistive regions deeply extend from top surfaces of the source and drain regions to deep levels slightly upper than bottom surfaces of the source and drain regions. In this case, it may further be preferable that the first low resistive region is separated by a part of the source region from the first interface between the source region and the body portion. Alternatively, it may also be preferable that the first low resistive region has an inside edge portion, at least a part of which is in contact with the first interface between the source region and the body portion. Alternatively, it may also be preferable that the first low resistive region has an inside edge upper portion which is adjacent to but slightly distanced from the gate electrode.

It may also be preferable that the first low resistive region has an inside edge portion, at least a part of which is in contact with the first interface between the source region and the body portion. In this case, it may further be preferable that the first and second low resistive regions selectively extend in upper regions of the source and drain regions. Alternatively, it may also be preferable that the first and second low resistive regions deeply extend from top surfaces of the source and drain regions to bottom surfaces thereof.

Alternatively, it may also be preferable that the first and second low resistive regions deeply extend from top surfaces of the source and drain regions to deep levels slightly upper than bottom surfaces of the source and drain regions. Alternatively, it may also be preferable that the first low resistive region has an inside edge lower portion which is in contact with the first interface between the source region and the body portion, and that the first low resistive region also has an inside edge upper portion which is adjacent to but slightly distanced from the gate electrode.

It may also be preferable that the first low resistive region is separated by a part of the source region from the first interface between the source region and the body portion. Alternatively, it may also be preferable that the first and second low resistive regions selectively extend in upper regions of the source and drain regions. Alternatively, it may also be preferable that the first and second low resistive regions deeply extend from top surfaces of the source and drain regions to bottom surfaces thereof. Alternatively, it may also be preferable that the first and second low resistive regions deeply extend from top surfaces of the source and drain regions to deep levels slightly upper than bottom surfaces of the source and drain regions. Alternatively, it may also be preferable that the first low resistive region has an inside edge lower portion which is in contact with the first interface between the source region and the body portion, and that the first low resistive region also has an inside edge upper portion which is adjacent to but slightly distanced from the gate electrode.

It may also be preferable that the first low resistive region has an inside edge upper portion which is adjacent to but slightly distanced from the gate electrode. Alternatively, it may also be preferable that the first and second low resistive regions selectively extend in upper regions of the source and drain regions. Alternatively, it may also be preferable that the first and second low resistive regions deeply extend from top surfaces of the source and drain regions to bottom surfaces thereof. Alternatively, it may also be preferable that the first and second low resistive regions deeply extend from top surfaces of the source and drain regions to deep levels slightly upper than bottom surfaces of the source and drain regions. Alternatively, it may also be preferable that the first low resistive region has an inside edge lower portion which is in contact with the first interface between the source region and the body portion.

It may also be preferable that the distance of the inside edge portion of the first low resistive region from the first interface between the source region and the body portion is a half or less than the distance of the inside portion of the second low resistive region from the second interface between the drain region and the body portion.

It may also be preferable that the distance of the inside edge portion of the first low resistive region from the first interface between the source region and the body portion is in the range of 200–300 angstroms, whilst the distance of the inside portion of the second low resistive region from the second interface between the drain region and the body portion is about 1000 angstroms.

It may also be preferable that the semiconductor layer is a silicon-on-insulator layer which is formed on an buried insulation layer over a silicon substrate so that the body portion is electrically isolated from the silicon substrate.

It may also be preferable to further comprise a first contact layer having a bottom portion which is in contact with the first low resistive low resistive region and also having a top portion which is connected to a first interconnection, and a second contact layer having a bottom portion which is in contact with the second low resistive low resistive region and also having a top portion which is connected to a second interconnection.

It may also be possible that said first conductivity type is n-type and said second conductivity type is p-type.

It may also be possible that said first conductivity type is n-type and said second conductivity type is p-type.

It may also be possible that the first low resistive region has a bottom which lies at a deeper level than that of the second low resistive region.

It may also be possible to further comprise a first side wall insulation film formed on a first side wall of the gate electrode and in the vicinity of said source region, and a second side wall insulation film formed on a second side wall of the gate electrode and in the vicinity of said drain region, wherein the first side wall insulation film has a first thickness which is substantially the same as said distance between the inside edge portion of said first low resistive region and said first interface, and wherein the second side wall insulation film has a second thickness which is substantially the same as the first thickness of said first side wall insulation film and which is smaller than the distance between the inside edge portion of the second low resistive region and the second interface.

The third present invention also provides an SOI-MOS field effect transistor as follows. A buried insulation layer is provided on a silicon substrate. A silicon layer is provided on the buried insulation layer so that the silicon layer is electrically isolated from the silicon substrate. The silicon layer has source and drain regions of a first conductivity type and a body portion of a second conductivity type disposed between the source and drain regions. The source region has a first low resistive region which is lower in electrical resistivity than the source region and the drain region has a second low resistive region which is lower in electrical resistively than the source region. A gate insulation film extends over the body portion and over inside portions of the source and drain regions in the vicinity of the body portion. A gate electrode is provided on the gate insulation film so that the gate electrode is positioned over the body portion. A first side wall insulation film is provided on a first side wall of the gate electrode and in the vicinity of the source region. A second side wall insulation film is formed on a second side wall of the gate electrode and in the vicinity of the drain region. An inter-layer insulator extends over the silicon layers and the gate electrode wall as well as over the first and second side wall insulation films. A source contact layer is provided in the inter-layer insulator and the source contact layer has a bottom portion which is in contact with the first low resistive region of the source region and also has a top portion which is connected to a first interconnection extending over the inter-layer insulator. A drain contact layer is provided in the inter-layer insulator and the drain contact layer has a bottom portion which is in contact with the second low resistive region of the drain region and also has a top portion which is connected to a second interconnection extending over the inter-layer insulator. For the third present invention, it is important that a distance of an inside edge portion of the first low resistive region from a first interface between the source region and the body portion is shorter than a distance of an inside portion of the second low resistive region from a second interface between the drain region and the body portion.

The provision is, therefore, made of the first low resistive region in the source region at a short distance of the inside edge portion of the first low resistive region from the first interface between the source region and the body portion thereby to shorten the distance between the first low resistive region and the body portion. The life-time of the holes injected from the first interface of the body portion into the source region until the recombination of the injected holes with electrons is defined by the short distance of the inside edge portion of the first low resistive region from the first interface between the source region and the body portion. For this reason, the shortening of the distance of the inside edge portion of the first low resistive region from the first interface between the source region and the body portion does result in shortening of the life-time of the holes injected from the first interface of the body portion into the source region until the recombination of the injected holes with electrons. The current amplification factor of the parasitic bipolar transistor caused in the semiconductor layer is defined by the life-time of the holes injected from the first interface of the body portion into the source region until the recombination of the injected holes with electrons. Therefore, the shortening of the life-time of the holes injected from the first interface of the body portion into the source region until the recombination of the injected holes with electrons does result in a certain reduction in the current amplification factor of the parasitic bipolar transistor. The reduction in current amplification factor of the parasitic bipolar transistor suppresses the parasitic bipolar effect of the SOI-MOS field effect transistor.

In order to reduce the parasitic resistances of the shallow source region including the first low resistive region and also to suppress the parasitic bipolar effect of the SOI-MOS field effect transistor, it is effective to form the first low resistive region in the source region and the inside edge portion of the first low resistive region is positioned in the vicinity of or in contact with the first interface of the body portion to the source region, so that a relatively large leakage of current between the body portion and the source region is allowed, and further so that the life-time of the holes injected from the first interface of the body portion into the source region until the recombination of the injected holes with electrons is shortened, whereby the current amplification factor of the parasitic bipolar transistor is suppressed and the parasitic bipolar effect of the SOI-MOS field effect transistor is thus suppressed. The provision of the first low resistive region in the source region and in the vicinity of or in contact with the first interface of the body portion to the source region renders the SOI-MOS field effect transistor free from the kink effect.

On the other hand, the drain region has the second low resistive region which has the inside edge portion sufficiently distanced from the second interface of the body portion to the drain region. The drain region including the second low resistive region is applied with the drain voltage which is usually a high voltage. Further, the distance of the inside portion of the second low resistive region from the second interface between the drain region and the body portion is long. The provision of the second low resistive region in the drain region, so that the inside edge of the second low resistive region is sufficiently distanced from the second interface between the drain region and the body portion, does result in substantially no or sufficiently small leakage of current between the drain region and the body portion. This substantially no or sufficiently small leakage of current between the drain region and the body portion causes substantially no or sufficiently small OFF current of the SOI-MOS field effect transistor under zero gate voltage application, resulting in a remarkable decrease in power consumption of the SOI-MOS field effect transistor. The provisions of the first and second low resistive regions in the source and drain regions reduce in resistance of the source and drain regions as well as allows a reduction in parasitic resistance by the shallow p-n junctions of the source and drain regions.

Accordingly, the improved source/drain structure, such that the distance of the inside edge portion of the first low resistive region from the first interface between the source region and the body portion is shorter than the distance of the inside portion of the second low resistive region from the second interface between the drain region and the body portion, do render the SOI-MOS field effect transistor free from all of the above problems as being engaged with the first, second and third conventional SOI-MOS field effect transistors and also do provide the following advantages.

The above improved source/drain structure is capable of reducing source/drain parasitic resistance of the SOI-MOS field effect transistor.

The above improved source/drain structure also allows a reduction in thickness of the semiconductor layer.

The above improved source/drain structure also allows shallow p-n junctions of the source and drain regions.

The above improved source/drain structure is also capable of reducing the resistance of the drain region.

The above improved source/drain structure is also capable of suppressing the leakage of current between the body portion and the drain region applied with a high drain voltage.

The above improved source/drain structure is also capable of reducing the OFF current under zero gate voltage application.

The above improved source/drain structure is also capable of reducing a power consumption of the SOI-MOS field effect transistor.

The above improved source/drain structure also allows a leakage of current between the source region and the body portion.

The above improved source/drain structure is also capable of suppressing an excess potential rising of the body portion.

The above improved source/drain structure is also capable of suppressing a parasitic bipolar effect of the SOI-MOS field effect transistor.

The above improved source/drain structure also enables the SOI-MOS field effect transistor to be free from kink effect in sub-threshold characteristic which can be understood from FIG. 16 being illustrative of sub-threshold characteristics (Id-Vg characteristics) or current-voltage characteristics of the above novel SOI-MOS field effect transistor when applied with drain voltages of 1.5 V and 0.05 V.

The above improved source/drain structure is also capable of reduction in current amplification factor of a parasitic bipolar effect of the SOI-MOS field effect transistor.

The above improved source/drain structure is also capable of shortening a life-time of holes injected from the first interface of the body portion to the source region until recombination thereof with electrons.

The fourth present invention also provides a source/drain structure formed in a semiconductor layer which has source and drain regions of a first conductivity type and an electrically floating portion of a second conductivity type disposed between the source and drain regions. The electrically floating portion is positioned over a buried insulation layer over a semiconductor substrate and is also positioned under a gate insulation film over which a gate electrode is provided. The source region has a first low resistive region which is lower in electrical resistivity than the source region and the drain region has a second low resistive region which is lower in electrical resistively than the source region. For the fourth present invention, it is important that a distance of an inside edge portion of the first low resistive region from a first interface between the source region and the electrically floating portion is shorter than a distance of an inside portion of the second low resistive region from a second interface between the drain region and the electrically floating portion.

The provision is, therefore, made of the first low resistive region in the source region at a short distance of the inside edge portion of the first low resistive region from the first interface between the source region and the electrically floating intermediate portion, thereby to shorten the distance between the first low resistive region and the electrically floating intermediate portion. The life-time of the holes injected from the first interface of the electrically floating intermediate portion into the source region until the recombination of the injected holes with electrons is defined by the short distance of the inside edge portion of the first low resistive region from the first interface between the source region and the electrically floating intermediate portion. For this reason, the shortening of the distance of the inside edge portion of the first low resistive region from the first interface between the source region and the electrically floating intermediate portion does result in shortening of the life-time of the holes injected from the first interface of the electrically floating intermediate portion into the source region until the recombination of the injected holes with electrons. The current amplification factor of the parasitic bipolar transistor caused in the semiconductor layer is defined by the life-time of the holes injected from the first interface of the electrically floating intermediate portion into the source region until the recombination of the injected holes with electrons. Therefore, the shortening of the life-time of the holes injected from the first interface of the electrically floating intermediate portion into the source region until the recombination of the injected holes with electrons does result in a certain reduction in the current amplification factor of the parasitic bipolar transistor. The reduction in current amplification factor of the parasitic bipolar transistor suppresses the parasitic bipolar effect of the semiconductor device.

In order to reduce the parasitic resistances of the shallow source region including the first low resistive region and also to suppress the parasitic bipolar effect of the semiconductor device, it is effective to form the first low resistive region in the source region and the inside edge portion of the first low resistive region is positioned in the vicinity of or in contact with the first interface of the electrically floating intermediate portion to the source region, so that a relatively large leakage of current between the body portion and the source region is allowed, and further so that the life-time of the holes injected from the first interface of the electrically floating intermediate portion into the source region until the recombination of the injected holes with electrons is shortened, whereby the current amplification factor of the parasitic bipolar transistor is suppressed and the parasitic bipolar effect of the semiconductor device is thus suppressed. The provision of the first low resistive region in the source region and in the vicinity of or in contact with the first interface of the electrically floating intermediate portion to the source region renders the semiconductor device free from the kink effect.

On the other hand, the drain region has the second low resistive region which has the inside edge portion sufficiently distanced from the second interface of the electrically floating intermediate portion to the drain region. The drain region including the second low resistive region is applied with the drain voltage which is usually a high voltage. Further, the distance of the inside portion of the second low resistive region from the second interface between the drain region and the electrically floating intermediate portion is long. The provision of the second low resistive region in the drain region, so that the inside edge of the second low resistive region is sufficiently distanced from the second interface between the drain region and the electrically floating intermediate portion, does result in substantially no or sufficiently small leakage of current between the drain region and the electrically floating intermediate portion. This substantially no or sufficiently small leakage of current between the drain region and the electrically floating intermediate portion causes substantially no or sufficiently small OFF current of the semiconductor device under zero gate voltage application, resulting in a remarkable decrease in power consumption of the semiconductor device. The provisions of the first and second low resistive regions in the source and drain regions reduce in resistance of the source and drain regions as well as allows a reduction in parasitic resistance by the shallow p-n junctions of the source and drain regions.

Accordingly, the improved source/drain structure, such that the distance of the inside edge portion of the first low resistive region from the first interface between the source region and the electrically floating intermediate portion is shorter than the distance of the inside portion of the second low resistive region from the second interface between the drain region and the electrically floating intermediate portion, do render the semiconductor device free from all of the above problems as being engaged with the first, second and third conventional semiconductor devices and also do provide the following advantages.

The above improved source/drain structure is capable of reducing source/drain parasitic resistance of the semiconductor device.

The above improved source/drain structure also allows a reduction in thickness of the semiconductor layer.

The above improved source/drain structure also allows shallow p-n junctions of the source and drain regions.

The above improved source/drain structure is also capable of reducing the resistance of the drain region.

The above improved source/drain structure is also capable of suppressing the leakage of current between the electrically floating intermediate portion and the drain region applied with a high drain voltage.

The above improved source/drain structure is also capable of reducing the OFF current under zero gate voltage application.

The above improved source/drain structure is also capable of reducing a power consumption of the semiconductor device.

The above improved source/drain structure also allows a leakage of current between the source region and the electrically floating intermediate portion.

The above improved source/drain structure is also capable of suppressing an excess potential rising of the electrically floating intermediate portion.

The above improved source/drain structure is also capable of suppressing a parasitic bipolar effect of the semiconductor device.

The above improved source/drain structure also enables the semiconductor device to be free from kink effect in sub-threshold characteristic which can be understood from FIG. 16 being illustrative of sub-threshold characteristics (Id-Vg characteristics) or current-voltage characteristics of the above novel semiconductor device when applied with drain voltages of 1.5 V and 0.05 V.

The above improved source/drain structure is also capable of reduction in current amplification factor of a parasitic bipolar effect of the semiconductor device.

The above improved source/drain structure is also capable of shortening a life-time of holes injected from the first interface of the electrically floating intermediate portion to the source region until recombination thereof with electrons.

PREFERRED EMBODIMENTS

Figure 6:
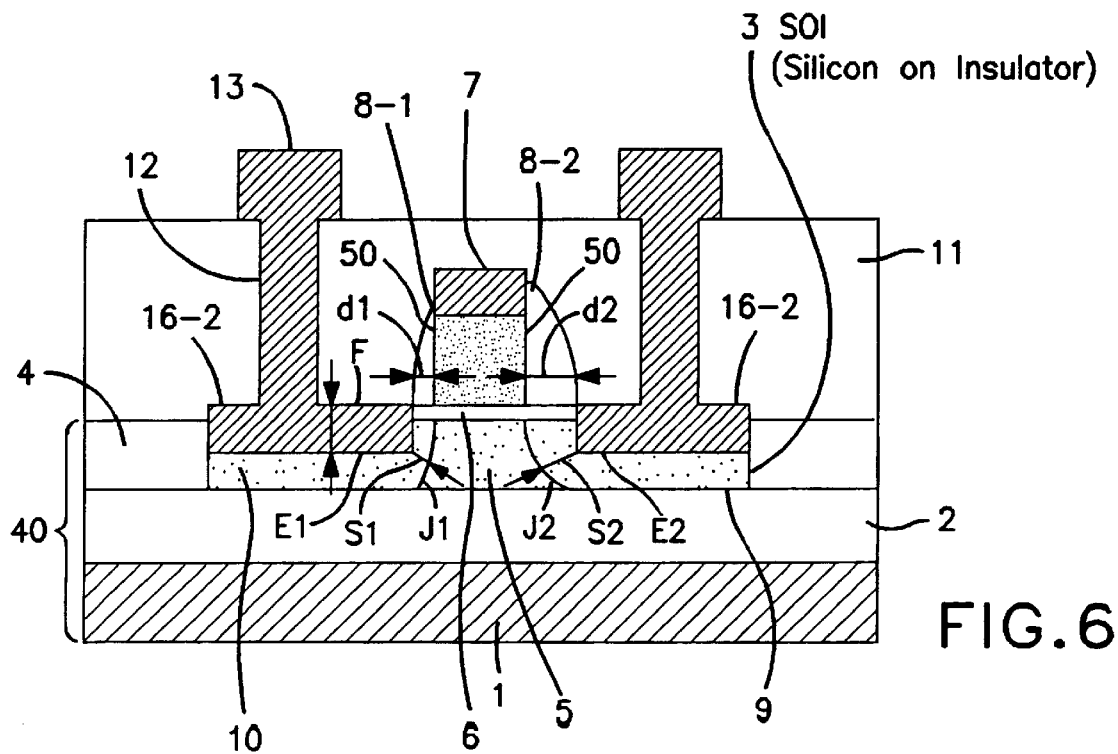
FIG. 6 is a fragmentary cross sectional elevation view illustrative of a novel SOI-MOS field effect transistor with an improved source and drain structure in a first embodiment in accordance with the present invention.

First Embodiment:

A first embodiment according to the present invention will be described in detail with reference to FIG. 6 which illustrates a novel SOI-MOS field effect transistor with an improved source/drain structure. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has $n^+$-type source/drain regions 10 and 9 and a p-type body portion 5 between the $n^+$-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. A first side wall oxide film 8-1 is also provided on a side wall of the gate electrode 7 in the source side and over the gate oxide film 6. The first side wall oxide film 8-1 has a first thickness d1 which may, for example, be in the range of 200–300 angstroms. A second side wall oxide film 8-2 is also provided on a side wall of the gate electrode 7 in the drain side and over the gate oxide film 6. The second side wall oxide film 8-2 has a second thickness d2 which is larger than the first thickness d1 of the first side wall oxide film 8-1. The second thickness d2 of the second side wall oxide film 8-2 may, for example, be about 1000 angstroms. The gate electrode 7 has an upper region which comprises a silicide layer. The silicide layer may preferably be made of a refractory metal silicide which is selected from titanium silicide, cobalt silicide, nickel silicide, and tungsten silicide.

A first silicide layer 16-1 is further formed in an upper region of the source region 10 except in the vicinity of the body portion 5 and except under the first side wall oxide film 8-1. The first silicide layer 16-1 may have a thickness F. The first silicide layer 16-1 may preferably be made of a refractory metal silicide which is selected from titanium silicide, cobalt silicide, nickel silicide, and tungsten silicide. An inside edge of the first silicide layer 16-1 corresponds in plane view to an outside edge of the first side wall oxide film 8-1. On the level of the surface of the silicon-on-insulator layer 3, the inside edge of the first silicide layer 16-1 is distanced in a lateral direction from the body portion 5 by a distance corresponding to the first thickness d1 of the first side wall oxide film 8-1. The body portion 5 increases in width downwardly but gradually as illustrated in FIG. 6. An inside bottom edge E1 of the first silicide layer 16-1 is most close to a first interface J1 of the body portion 5 to the source region 10. In the points on the first interface J1 of the body portion 5 to the source region 10, a point of a level, which is lower than the inside bottom edge E1 of the first silicide layer 16-1 and higher than the bottom level of the body portion 5, is most close to the inside bottom edge E1 of the first silicide layer 16-1. A distance between the inside bottom edge E1 of the first silicide layer 16-1 and the point on the first interface J1 of the body portion 5 is defined as a first distance S1 between the inside edge portion of the first silicide layer 16-1 and the first interface J1 of the body portion 5 to the source region 10.

A second silicide layer 16-2 is further formed in an upper region of the drain region 9 except in the vicinity of the body portion 5 and except under the second side wall oxide film 8-2. The second silicide layer 16-2 may preferably be made of a refractory metal silicide which is selected from titanium silicide, cobalt silicide, nickel silicide, and tungsten silicide. The second silicide layer 16-2 may have the same thickness F as that of the first silicide layer 16-1. An inside edge of the second silicide layer 16-2 corresponds in plane view to an outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. An inside bottom edge E2 of the second silicide layer 16-2 is most close to a second interface J2 of the body portion 5 to the drain region 9. In the points on the second interface J2 of the body portion 5 to the drain region 9, a point of a level, which is lower than the inside bottom edge E2 of the second silicide layer 16-2 and higher than the bottom level of the body portion 5, is most close to the inside bottom edge E2 of the second silicide layer 16-2. A distance between the inside bottom edge E2 of the second silicide layer 16-2 and the point on the second interface J2 of the body portion 5 is defined as a second distance S2 between the inside edge portion of the second silicide layer 16-2 and the second interface J2 of the body portion 5 to the drain region 9. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Therefore, the first distance between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5.

An inter-layer insulator 11 is further provided over the field oxide films 4, the first and second silicide layers 16-1 and 16-2 and the gate electrode 7 as well as over the first and second side wall oxide films 8-1 and 8-2. Contact holes 12 are formed in the inter-layer insulator 11 so that the contact holes 12 are positioned over the first and second silicide layers 16-1 and 16-2 over the source and drain regions 10 and 9 respectively. Contact layers are formed in the contact holes 12 so that the contact layers are in contact with the first and second silicide layers 16-1 and 16-2 over the source and drain regions 10 and 9 respectively. Metal interconnections 13 are provided which are connected to the contact layers so that the metal interconnections 13 are electrically connected to the source/drain regions 10 and 9.

The provision is, therefore, made of the first silicide layer 16-1 in the source region 10 at a short distance of the inside edge portion of the first silicide layer 16-1 from the first interface J1 between the source region 10 and the body portion 5, thereby to shorten the distance S1 between the first silicide layer 16-1 and the body portion 5. Therefore, the first distance S1 between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5. The life-time of the holes injected from the first interface J1 of the body portion 5 into the source region 10 until the recombination of the injected holes with electrons is defined by the first distance S1 of the inside bottom edge E1 of the first silicide layer 16-1 from the first interface J1 between the source region 10 and the body portion 5. For this reason, the shortening of the first distance S1 of the inside bottom edge E1 of the first silicide layer 16-1 from the first interface J1 between the source region 10 and the body portion 5 does result in shortening of the life-time of the holes injected from the first interface J1 of the body portion 5 into the source region 10 until the recombination of the injected holes with electrons. The current amplification factor of the parasitic bipolar transistor caused in the silicon-on-insulator layer is defined by the life-time of the holes injected from the first interface J1 of the body portion 5 into the source region 10 until the recombination of the injected holes with electrons. Therefore, the shortening of the life-time of the holes injected from the first interface J1 of the body portion 5 into the source region 10 until the recombination of the injected holes with electrons does result in a certain reduction in the current amplification factor of the parasitic bipolar transistor. The reduction in current amplification factor of the parasitic bipolar transistor suppresses the parasitic bipolar effect of the SOI-MOS field effect transistor.

In order to reduce the parasitic resistances of the shallow source region 10 including the first silicide layer 16-1 and also to suppress the parasitic bipolar effect of the SOI-MOS field effect transistor, it is effective to form the first silicide layer 16-1 in the source region 10 and the inside bottom edge E1 of the first silicide layer 16-1 is positioned in the vicinity of the first interface J1 of the body portion 5 to the source region 10, so that a relatively large leakage of current between the body portion 5 and the source region 10 is allowed, and further so that the life-time of the holes injected from the first interface J1 of the body portion 5 into the source region 10 until the recombination of the injected holes with electrons is shortened, whereby the current amplification factor of the parasitic bipolar transistor is suppressed and the parasitic bipolar effect of the SOI-MOS field effect transistor is thus suppressed. The provision of the first silicide layer 16-1 in the source region 10 and in the vicinity of the first interface J1 of the body portion 5 to the source region 10 renders the SOI-MOS field effect transistor free from the kink effect.

On the other hand, the drain region 9 has the second silicide layer 16-2 which has the inside bottom edge E2 sufficiently distanced from the second interface J2 of the body portion 5 to the drain region 9. The drain region 9 including the second silicide layer 16-2 is applied with the drain voltage which is usually a high voltage. Further, the second distance S2 of the inside bottom edge E2 of the second silicide layer 16-2 from the point of the second interface J2 between the drain region 9 and the body portion 5 is long. The provision of the second silicide layer 16-2 in the drain region 9, so that the inside bottom edge E2 of the second silicide layer 16-2 is sufficiently distanced from the second interface J2 between the drain region 9 and the body portion 5, does result in substantially no or sufficiently small leakage of current between the drain region 9 and the body portion 5. This substantially no or sufficiently small leakage of current between the drain region 9 and the body portion 5 causes substantially no or sufficiently small OFF current of the SOI-MOS field effect transistor under zero gate voltage application, resulting in a remarkable decrease in power consumption of the SOI-MOS field effect transistor. The provisions of the first and second silicide layers 16-1 and 16-2 in the source and drain regions 10 and 9 respectively do reduce in resistance of the source and drain regions 10 and 9 as well as do allow a reduction in parasitic resistance by the shallow p-n junctions of the source and drain regions 10 and 9.

Accordingly, the above improved source/drain structure, such that the first distance S1 of the inside bottom edge E1 of the first silicide layer 16-1 from the first interface J1 between the source region 10 and the body portion 5 is shorter than the second distance S2 of the inside bottom edge E2 of the second silicide layer 16-2 from the second interface J2 between the drain region 9 and the body portion 5, do render the SOI-MOS field effect transistor free from all of the above problems as having been engaged with the first, second and third conventional SOI-MOS field effect transistors and also do provide the following advantages.

The above improved source/drain structure is capable of reducing source/drain parasitic resistance of the SOI-MOS field effect transistor.

The above improved source/drain structure also allows a reduction in thickness of the silicon-on-insulator layer 3.

The above improved source/drain structure also allows shallow p-n junctions of the source and drain regions 10 and 9.

The above improved source/drain structure is also capable of reducing the resistance of the drain region 9.

The above improved source/drain structure is also capable of suppressing the leakage of current between the body portion 5 and the drain region 9 applied with a high drain voltage.

The above improved source/drain structure is also capable of reducing the OFF current under zero gate voltage application.

The above improved source/drain structure is also capable of reducing a power consumption of the SOI-MOS field effect transistor.

The above improved source/drain structure also allows a leakage of current between the source region 10 and the body portion 5.

The above improved source/drain structure is also capable of suppressing an excess potential rising of the body portion 5.

The above improved source/drain structure is also capable of suppressing a parasitic bipolar effect of the SOI-MOS field effect transistor.

The above improved source/drain structure also enables the SOI-MOS field effect transistor to be free from kink effect in sub-threshold characteristic which can be understood from FIG. 16 being illustrative of sub-threshold characteristics (Id-Vg characteristics) or current-voltage characteristics of the above novel SOI-MOS field effect transistor when applied with drain voltages of 1.5 V and 0.05 V.

The above improved source/drain structure is also capable of reduction in current amplification factor of a parasitic bipolar effect of the SOI-MOS field effect transistor.

The above improved source/drain structure is also capable of shortening a life-time of holes injected from the first interface J1 of the body portion 5 to the source region 10 until recombination thereof with electrons.

The above present invention of the first embodiment may be applicable to a p-channel SOI-MOS field effect transistor.

The following descriptions will highlight fabrication processes for the above n-channel SOI-MOS field effect transistor.

Figure 7A:
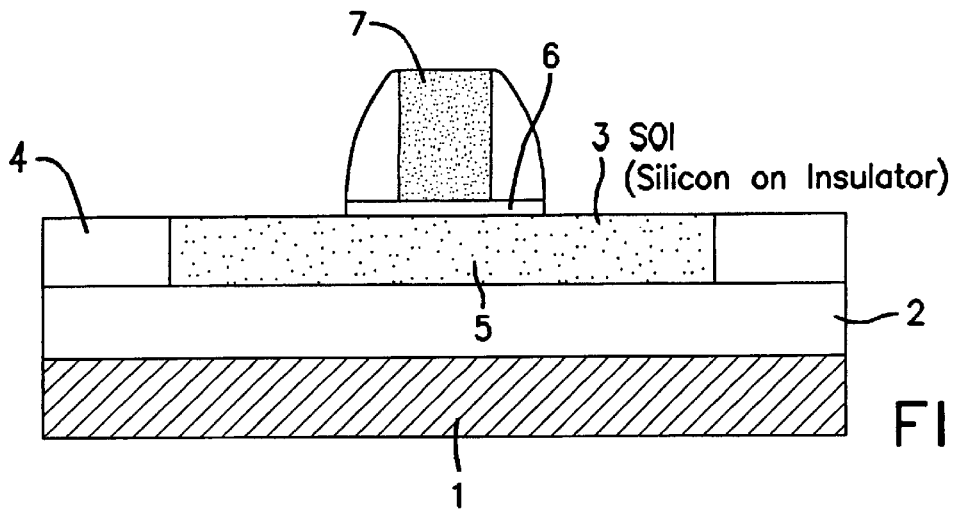
FIGS. 7A through 7E are fragmentary cross sectional elevation views illustrative of a novel SOI-MOS field effect transistor with an improved source and drain structure in sequential fabrication processes involved in a method of forming the novel SOI-MOS field effect transistor in a first embodiment in accordance with the present invention.

With reference to FIG. 7A, the buried oxide film 2 is formed over the silicon substrate 1. The silicon-on-insulator layer 3 of silicon is formed over the buried oxide film 2 so that an SOI-substrate is formed. The field oxide films 4 are selectively formed over the buried oxide film 2 so that the field oxide films 4 define the silicon-on-insulator layer 3. An ion-implantation of p-type impurity such as boron into at least a center region on which the body portion 5 will be formed in later process so that at least the center region of the silicon-on-insulator layer 3 for formation of the body portion 5 is controlled in threshold voltage. The gate oxide film 6 is formed over the center region of the silicon-on-insulator layer 3 for formation of the body portion. The gate electrode 7 made of polysilicon is then formed over the gate oxide film 6. It is optionally possible to carry out an ion-implantation of n-type impurity such as phosphorus or arsenic into the p-type body portion 5 to form lightly doped drain regions which are even not illustrated.

Figure 7B:
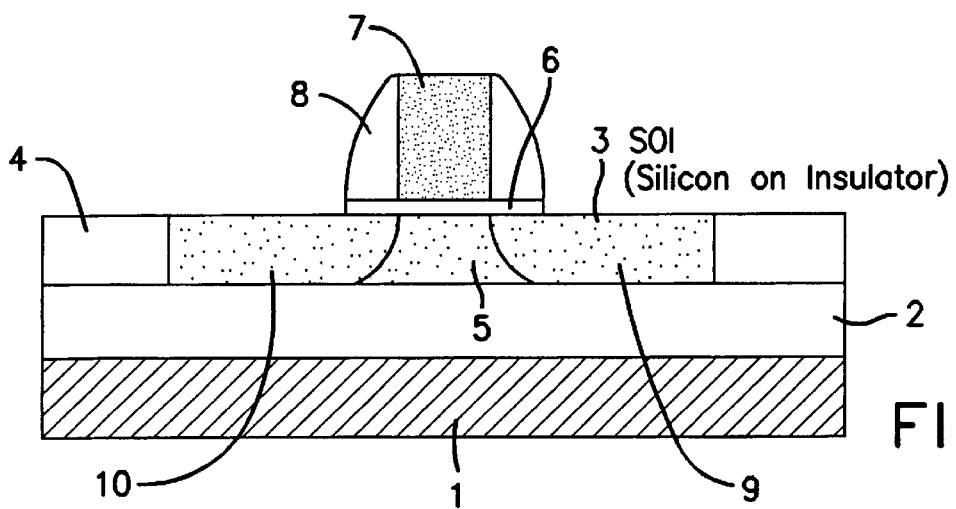

With reference to FIG. 7B, an insulation film 8 is entirely deposited which extends over the field oxide films 4, the silicon-on-insulator layer 3 and the gate electrode 7 before the insulation film 8 is then subjected to an anisotropic etching to leave the insulation film 8 only on the opposite side walls of the gate electrode 7 and over the gate oxide film 6 whereby the side wall insulation films 8 are formed on the opposite side walls of the gate electrode 7 and over the gate oxide film 6. The n$^+$-type source and drain regions 10 and 9 are formed in the silicon-on-insulator layer 3 so that the n$^+$-type source and drain regions 10 and 9 are separated by the p-type body portion 5, whereby the body portion 5 is defined between the source and drain regions 10 and 9. The body portion 5 increases in width downwardly wherein the top portion of the body portion 5 has almost the same width as the gate electrode 7 whilst the bottom portion of the body portion 5 is wider than the top portion thereof.

Figure 7C:
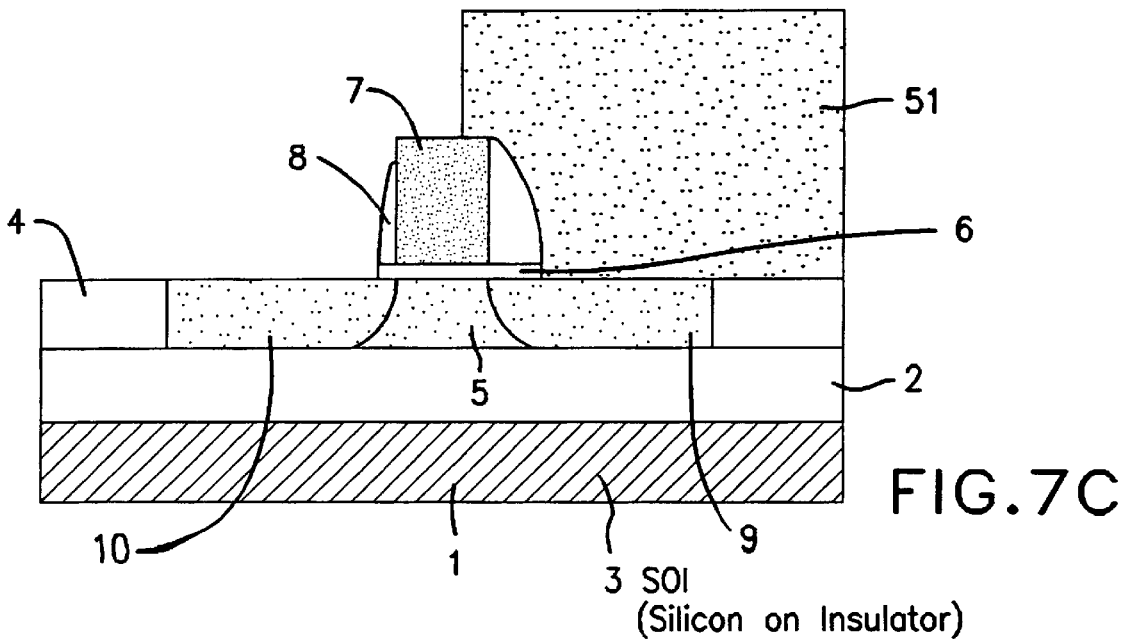

With reference to FIG. 7C, a photo-resist film 51 is selectively formed which covers the drain region 9, the side wall insulation film 8 of the drain side and the drain side portion of the gate electrode 7. The side wall insulation film 8 in the source side and the gate oxide film in the source side are etched by use of the above photo-resist film 51 as a mask, whereby the thickness of the side wall insulation film 8 in the source side is reduced.

Figure 7D:
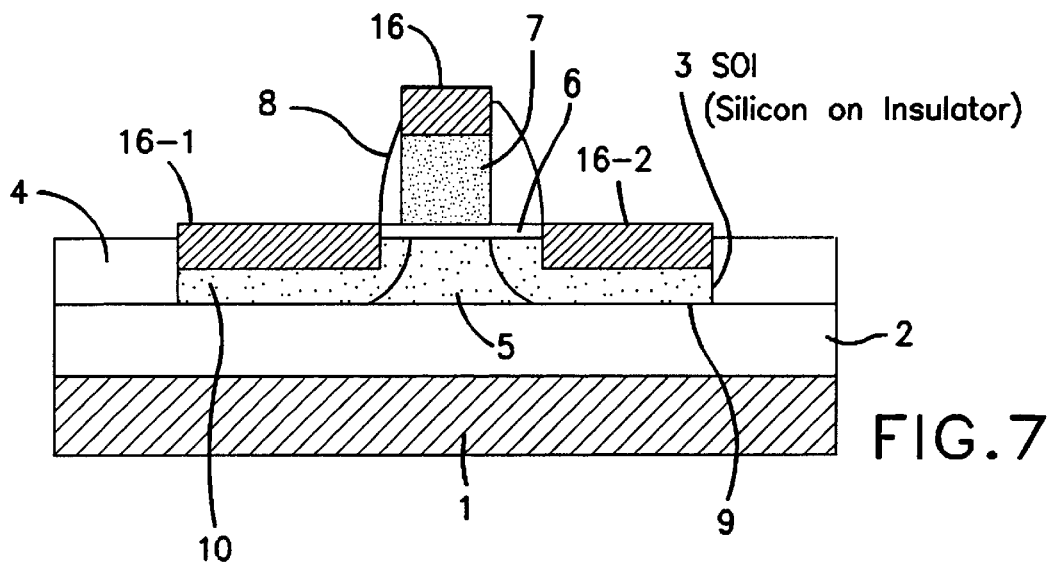

With reference to FIG. 7D, a refractory metal layer made of, for example, titanium or cobalt is entirely deposited over the source and drain regions 10 and 9, the field oxide films 4 and the gate electrode 7 as well as the side wall insulation films 8 by sputtering a refractory metal target. A heat treatment is carried out to cause a silicidation reaction of the refractory metal with silicon thereby to selectively form the first and second silicide layers 16-1 and 16-2 in upper regions of the source and drain regions 10 and 9 respectively as well as form another silicide layer 16 over the gate electrode 7 which is made of polysilicon. As a result, an unreacted refractory metal layer remains over the side wall insulation films 8 and the field oxide films 4. The unreacted refractory metal layer is then removed. The first and second silicide layers 16-1 and 16-2 are self-aligned by the gate electrode 7 and the first and second side wall insulation films 8-1 and 8-2 which differ in thickness from each other as described above.

The inside edge of the first silicide layer 16-1 corresponds in plane view to the outside edge of the first side wall oxide film 8-1. On the level of the surface of the silicon-on-insulator layer 3, the inside edge of the first silicide layer 16-1 is distanced in a lateral direction from the body portion 5 by a distance corresponding to the first thickness d1 of the first side wall oxide film 8-1. The inside bottom edge E1 of the first silicide layer 16-1 is most close to a first interface J1 of the body portion 5 to the source region 10. In the points on the first interface J1 of the body portion 5 to the source region 10, the point of a level, which is lower than the inside bottom edge E1 of the first silicide layer 16-1 and higher than the bottom level of the body portion 5, is most close to the inside bottom edge E1 of the first silicide layer 16-1. A distance between the inside bottom edge E of the first silicide layer 16-1 and the point on the first interface J1 of the body portion 5 is defined as the first distance S1 between the inside edge portion of the first silicide layer 16-1 and the first interface J1 of the body portion 5 to the source region 10.

The inside edge of the second silicide layer 16-2 corresponds in plane view to the outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. The inside bottom edge E2 of the second silicide layer 16-2 is most close to the second interface J2 of the body portion 5 to the drain region 9. In the points on the second interface J2 of the body portion5 to the drain region 9, a point of a level, which is lower than the inside bottom edge E2 of the second silicide layer 16-2 and higher than the bottom level of the body portion 5, is most close to the inside bottom edge E2 of the second silicide layer 16-2. A distance between the inside bottom edge E2 of the second silicide layer 16-2 and the point on the second interface J2 of the body portion 5 is defined as the second distance S2 between the inside edge portion of the second silicide layer 16-2 and the second interface J2 of the body portion 5 to the drain region 9. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Therefore, the first distance between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5.

Figure 7E:
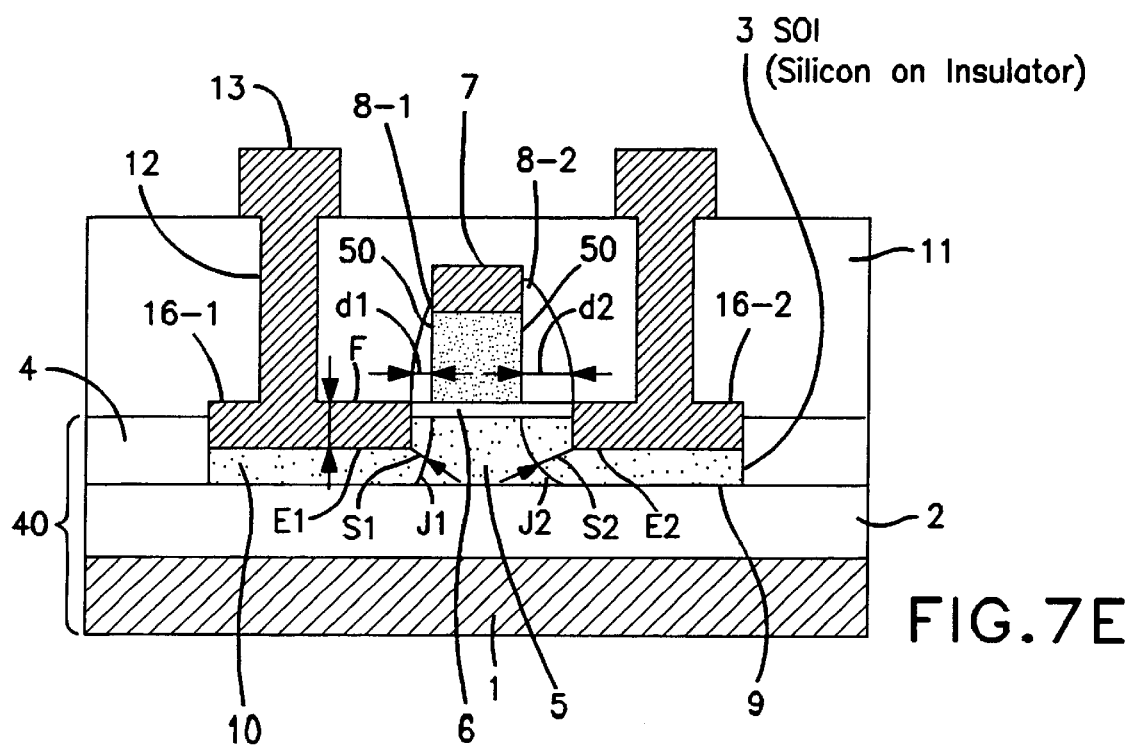

With reference to FIG. 7E, the inter-layer insulator 11 is entirely formed over the field oxide films 4, the first and second silicide layers 16-1 and 16-2 and the other silicide layer over the gate electrode 7 as well as over the side wall insulation films 8-1 and 8-2. The contact holes 12 are formed in the inter-layer insulator 11 so that the contact holes 12 are positioned over the first and second silicide layers 16-1 and 16-2 of the source and drain regions 10 and 9. Contact layers are formed in the contact holes 12 so that the contact layers are made into contact with the first and second silicide layers 16-1 and 16-2 of the source and drain regions 10 and 9. Interconnections 13 are then formed over the inter-layer insulator 11 and connected with the contact layers so that the interconnections 13 are electrically connected to the first and second silicide layers 16-1 and 16-2 of the source and drain regions 10 and 9.

Figure 8:
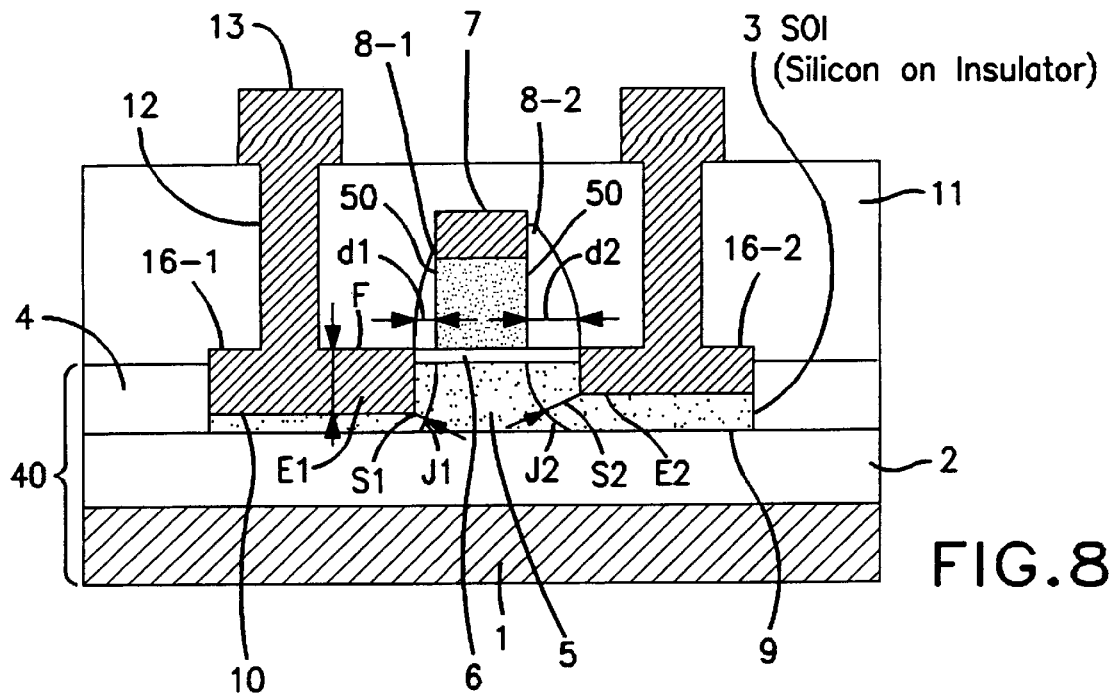
FIG. 8 is a fragmentary cross sectional elevation view illustrative of a novel SOI-MOS field effect transistor with an improved source and drain structure in a second embodiment in accordance with the present invention.

Second Embodiment:

A second embodiment according to the present invention will be described in detail with reference to FIG. 8 which illustrates a novel SOI-MOS field effect transistor with an improved source/drain structure. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has $n^+$-type source/drain regions 10 and 9 and a p-type body portion 5 between the $n^+$-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. A first side wall oxide film 8-1 is also provided on a side wall of the gate electrode 7 in the source side and over the gate oxide film 6. The first side wall oxide film 8-1 has a first thickness d1 which may, for example, be in the range of 200–300 angstroms. A second side wall oxide film 8-2 is also provided on a side wall of the gate electrode 7 in the drain side and over the gate oxide film 6. The second side wall oxide film 8-2 has a second thickness d2 which is larger than the first thickness d1 of the first side wall oxide film 8-1. The second thickness d2 of the second side wall oxide film 8-2 may, for example, be about 1000 angstroms. The gate electrode 7 has an upper region which comprises a silicide layer. The silicide layer may preferably be made of a refractory metal silicide which is selected from titanium silicide, cobalt silicide, nickel silicide, and tungsten silicide.

A first silicide layer 16-1 is further formed in the source region 10 except in the bottom portion and in the vicinity of the body portion 5 and under the first side wall oxide film 8-1. The first silicide layer 16-1 may have a thickness which is just smaller than the thickness of the source region 10. Namely, the first silicide layer 16-1 is deeply formed in the source region 10. The first silicide layer 16-1 may preferably be made of a refractory metal silicide which is selected from titanium silicide, cobalt silicide, nickel silicide, and tungsten silicide. An inside edge of the first silicide layer 16-1 is positioned just inside in plane view of an outside edge of the first side wall oxide film 8-1. On the level of the surface of the silicon-on-insulator layer 3, the inside edge of the first silicide layer 16-1 is distanced in a lateral direction from the body portion 5 by a distance just smaller than the first thickness d1 of the first side wall oxide film 8-1. The body portion 5 increases in width downwardly but gradually as illustrated in FIG. 8. An inside bottom edge E1 of the first silicide layer 16-1 is adjacent to or nearly in contact with a first interface J1 of the body portion 5 to the source region 10. In the points on the first interface J1 of the body portion 5 to the source region 10, a point of a level, which is just lower than the inside bottom edge E1 of the first silicide layer 16-1 and higher than the bottom level of the body portion 5, is most close to the inside bottom edge E1 of the first silicide layer 16-1.

A second silicide layer 16-2 is further formed in an upper region of the drain region 9 except in the vicinity of the body portion 5 and except under the second side wall oxide film 8-2. The second silicide layer 16-2 may preferably be made of a refractory metal silicide which is selected from titanium silicide, cobalt silicide, nickel silicide, and tungsten silicide. The second silicide layer 16-2 is thinner than the first silicide layer 16-1. An inside edge of the second silicide layer 16-2 corresponds in plane view to an outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. An inside bottom edge E2 of the second silicide layer 16-2 is most close to a second interface J2 of the body portion 5 to the drain region 9. In the points on the second interface J2 of the body portion 5 to the drain region 9, a point of a level, which is lower than the inside bottom edge E2 of the second silicide layer 16-2 and higher than the bottom level of the body portion 5, is most close to the inside bottom edge E2 of the second silicide layer 16-2. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Further, the first silicide layer 16-1 of the source region 10 is thicker than the second silicide layer 16-2 of the drain region 9. This results in that the first distance of the inside bottom edge of the first silicide layer 16-1 of the source region 10 from the first interface J1 of the body portion 5 to the source region 10 is much shorter than the second distance of the inside bottom edge of the second silicide layer 16-2 of the drain region 9 from the second interface J2 of the body portion 5 to the drain region 9.

Therefore, the first distance between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5

An inter-layer insulator 11 is further provided over the field oxide films 4, the first and second silicide layers 16-1 and 16-2 and the gate electrode 7 as well as over the first and second side wall oxide films 8-1 and 8-2. Contact holes 12 are formed in the inter-layer insulator 11 so that the contact holes 12 are positioned over the first and second silicide layers 16-1 and 16-2 over the source and drain regions 10 and 9 respectively. Contact layers are formed in the contact holes 12 so that the contact layers are in contact with the first and second silicide layers 16-1 and 16-2 over the source and drain regions 10 and 9 respectively. Metal interconnections 13 are provided which are connected to the contact layers so that the metal interconnections 13 are electrically connected to the source/drain regions 10 and 9.

The provision is, therefore, made of the first silicide layer 16-1 in the source region 10 deeply at a short distance of the inside edge portion of the first silicide layer 16-1 from the first interface J1 between the source region 10 and the body portion 5, thereby to greatly shorten the first distance between the first silicide layer 16-1 and the body portion 5. Therefore, the first distance between the inside bottom edge E1 of the first silicide layer 16-1 and the point on the first interface J1 of the body portion 5 is much shorter than the second distance between the inside bottom edge E2 of the second silicide layer 16-2 and the point on the second interface J2 of the body portion 5. The life-time of the holes injected from the first interface J1 of the body portion 5 into the source region 10 until the recombination of the injected holes with electrons is defined by the first distance of the inside bottom edge E1 of the first silicide layer 16-1 from the first interface J1 between the source region 10 and the body portion 5. For this reason, the shortening of the first distance of the inside bottom edge E1 of the first silicide layer 16-1 from the first interface J1 between the source region 10 and the body portion 5 does result in shortening of the life-time of the holes injected from the first interface J1 of the body portion 5 into the source region 10 until the recombination of the injected holes with electrons. The current amplification factor of the parasitic bipolar transistor caused in the silicon-on-insulator layer is defined by the life-time of the holes injected from the first interface J1 of the body portion 5 into the source region 10 until the recombination of the injected holes with electrons. Therefore, the shortening of the life-time of the holes injected from the first interface J1 of the body portion 5 into the source region 10 until the recombination of the injected holes with electrons does result in a certain reduction in the current amplification factor of the parasitic bipolar transistor. The reduction in current amplification factor of the parasitic bipolar transistor suppresses the parasitic bipolar effect of the SOI-MOS field effect transistor.

In order to reduce the parasitic resistances of the shallow source region 10 including the first silicide layer 16-1 and also to suppress the parasitic bipolar effect of the SOI-MOS field effect transistor, it is effective to form the first silicide layer 16-1 deeply in the source region 10 and the inside bottom edge E1 of the first silicide layer 16-1 is positioned adjacent to the first interface J1 of the body portion 5 to the source region 10, so that a relatively large leakage of current between the body portion 5 and the source region 10 is allowed, and further so that the life-time of the holes injected from the first interface J1 of the body portion 5 into the source region 10 until the recombination of the injected holes with electrons is shortened, whereby the current amplification factor of the parasitic bipolar transistor is suppressed and the parasitic bipolar effect of the SOI-MOS field effect transistor is thus suppressed. The provision of the first silicide layer 16-1 in the source region 10 and in the vicinity of the first interface J1 of the body portion 5 to the source region 10 renders the SOI-MOS field effect transistor free from the kink effect.

On the other hand, the drain region 9 has the second silicide layer 16-2 which has the inside bottom edge E2 sufficiently distanced from the second interface J2 of the body portion 5 to the drain region 9. The drain region 9 including the second silicide layer 16-2 is applied with the drain voltage which is usually a high voltage. Further, the second distance S2 of the inside bottom edge E2 of the second silicide layer 16-2 from the point of the second interface J2 between the drain region 9 and the body portion 5 is long. The provision of the second silicide layer 16-2 in the drain region 9, so that the inside bottom edge E2 of the second silicide layer 16-2 is sufficiently distanced from the second interface J2 between the drain region 9 and the body portion 5, does result in substantially no or sufficiently small leakage of current between the drain region 9 and the body portion 5. This substantially no or sufficiently small leakage of current between the drain region 9 and the body portion 5 causes substantially no or sufficiently small OFF current of the SOI-MOS field effect transistor under zero gate voltage application, resulting in a remarkable decrease in power consumption of the SOI-MOS field effect transistor. The provisions of the first and second silicide layers 16-1 and 16-2 in the source and drain regions 10 and 9 respectively do reduce in resistance of the source and drain regions 10 and 9 as well as do allow a reduction in parasitic resistance by the shallow p-n junctions of the source and drain regions 10 and 9.

Accordingly, the above improved source/drain structure, such that the first distance of the inside bottom edge E1 of the first silicide layer 16-1 from the first interface J1 between the source region 10 and the body portion 5 is shorter than the second distance of the inside bottom edge E2 of the second silicide layer 16-2 from the second interface J2 between the drain region 9 and the body portion 5, do render the SOI-MOS field effect transistor free from all of the above problems as having been engaged with the first, second and third conventional SOI-MOS field effect transistors and also do provide the following advantages.

The above improved source/drain structure is capable of reducing source/drain parasitic resistance of the SOI-MOS field effect transistor.

The above improved source/drain structure also allows a reduction in thickness of the silicon-on-insulator layer 3.

The above improved source/drain structure also allows shallow p-n junctions of the source and drain regions 10 and 9.

The above improved source/drain structure is also capable of reducing the resistance of the drain region 9.

The above improved source/drain structure is also capable of suppressing the leakage of current between the body portion 5 and the drain region 9 applied with a high drain voltage.

The above improved source/drain structure is also capable of reducing the OFF current under zero gate voltage application.

The above improved source/drain structure is also capable of reducing a power consumption of the SOI-MOS field effect transistor.

The above improved source/drain structure also allows a leakage of current between the source region 10 and the body portion 5.

The above improved source/drain structure is also capable of suppressing an excess potential rising of the body portion 5.

The above improved source/drain structure is also capable of suppressing a parasitic bipolar effect of the SOI-MOS field effect transistor.

The above improved source/drain structure also enables the SOI-MOS field effect transistor to be free from kink effect in sub-threshold characteristic which can be understood from FIG. 16 being illustrative of sub-threshold characteristics (Id-Vg characteristics) or current-voltage characteristics of the above novel SOI-MOS field effect transistor when applied with drain voltages of 1.5 V and 0.05 V.

The above improved source/drain structure is also capable of reduction in current amplification factor of a parasitic bipolar effect of the SOI-MOS field effect transistor.

The above improved source/drain structure is also capable of shortening a life-time of holes injected from the first interface J1 of the body portion 5 to the source region 10 until recombination thereof with electrons.

The above present invention of the first embodiment may be applicable to a p-channel SOI-MOS field effect transistor.

The following descriptions will highlight fabrication processes for the above n-channel SOI-MOS field effect transistor.

Figure 9A:
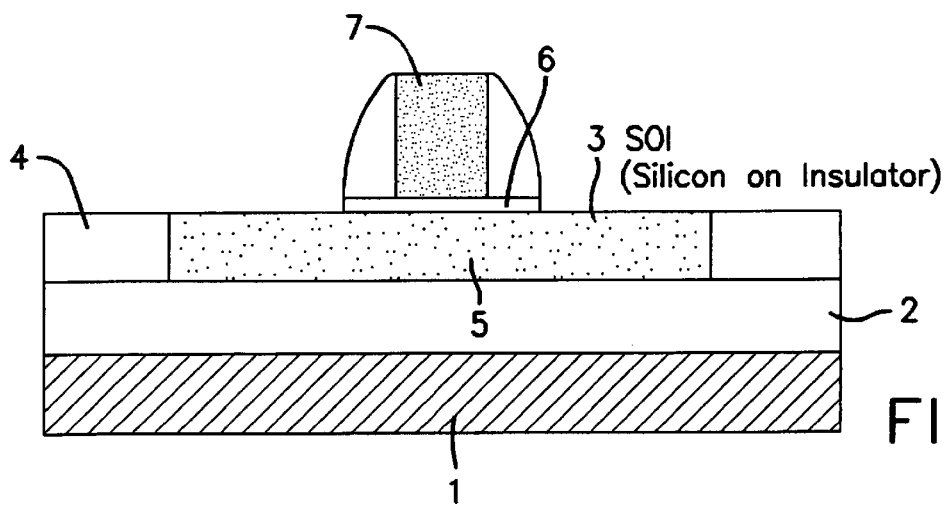
FIGS. 9A through 9E are fragmentary cross sectional elevation views illustrative of a novel SOI-MOS field effect transistor with an improved source and drain structure in sequential fabrication processes involved in a method of forming the novel SOI-MOS field effect transistor in a second embodiment in accordance with the present invention.

With reference to FIG. 9A, the buried oxide film 2 is formed over the silicon substrate 1. The silicon-on-insulator layer 3 of silicon is formed over the buried oxide film 2 so that an SOI-substrate is formed. The field oxide films 4 are selectively formed over the buried oxide film 2 so that the field oxide films 4 define the silicon-on-insulator layer 3. An ion-implantation of p-type impurity such as boron into at least a center region on which the body portion 5 will be formed in later process so that at least the center region of the silicon-on-insulator layer 3 for formation of the body portion 5 is controlled in threshold voltage. The gate oxide film 6 is formed over the center region of the silicon-on-insulator layer 3 for formation of the body portion. The gate electrode 7 made of polysilicon is then formed over the gate oxide film 6. It is optionally possible to carry out an ion-implantation of n-type impurity such as phosphorus or arsenic into the p-type body portion 5 to form lightly doped drain regions which are even not illustrated.

Figure 9B:
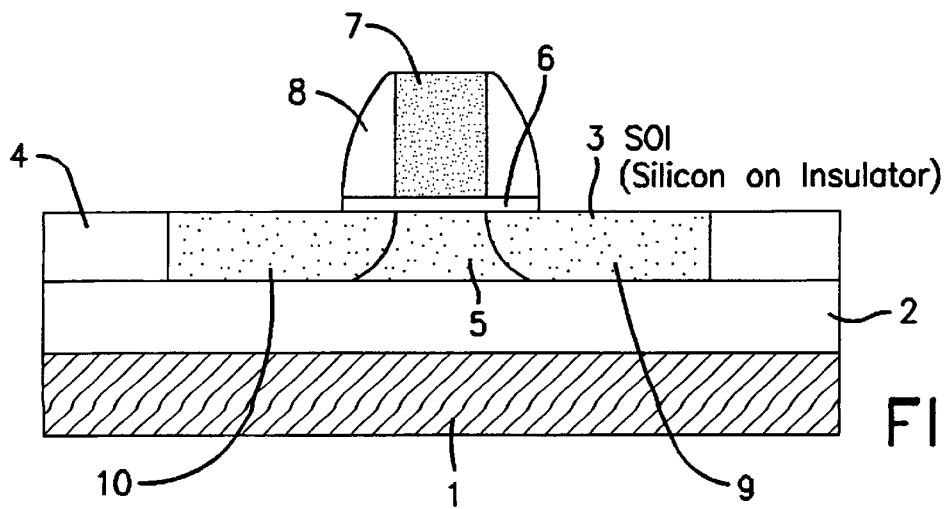

With reference to FIG. 9B, an insulation film 8 is entirely deposited which extends over the field oxide films 4, the silicon-on-insulator layer 3 and the gate electrode 7 before the insulation film 8 is then subjected to an anisotropic etching to leave the insulation film 8 only on the opposite side walls of the gate electrode 7 and over the gate oxide film 6 whereby the side wall insulation films 8 are formed on the opposite side walls of the gate electrode 7 and over the gate oxide film 6. The $n^+$-type source and drain regions 10 and 9 are formed in the silicon-on-insulator layer 3 so that the $n^+$-type source and drain regions 10 and 9 are separated by the p-type body portion 5, whereby the body portion 5 is defined between the source and drain regions 10 and 9. The body portion 5 increases in width downwardly wherein the top portion of the body portion 5 has almost the same width as the gate electrode 7 whilst the bottom portion of the body portion 5 is wider than the top portion thereof.

Figure 9C:
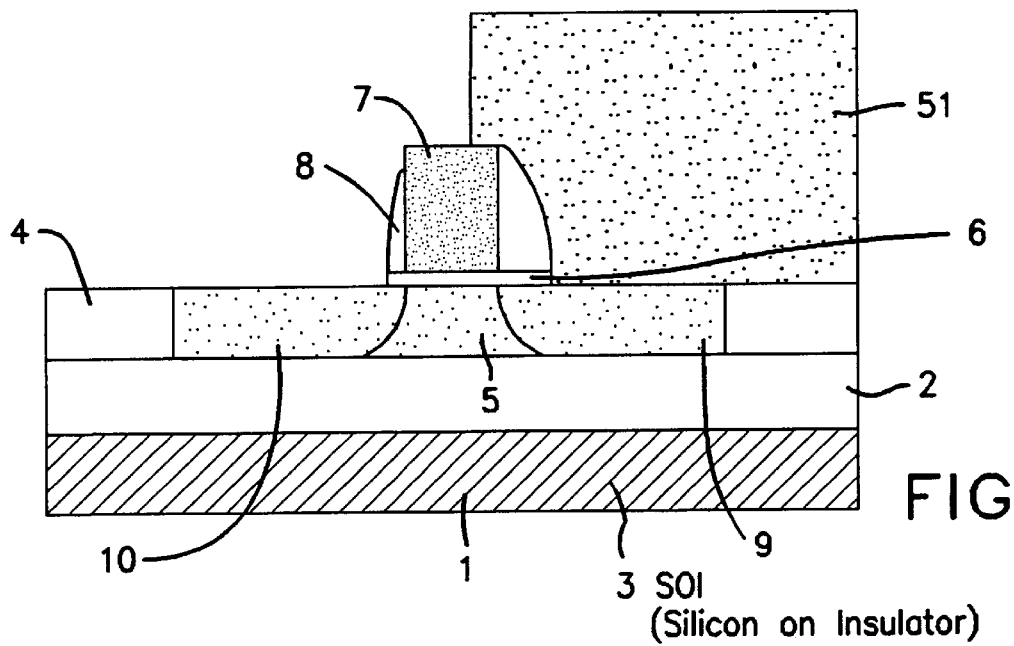

With reference to FIG. 9C, a photo-resist film 51 is selectively formed which covers the drain region 9, the side wall insulation film 8 of the drain side and the drain side portion of the gate electrode 7. The side wall insulation film 8 in the source side and the gate oxide film in the source side are etched by use of the above photo-resist film 51 as a mask, whereby the thickness of the side wall insulation film 8 in the source side is reduced.

Figure 9D:
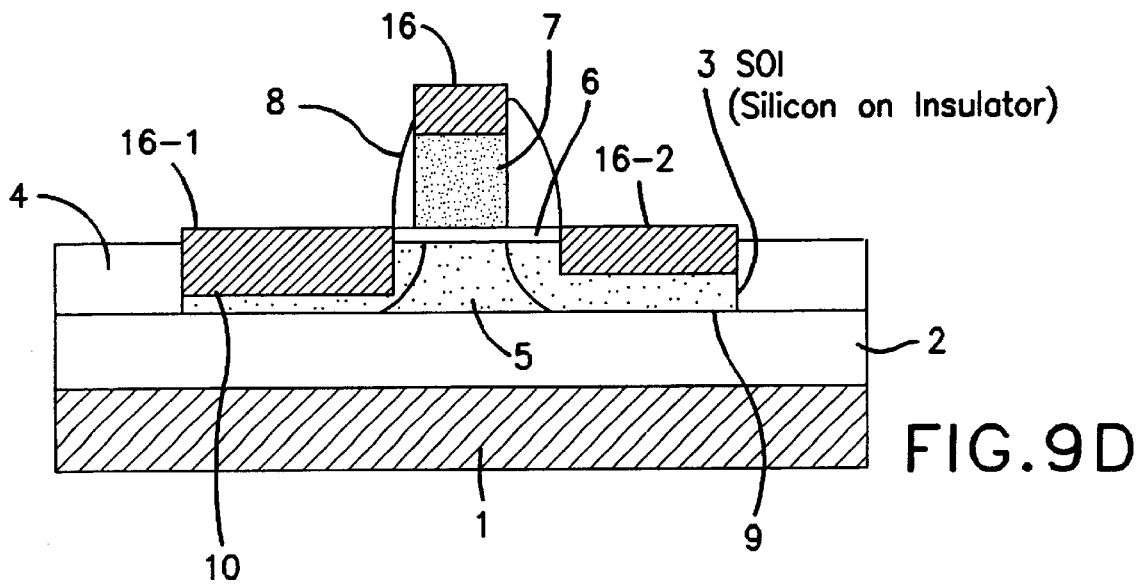
Figure 9E:
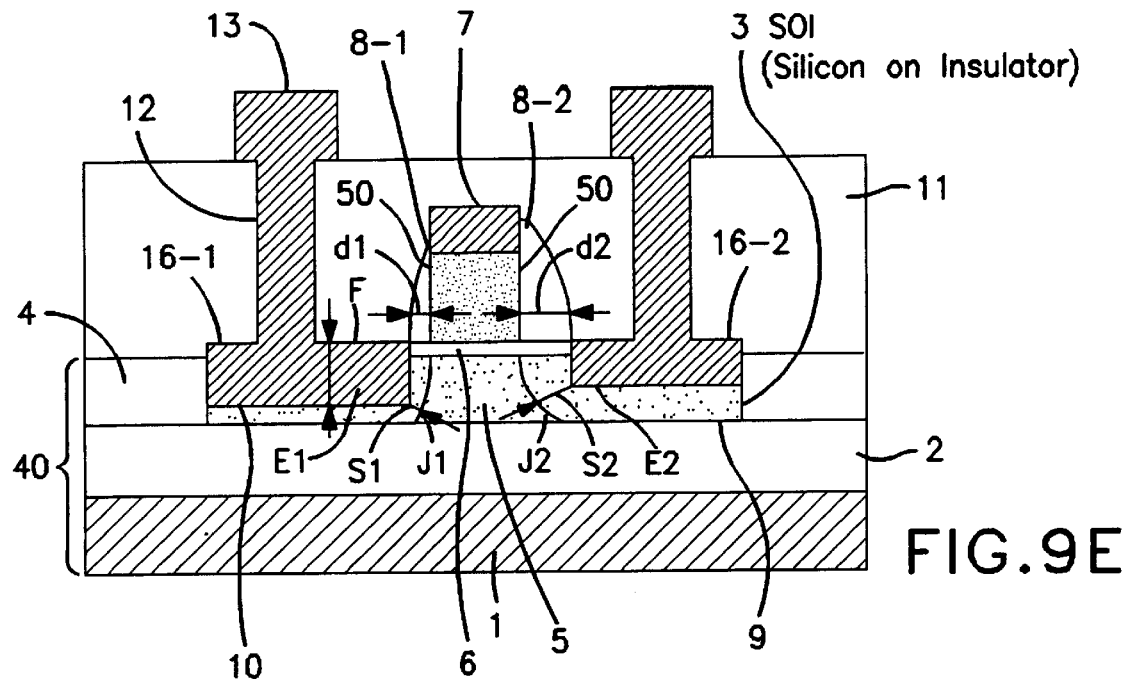

With reference to FIG. 9D, a refractory metal layer made of, for example, titanium or cobalt is entirely deposited over the source and drain regions 10 and 9, the field oxide films 4 and the gate electrode 7 as well as the side wall insulation films 8 by sputtering a refractory metal target. The refractory metal layer differs in thickness so that the thickness of the refractory metal layer over the source region 10 is thicker than the thickness of the refractory metal layer. A heat treatment is carried out to cause a silicidation reaction of the refractory metal with silicon thereby to selectively form the first and second silicide layers 16-1 and 16-2 in the source and drain regions 10 and 9 respectively as well as form another silicide layer 16 over the gate electrode 7 which is made of polysilicon. The first silicide layer 16-1 is formed in the source region 10 except in the bottom portion and in the vicinity of the body portion 5 and under the first side wall oxide film 8-1. The second silicide layer 16-2 is formed in the upper region of the drain region 10 except in the vicinity of the body portion 5 and under the second side wall oxide film 8-2. As a result, an unreacted refractory metal layer remains over the side wall insulation films 8 and the field oxide films 4. The unreacted refractory metal layer is then removed. The first and second silicide layers 16-1 and 16-2 are self-aligned by the gate electrode 7 and the first and second side wall insulation films 8-1 and 8-2 which differ in thickness from each other as described above.

The inside edge of the first silicide layer 16-1 is positioned just inside in plane view of the outside edge of the first side wall oxide film 8-1. On the level of the surface of the silicon-on-insulator layer 3, the inside edge of the first silicide layer 16-1 is distanced in a lateral direction from the body portion 5 by a distance just smaller the first thickness d1 of the first side wall oxide film 8-1. The inside bottom edge E1 of the first silicide layer 16-1 is most close to a first interface J1 of the body portion 5 to the source region 10. In the points on the first interface J1 of the body portion 5 to the source region 10, the point of a level, which is lower than the inside bottom edge E1 of the first silicide layer 16-1 and just higher than the bottom level of the body portion 5, is most close to the inside bottom edge E1 of the first silicide layer 16-1.

The inside edge of the second silicide layer 16-2 corresponds in plane view to the outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. The inside bottom edge E2 of the second silicide layer 16-2 is most close to the second interface J2 of the body portion 5 to the drain region 9. In the points on the second interface J2 of the body portion 5 to the drain region 9, a point of a level, which is lower than the inside bottom edge E2 of the second silicide layer 16-2 and higher than the bottom level of the body portion 5, is most close to the inside bottom edge E2 of the second silicide layer 16-2. A distance between the inside bottom edge E2 of the second silicide layer 16-2 and the point on the second interface J2 of the body portion 5 is defined as the second distance S2 between the inside edge portion of the second silicide layer 16-2 and the second interface J2 of the body portion 5 to the drain region 9. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Therefore, the first distance between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5.

With reference to FIG. 10E, the inter-layer insulator 11 is entirely formed over the field oxide films 4, the first and second silicide layers 16-1 and 16-2 and the other silicide layer over the gate electrode 7 as well as over the side wall insulation films 8-1 and 8-2. The contact holes 12 are formed in the inter-layer insulator 11 so that the contact holes 12 are positioned over the first and second silicide layers 16-1 and 16-2 of the source and drain regions 10 and 9. Contact layers are formed in the contact holes 12 so that the contact layers are made into contact with the first and second silicide layers 16-1 and 16-2 of the source and drain regions 10 and 9. Interconnections 13 are then formed over the inter-layer insulator 11 and connected with the contact layers so that the interconnections 13 are electrically connected to the first and second silicide layers 16-1 and 16-2 of the source and drain regions 10 and 9.

Figure 10:
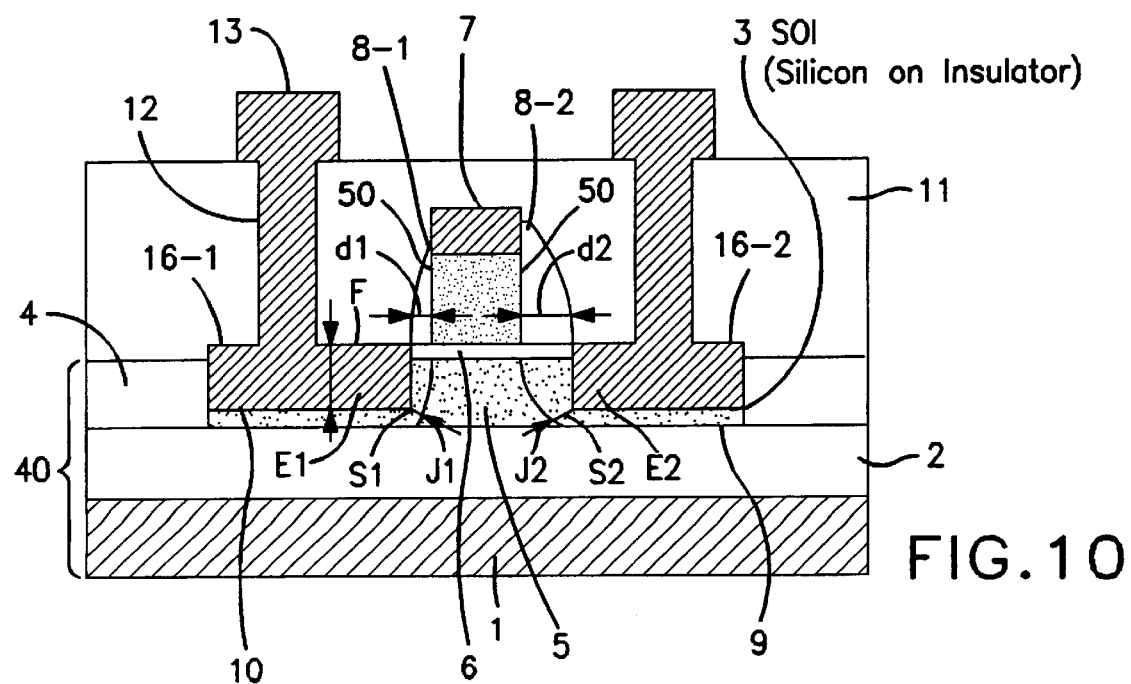
FIG. 10 is a fragmentary cross sectional elevation view illustrative of a novel SOI-MOS field effect transistor with an improved source and drain structure in a third embodiment in accordance with the present invention.

Third Embodiment:

A third embodiment according to the present invention will be described in detail with reference to FIG. 10. A third embodiment according to the present invention will be described in detail with reference to FIG. 10 which illustrates a novel SOI-MOS field effect transistor with an improved source/drain structure. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has n$^+$-type source/drain regions 10 and 9 and a p-type body portion 5 between the n$^+$-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. A first side wall oxide film 8-1 is also provided on a side wall of the gate electrode 7 in the source side and over the gate oxide film 6. The first side wall oxide film 8-1 has a first thickness d1 which may, for example, be in the range of 200–300 angstroms. A second side wall oxide film 8-2 is also provided on a side wall of the gate electrode 7 in the drain side and over the gate oxide film 6. The second side wall oxide film 8-2 has a second thickness d2 which is larger than the first thickness d1 of the first side wall oxide film 8-1. The second thickness d2 of the second side wall oxide film 8-2 may, for example, be about 1000 angstroms. The gate electrode 7 has an upper region which comprises a silicide layer. The silicide layer may preferably be made of a refractory metal silicide which is selected from titanium silicide, cobalt silicide, nickel silicide, and tungsten silicide.

A first silicide layer 16-1 is further formed in the source region 10 except in the bottom portion and in the vicinity of the body portion 5 and under the first side wall oxide film 8-1. The first silicide layer 16-1 may have a thickness which is just smaller than the thickness of the source region 10. Namely, the first silicide layer 16-1 is deeply formed in the source region 10. The first silicide layer 16-1 may preferably be made of a refractory metal silicide which is selected from titanium silicide, cobalt silicide, nickel silicide, and tungsten silicide. An inside edge of the first silicide layer 16-1 is positioned inside in plane view of an outside edge of the first side wall oxide film 8-1. On the level of the surface of the silicon-on-insulator layer 3, the inside edge of the first silicide layer 16-1 is distanced in a lateral direction from the body portion 5 by a distance smaller than the first thickness d1 of the first side wall oxide film 8-1. The body portion 5 increases in width downwardly but gradually as illustrated in FIG. 10. An inside bottom edge E1 of the first silicide layer 16-1 is securely in contact with a first interface J1 of the body portion 5 to the source region 10. In the points on the first interface J1 of the body portion 5 to the source region 10, the outside bottom edge of the body portion 5 is most close to the inside bottom edge E1 of the first silicide layer 16-1.

A second silicide layer 16-2 is further formed in the drain region 9 except in the bottom portion and in the vicinity of the body portion 5 and under the second side wall oxide film 8-2. The second silicide layer 16-2 may preferably be made of a refractory metal silicide which is selected from titanium silicide, cobalt silicide, nickel silicide, and tungsten silicide. An inside edge of the second silicide layer 16-2 corresponds in plane view to an outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. An inside bottom edge E2 of the second silicide layer 16-2 is most close to a second interface J2 of the body portion 5 to the drain region 9. In the points on the second interface J2 of the body portion5 to the drain region 9, a point of a level, which is lower than the inside bottom edge E2 of the second silicide layer 16-2 and just higher than the bottom level of the body portion 5, is most close to the inside bottom edge E2 of the second silicide layer 16-2. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the zero distance of the inside edge of the first silicide layer 16-1 from the body portion 5.

Further, the first silicide layer 16-1 of the source region 10 is deeply formed so that the inside bottom edge of the first silicide layer 16-1 is in contact with the first interface J1 of the body portion to the source region 10, whilst the second silicide layer 16-2 of the drain region 9 is also deeply formed however so that the second silicide layer 16-2 is distanced from the second interface of the body portion 5 to the drain region 9. This results in that the body portion 5 has a potential which is pinned or fixed at the same potential level as the source region 10. The first distance of the inside bottom edge of the first silicide layer 16-1 of the source region 10 from the first interface J1 of the body portion 5 to the source region 10 is zero and much shorter than the second distance of the inside bottom edge of the second silicide layer 16-2 of the drain region 9 from the second interface J2 of the body portion 5 to the drain region 9.

Therefore, the first distance between the inside bottom edge E1 of the first silicide layer 16-1 and the point on the first interface J1 of the body portion 5 is zero and much shorter than the second distance between the inside bottom edge E2 of the second silicide layer 16-2 and the point on the second interface J2 of the body portion 5.

An inter-layer insulator 11 is further provided over the field oxide films 4, the first and second silicide layers 16-1 and 16-2 and the gate electrode 7 as well as over the first and second side wall oxide films 8-1 and 8-2. Contact holes 12 are formed in the inter-layer insulator 11 so that the contact holes 12 are positioned over the first and second silicide layers 16-1 and 16-2 over the source and drain regions 10 and 9 respectively. Contact layers are formed in the contact holes 12 so that the contact layers are in contact with the first and second silicide layers 16-1 and 16-2 of the source and drain regions 10 and 9 respectively. Metal interconnections 13 are provided which are connected to the contact layers so that the metal interconnections 13 are electrically connected to the source/drain regions 10 and 9.

The provision is, therefore, made of the first silicide layer 16-1 in the source region 10 deeply so that the inside edge portion of the first silicide layer 16-1 is in contact with the first interface J1 between the source region 10 and the body portion 5, thereby to greatly shorten the first distance between the first silicide layer 16-1 and the body portion 5. Therefore, the first distance between the inside bottom edge E1 of the first silicide layer 16-1 and the point on the first interface J1 of the body portion 5 is zero and much shorter than the second distance between the inside bottom edge E2 of the second silicide layer 16-2 and the point on the second interface J2 of the body portion 5. The life-time of the holes injected from the first interface J1 of the body portion 5 into the source region 10 until the recombination of the injected holes with electrons is defined by the first distance of the inside bottom edge E1 of the first silicide layer 16-1 from the first interface J1 between the source region 10 and the body portion 5. For this reason, the great shortening of the first distance of the inside bottom edge E1 of the first silicide layer 16-1 from the first interface J1 between the source region 10 and the body portion 5 does result in great shortening of the life-time of the holes injected from the first interface J1 of the body portion 5 into the source region 10 until the recombination of the injected holes with electrons. The current amplification factor of the parasitic bipolar transistor caused in the silicon-on-insulator layer is defined by the life-time of the holes injected from the first interface J1 of the body portion 5 into the source region 10 until the recombination of the injected holes with electrons. Therefore, the great shortening of the life-time of the holes injected from the first interface J1 of the body portion 5 into the source region 10 until the recombination of the injected holes with electrons does result in a remarkable reduction in the current amplification factor of the parasitic bipolar transistor. The remarkable reduction in current amplification factor of the parasitic bipolar transistor suppresses the parasitic bipolar effect of the SOI-MOS field effect transistor.

In order to reduce the parasitic resistances of the shallow source region 10 including the first silicide layer 16-1 and also to suppress the parasitic bipolar effect of the SOI-MOS field effect transistor, it is effective to form the first silicide layer 16-1 deeply in the source region 10 and the inside bottom edge E1 of the first silicide layer 16-1 is in contact with the first interface J1 of the body portion 5 to the source region 10, so that a large leakage of current between the body portion 5 and the source region 10 is allowed, and further so that the life-time of the holes injected from the first interface J1 of the body portion 5 into the source region 10 until the recombination of the injected holes with electrons is greatly shortened, whereby the current amplification factor of the parasitic bipolar transistor is well suppressed and the parasitic bipolar effect of the SOI-MOS field effect transistor is thus well suppressed. The provision of the first silicide layer 16-1 in the source region 10 and in contact with the first interface J1 of the body portion 5 to the source region 10 renders the SOI-MOS field effect transistor free from the kink effect.

On the other hand, the drain region 9 has the second silicide layer 16-2 which has the inside bottom edge E2 sufficiently distanced from the second interface J2 of the body portion 5 to the drain region 9. The drain region 9 including the second silicide layer 16-2 is applied with the drain voltage which is usually a high voltage. Further, the second distance S2 of the inside bottom edge E2 of the second silicide layer 16-2 from the point of the second interface J2 between the drain region 9 and the body portion 5 is long. The provision of the second silicide layer 16-2 in the drain region 9, so that the inside bottom edge E2 of the second silicide layer 16-2 is sufficiently distanced from the second interface J2 between the drain region 9 and the body portion 5, does result in substantially no or sufficiently small leakage of current between the drain region 9 and the body portion 5. This substantially no or sufficiently small leakage of current between the drain region 9 and the body portion 5 causes substantially no or sufficiently small OFF current of the SOI-MOS field effect transistor under zero gate voltage application, resulting in a remarkable decrease in power consumption of the SOI-MOS field effect transistor. The provisions of the first and second silicide layers 16-1 and 16-2 in the source and drain regions 10 and 9 respectively do reduce in resistance of the source and drain regions 10 and 9 as well as do allow a reduction in parasitic resistance by the shallow p-n junctions of the source and drain regions 10 and 9.

Accordingly, the above improved source/drain structure, such that the first distance of the inside bottom edge E1 of the first silicide layer 16-1 from the first interface J1 between the source region 10 and the body portion 5 is zero and shorter than the second distance of the inside bottom edge E2 of the second silicide layer 16-2 from the second interface J2 between the drain region 9 and the body portion 5, do render the SOI-MOS field effect transistor free from all of the above problems as having been engaged with the first, second and third conventional SOI-MOS field effect transistors and also do provide the following advantages.

The above improved source/drain structure is capable of reducing source/drain parasitic resistance of the SOI-MOS field effect transistor.

The above improved source/drain structure is capable of fixing the potential of the body portion 5 at the same potential level as the source region 10.

The above improved source/drain structure also allows a reduction in thickness of the silicon-on-insulator layer 3.

The above improved source/drain structure also allows shallow p-n junctions of the source and drain regions 10 and 9.

The above improved source/drain structure is also capable of reducing the resistance of the drain region 9.

The above improved source/drain structure is also capable of suppressing the leakage of current between the body portion 5 and the drain region 9 applied with a high drain voltage.

The above improved source/drain structure is also capable of reducing the OFF current under zero gate voltage application.

The above improved source/drain structure is also capable of reducing a power consumption of the SOI-MOS field effect transistor.

The above improved source/drain structure also allows a leakage of current between the source region 10 and the body portion 5.

The above improved source/drain structure is also capable of suppressing an excess potential rising of the body portion 5.

The above improved source/drain structure is also capable of suppressing a parasitic bipolar effect of the SOI-MOS field effect transistor.

The above improved source/drain structure also enables the SOI-MOS field effect transistor to be free from kink effect in sub-threshold characteristic which can be understood from FIG. 16 being illustrative of sub-threshold characteristics (Id-Vg characteristics) or current-voltage characteristics of the above novel SOI-MOS field effect transistor when applied with drain voltages of 1.5 V and 0.05 V.

The above improved source/drain structure is also capable of reduction in current amplification factor of a parasitic bipolar effect of the SOI-MOS field effect transistor.

The above improved source/drain structure is also capable of shortening a life-time of holes injected from the first interface J1 of the body portion 5 to the source region 10 until recombination thereof with electrons.

The above present invention of the first embodiment may be applicable to a p-channel SOI-MOS field effect transistor.

The following descriptions will highlight fabrication processes for the above n-channel SOI-MOS field effect transistor.

Figure 11A:
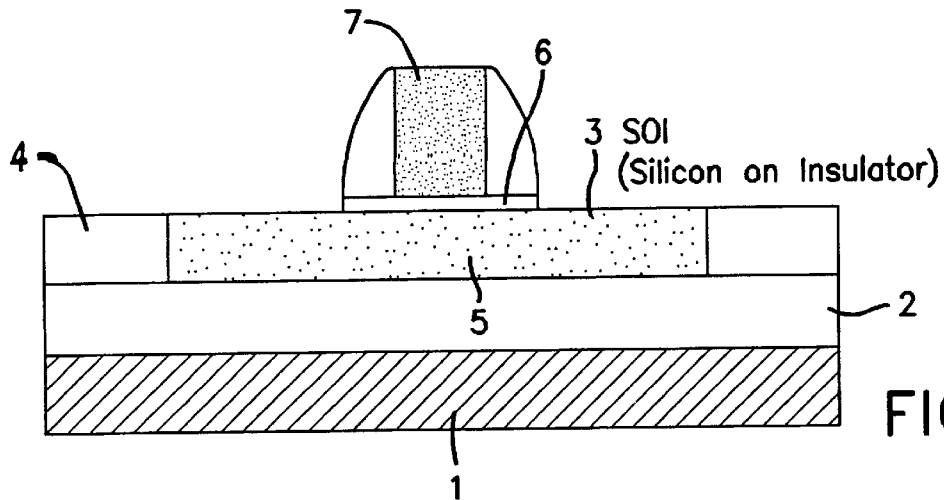
FIGS. 11A through 11E are fragmentary cross sectional elevation views illustrative of a novel SOI-MOS field effect transistor with an improved source and drain structure in sequential fabrication processes involved in a method of forming the novel SOI-MOS field effect transistor in a third embodiment in accordance with the present invention.

With reference to FIG. 11A, the buried oxide film 2 is formed over the silicon substrate 1. The silicon-on-insulator layer 3 of silicon is formed over the buried oxide film 2 so that an SOI-substrate is formed. The field oxide films 4 are selectively formed over the buried oxide film 2 so that the field oxide films 4 define the silicon-on-insulator layer 3. An ion-implantation of p-type impurity such as boron into at least a center region on which the body portion 5 will be formed in later process so that at least the center region of the silicon-on-insulator layer 3 for formation of the body portion 5 is controlled in threshold voltage. The gate oxide film 6 is formed over the center region of the silicon-on-insulator layer 3 for formation of the body portion. The gate electrode 7 made of polysilicon is then formed over the gate oxide film 6. It is optionally possible to carry out an ion-implantation of n-type impurity such as phosphorus or arsenic into the p-type body portion 5 to form lightly doped drain regions which are even not illustrated.

Figure 11B:
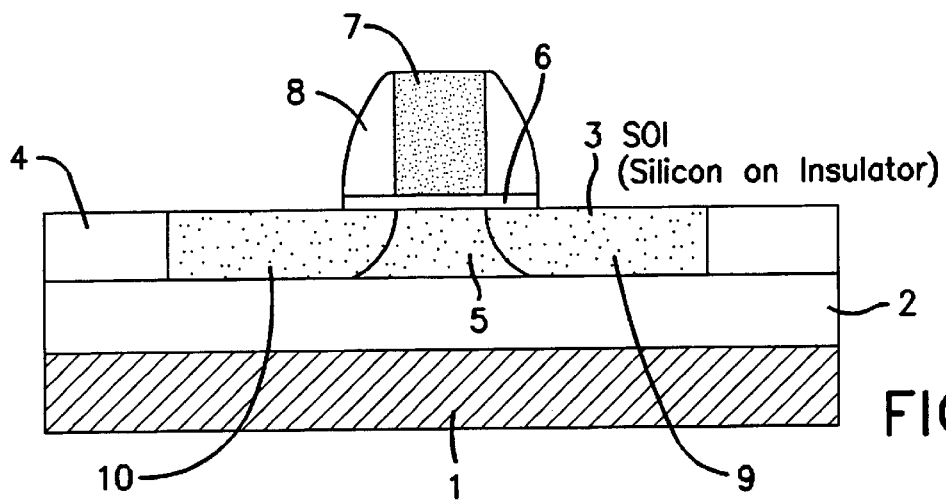

With reference to FIG. 11B, an insulation film 8 is entirely deposited which extends over the field oxide films 4, the silicon-on-insulator layer 3 and the gate electrode 7 before the insulation film 8 is then subjected to an anisotropic etching to leave the insulation film 8 only on the opposite side walls of the gate electrode 7 and over the gate oxide film 6 whereby the side wall insulation films 8 are formed on the opposite side walls of the gate electrode 7 and over the gate oxide film 6. The n$^+$-type source and drain regions 10 and 9 are formed in the silicon-on-insulator layer 3 so that the n$^+$-type source and drain regions 10 and 9 are separated by the p-type body portion 5, whereby the body portion 5 is defined between the source and drain regions 10 and 9. The body portion 5 increases in width downwardly wherein the top portion of the body portion 5 has almost the same width as the gate electrode 7 whilst the bottom portion of the body portion 5 is wider than the top portion thereof.

Figure 11C:
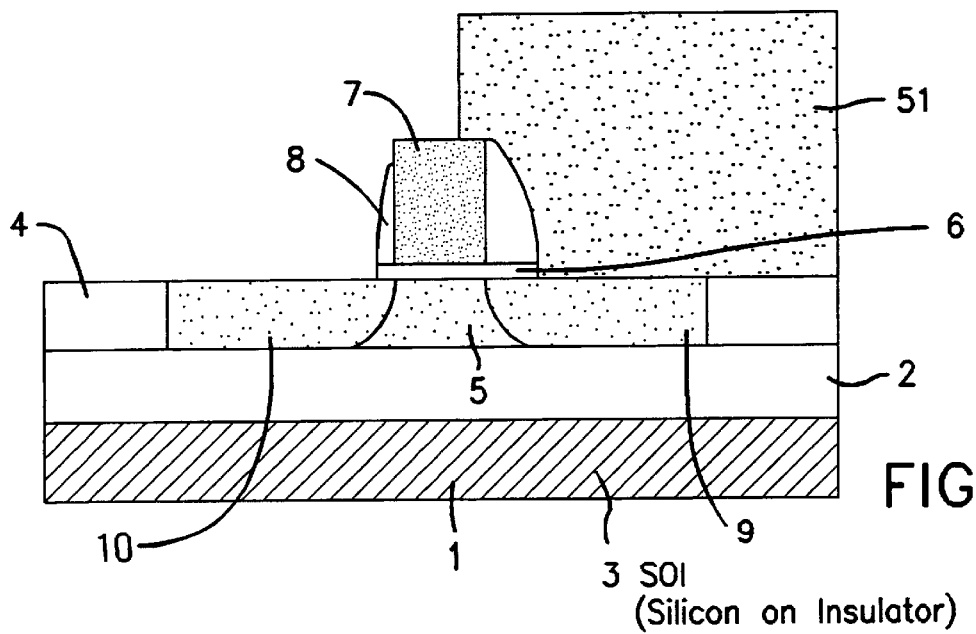

With reference to FIG. 11C, a photo-resist film 51 is selectively formed which covers the drain region 9, the side wall insulation film 8 of the drain side and the drain side portion of the gate electrode 7. The side wall insulation film 8 in the source side and the gate oxide film in the source side are etched by use of the above photo-resist film 51 as a mask, whereby the thickness of the side wall insulation film 8 in the source side is reduced.

Figure 11D:
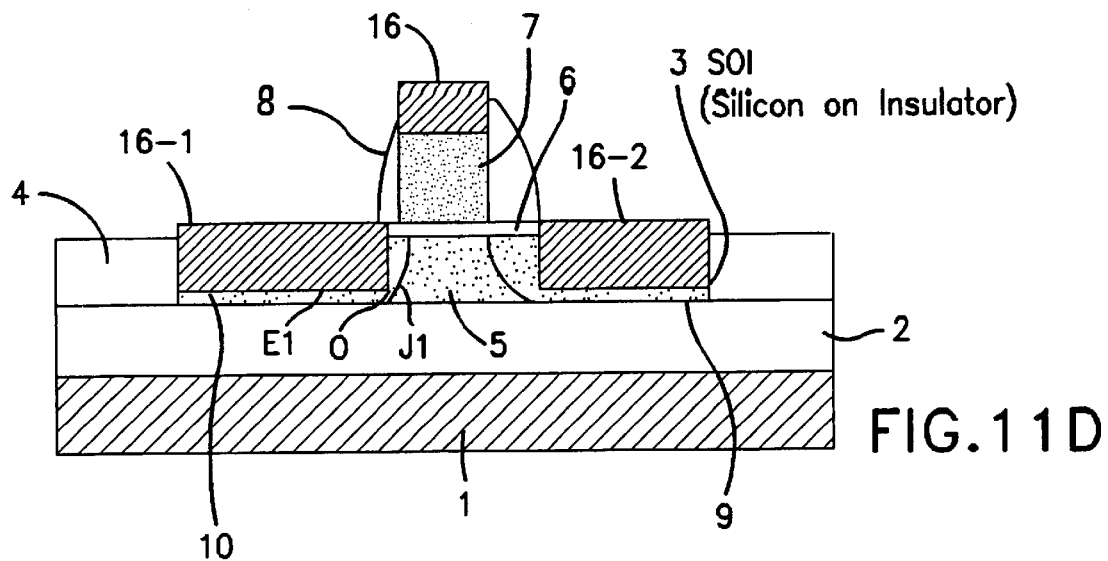

With reference to FIG. 11D, a refractory metal layer made of, for example, titanium or cobalt is entirely deposited over the source and drain regions 10 and 9, the field oxide films 4 and the gate electrode 7 as well as the side wall insulation films 8 by sputtering a refractory metal target. The refractory metal layer is thick. A heat treatment is carried out to cause a silicidation reaction of the refractory metal with silicon thereby to selectively form the first and second silicide layers 16-1 and 16-2 in the source and drain regions 10 and 9 respectively as well as form another silicide layer 16 over the gate electrode 7 which is made of polysilicon. The first silicide layer 16-1 is formed in the source region 10 except in the bottom portion and in the vicinity of the body portion 5 and under the first side wall oxide film 8-1. The second silicide layer 16-2 is also formed in the drain region 10 except in the bottom portion and in the vicinity of the body portion 5 and under the second side wall oxide film 8-2. As a result, an unreacted refractory metal layer remains over the side wall insulation films 8 and the field oxide films 4. The unreacted refractory metal layer is then removed. The first and second silicide layers 16-1 and 16-2 are self-aligned by the gate electrode 7 and the first and second side wall insulation films 8-1 and 8-2 which differ in thickness from each other as described above.

The inside edge of the first silicide layer 16-1 is positioned just inside in plane view of the outside edge of the first side wall oxide film 8-1. On the level of the surface of the silicon-on-insulator layer 3, the inside edge of the first silicide layer 16-1 is distanced in a lateral direction from the body portion 5 by a distance just smaller the first thickness d1 of the first side wall oxide film 8-1. The inside bottom edge E1 of the first silicide layer 16-1 is in contact with the first interface J1 of the body portion 5 to the source region 10. In the points on the first interface J1 of the body portion 5 to the source region 10, the outside bottom edge of the body portion 5 is in contact with the inside bottom edge E1 of the first silicide layer 16-1.

The inside edge of the second silicide layer 16-2 corresponds in plane view to the outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. The inside bottom edge E2 of the second silicide layer 16-2 is most close to the second interface J2 of the body portion 5 to the drain region 9. In the points on the second interface J2 of the body portions to the drain region 9, a point of a level, which is lower than the inside bottom edge E2 of the second silicide layer 16-2 and higher than the bottom level of the body portion 5, is most close to the inside bottom edge E2 of the second silicide layer 16-2. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Therefore, the first distance between the inside bottom edge E1 of the first silicide layer 16-1 and the point on the first interface J1 of the body portion 5 is zero and shorter than the second distance between the inside bottom edge E2 of the second silicide layer 16-2 and the point on the second interface J2 of the body portion 5.

Figure 11E:
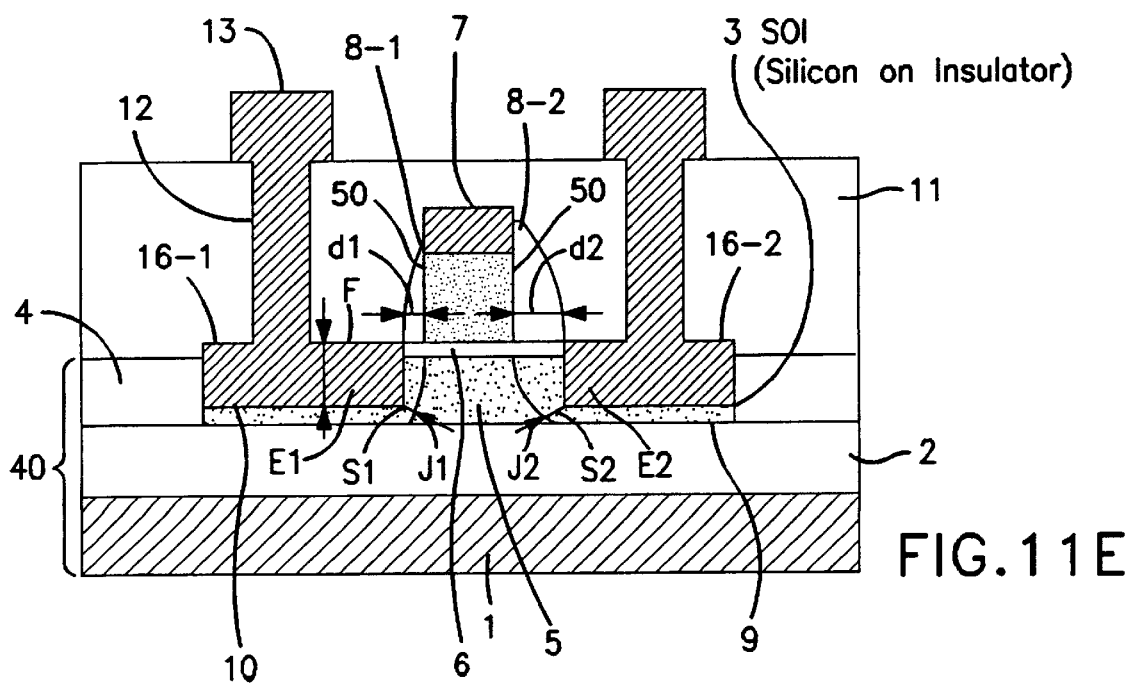

With reference to FIG. 11E, the inter-layer insulator 11 is entirely formed over the field oxide films 4, the first and second silicide layers 16-1 and 16-2 and the other silicide layer over the gate electrode 7 as well as over the side wall insulation films 8-1 and 8-2. The contact holes 12 are formed in the inter-layer insulator 11 so that the contact holes 12 are positioned over the first and second silicide layers 16-1 and 16-2 of the source and drain regions 10 and 9. Contact layers are formed in the contact holes 12 so that the contact layers are made into contact with the first and second silicide layers 16-1 and 16-2 of the source and drain regions 10 and 9. Interconnections 13 are then formed over the inter-layer insulator 11 and connected with the contact layers so that the interconnections 13 are electrically connected to the first and second silicide layers 16-1 and 16-2 of the source and drain regions 10 and 9.

Figure 12:
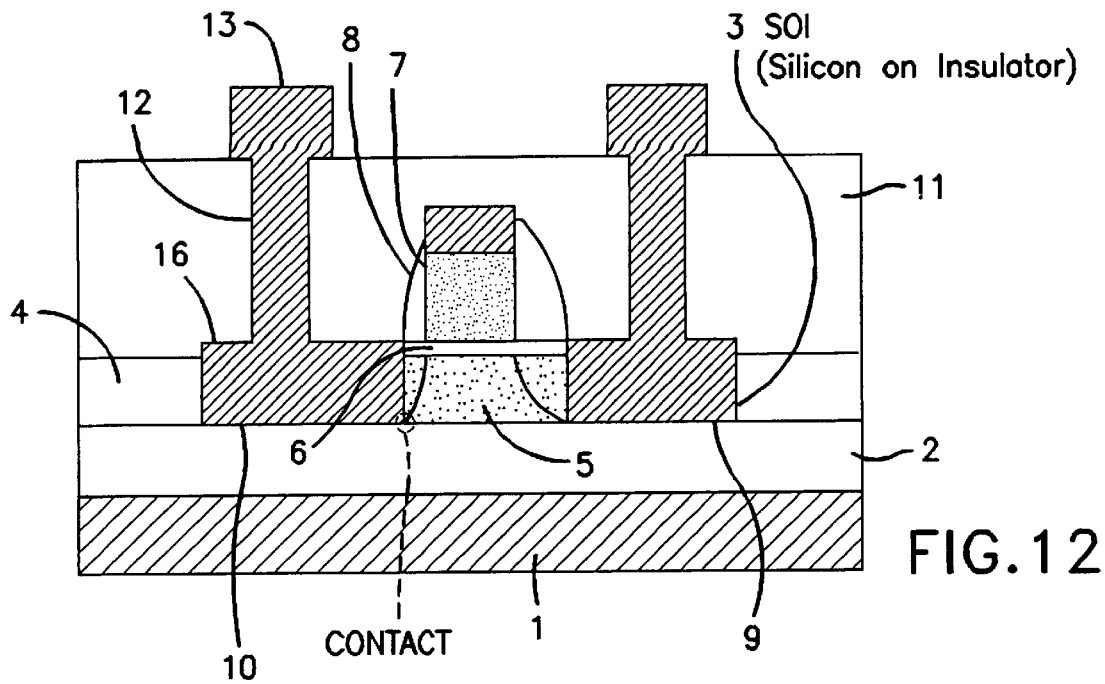
FIG. 12 is a fragmentary cross sectional elevation view illustrative of a novel SOI-MOS field effect transistor with an improved source and drain structure in a fourth embodiment in accordance with the present invention.

Fourth Embodiment:

A fourth embodiment according to the present invention will be described in detail with reference to FIG. 12. A fourth embodiment according to the present invention will be described in detail with reference to FIG. 12 which illustrates a novel SOI-MOS field effect transistor with an improved source/drain structure. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has n$^+$-type source/drain regions 10 and 9 and a p-type body portion 5 between the n$^+$-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. A first side wall oxide film 8-1 is also provided on a side wall of the gate electrode 7 in the source side and over the gate oxide film 6. The first side wall oxide film 8-1 has a first thickness d1 which may, for example, be in the range of 200–300 angstroms. A second side wall oxide film 8-2 is also provided on a side wall of the gate electrode 7 in the drain side and over the gate oxide film 6. The second side wall oxide film 8-2 has a second thickness d2 which is larger than the first thickness d1 of the first side wall oxide film 8-1. The second thickness d2 of the second side wall oxide film 8-2 may, for example, be about 1000 angstroms. The gate electrode 7 has an upper region which comprises a silicide layer. The silicide layer may preferably be made of a refractory metal silicide which is selected from titanium silicide, cobalt silicide, nickel silicide, and tungsten silicide.

A first silicide layer 16-1 is further formed in the source region 10 from the top portion to the bottom portion and except in the vicinity of the body portion 5 and under the first side wall oxide film 8-1. The first silicide layer 16-1 may have the same thickness as the thickness of the source region 10. Namely, the first silicide layer 16-1 is deeply and entirely formed in the source region 10. The first silicide layer 16-1 may preferably be made of a refractory metal silicide which is selected from titanium silicide, cobalt silicide, nickel silicide, and tungsten silicide. An inside edge of the first silicide layer 16-1 is positioned inside in plane view of an outside edge of the first side wall oxide film 8-1. On the level of the surface of the silicon-on-insulator layer 3, the inside edge of the first silicide layer 16-1 is distanced in a lateral direction from the body portion 5 by a distance smaller than the first thickness d1 of the first side wall oxide film 8-1. The body portion 5 increases in width downwardly but gradually as illustrated in FIG. 10. An inside bottom edge E1 of the first silicide layer 16-1 is securely in contact with a first interface J1 of the body portion 5 to the source region 10. In the points on the first interface J1 of the body portion 5 to the source region 10, the outside bottom edge of the body portion 5 is in contact with the inside bottom edge E1 of the first silicide layer 16-1.

A second silicide layer 16-2 is further formed in the drain region 9 from the top portion to the bottom portion and except in the vicinity of the body portion 5 and under the second side wall oxide film 8-2. The second silicide layer 16-2 has the same thickness as the drain region 9. The second silicide layer 16-2 may preferably be made of a refractory metal silicide which is selected from titanium silicide, cobalt silicide, nickel silicide, and tungsten silicide. An inside edge of the second silicide layer 16-2 corresponds in plane view to an outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. An inside bottom edge E2 of the second silicide layer 16-2 is most close to a second interface J2 of the body portion 5 to the drain region 9. In the points on the second interface J2 of the body portion 5 to the drain region 9, the outside bottom edge of the body portion 5 is most close to the inside bottom edge E2 of the second silicide layer 16-2. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the zero distance of the inside edge of the first silicide layer 16-1 from the body portion 5.

Further, the first silicide layer 16-1 of the source region 10 is deeply formed up to the bottom level of the source region 10 so that the inside bottom edge of the first silicide layer 16-1 is in contact with the first interface J1 of the body portion to the source region 10, whilst the second silicide layer 16-2 of the drain region 9 is also deeply formed however so that the second silicide layer 16-2 is distanced from the second interface J2 of the body portion 5 to the drain region 9. This results in that the body portion 5 has a potential which is pinned or fixed at the same potential level as the source region 10. The first distance of the inside bottom edge of the first silicide layer 16-1 of the source region 10 from the first interface J1 of the body portion 5 to the source region 10 is zero and much shorter than the second distance of the inside bottom edge of the second silicide layer 16-2 of the drain region 9 from the second interface J2 of the body portion 5 to the drain region 9.

Therefore, the first distance between the inside bottom edge E1 of the first silicide layer 16-1 and the point on the first interface J1 of the body portion 5 is zero and much shorter than the second distance between the inside bottom edge E2 of the second silicide layer 16-2 and the point on the second interface J2 of the body portion 5.

An inter-layer insulator 11 is further provided over the field oxide films 4, the first and second silicide layers 16-1 and 16-2 and the gate electrode 7 as well as over the first and second side wall oxide films 8-1 and 8-2. Contact holes 12 are formed in the inter-layer insulator 11 so that the contact holes 12 are positioned over the first and second silicide layers 16-1 and 16-2 over the source and drain regions 10 and 9 respectively. Contact layers are formed in the contact holes 12 so that the contact layers are in contact with the first and second silicide layers 16-1 and 16-2 of the source and drain regions 10 and 9 respectively. Metal interconnections 13 are provided which are connected to the contact layers so that the metal interconnections 13 are electrically connected to the source/drain regions 10 and 9.

The provision is, therefore, made of the first silicide layer 16-1 in the source region 10 deeply so that the inside edge portion of the first silicide layer 16-1 is in contact with the first interface J1 between the source region 10 and the body portion 5, thereby to greatly shorten the first distance between the first silicide layer 16-1 and the body portion 5. Therefore, the first distance between the inside bottom edge E1 of the first silicide layer 16-1 and the bottom point on the first interface J1 of the body portion 5 is zero and much shorter than the second distance between the inside bottom edge E2 of the second silicide layer 16-2 and the point on the second interface J2 of the body portion 5. The life-time of the holes injected from the first interface J1 of the body portion 5 into the source region 10 until the recombination of the injected holes with electrons is defined by the first distance of the inside bottom edge E1 of the first silicide layer 16-1 from the first interface J1 between the source region 10 and the body portion 5. For this reason, the great shortening of the first distance of the inside bottom edge E1 of the first silicide layer 16-1 from the first interface J1 between the source region 10 and the body portion 5 does result in great shortening of the life-time of the holes injected from the first interface J1 of the body portion 5 into the source region 10 until the recombination of the injected holes with electrons. The current amplification factor of the parasitic bipolar transistor caused in the silicon-on-insulator layer is defined by the life-time of the holes injected from the first interface J1 of the body portion 5 into the source region 10 until the recombination of the injected holes with electrons. Therefore, the great shortening of the life-time of the holes injected from the first interface J1 of the body portion 5 into the source region 10 until the recombination of the injected holes with electrons does result in a remarkable reduction in the current amplification factor of the parasitic bipolar transistor. The remarkable reduction in current amplification factor of the parasitic bipolar transistor suppresses the parasitic bipolar effect of the SOI-MOS field effect transistor.

In order to reduce the parasitic resistances of the shallow source region 10 including the first silicide layer 16-1 and also to suppress the parasitic bipolar effect of the SOI-MOS field effect transistor, it is effective to form the first silicide layer 16-1 deeply in the source region 10 and the inside bottom edge E1 of the first silicide layer 16-1 is in contact with the first interface J1 of the body portion 5 to the source region 10, so that a large leakage of current between the body portion 5 and the source region 10 is allowed, and further so that the life-time of the holes injected from the first interface J1 of the body portion 5 into the source region 10 until the recombination of the injected holes with electrons is greatly shortened, whereby the current amplification factor of the parasitic bipolar transistor is well suppressed and the parasitic bipolar effect of the SOI-MOS field effect transistor is thus well suppressed. The provision of the first silicide layer 16-1 in the source region 10 and in contact with the first interface J1 of the body portion 5 to the source region 10 renders the SOI-MOS field effect transistor free from the kink effect.

On the other hand, the drain region 9 has the second silicide layer 16-2 which has the inside bottom edge E2 sufficiently distanced from the second interface J2 of the body portion 5 to the drain region 9. The drain region 9 including the second silicide layer 16-2 is applied with the drain voltage which is usually a high voltage. Further, the second distance S2 of the inside bottom edge E2 of the second silicide layer 16-2 from the point of the second interface J2 between the drain region 9 and the body portion 5 is long. The provision of the second silicide layer 16-2 in the drain region 9, so that the inside bottom edge E2 of the second silicide layer 16-2 is sufficiently distanced from the second interface J2 between the drain region 9 and the body portion 5, does result in substantially no or sufficiently small leakage of current between the drain region 9 and the body portion 5. This substantially no or sufficiently small leakage of current between the drain region 9 and the body portion 5 causes substantially no or sufficiently small OFF current of the SOI-MOS field effect transistor under zero gate voltage application, resulting in a remarkable decrease in power consumption of the SOI-MOS field effect transistor. The provisions of the first and second silicide layers 16-1 and 16-2 on the source and drain regions 10 and 9 respectively do reduce in resistance of the source and drain regions 10 and 9 as well as do allow a reduction in parasitic resistance by the shallow p-n junctions of the source and drain regions 10 and 9.

Accordingly, the above improved source/drain structure, such that the first distance of the inside bottom edge E1 of the first silicide layer 16-1 from the first interface J1 between the source region 10 and the body portion 5 is zero and shorter than the second distance of the inside bottom edge E2 of the second silicide layer 16-2 from the second interface J2 between the drain region 9 and the body portion 5, do render the SOI-MOS field effect transistor free from all of the above problems as having been engaged with the first, second and third conventional SOI-MOS field effect transistors and also do provide the following advantages.

The above improved source/drain structure is capable of reducing source/drain parasitic resistance of the SOI-MOS field effect transistor.

The above improved source/drain structure is capable of fixing the potential of the body portion 5 at the same potential level as the source region 10.

The above improved source/drain structure also allows a reduction in thickness of the silicon-on-insulator layer 3.

The above improved source/drain structure also allows shallow p-n junctions of the source and drain regions 10 and 9.

The above improved source/drain structure is also capable of reducing the resistance of the drain region 9.

The above improved source/drain structure is also capable of suppressing the leakage of current between the body portion 5 and the drain region 9 applied with a high drain voltage.

The above improved source/drain structure is also capable of reducing the OFF current under zero gate voltage application.

The above improved source/drain structure is also capable of reducing a power consumption of the SOI-MOS field effect transistor.

The above improved source/drain structure also allows a leakage of current between the source region 10 and the body portion 5.

The above improved source/drain structure is also capable of suppressing an excess potential rising of the body portion 5.

The above improved source/drain structure is also capable of suppressing a parasitic bipolar effect of the SOI-MOS field effect transistor.

The above improved source/drain structure also enables the SOI-MOS field effect transistor to be free from kink effect in sub-threshold characteristic which can be understood from FIG. 16 being illustrative of sub-threshold characteristics (Id-Vg characteristics) or current-voltage characteristics of the above novel SOI-MOS field effect transistor when applied with drain voltages of 1.5 V and 0.05 V.

The above improved source/drain structure is also capable of reduction in current amplification factor of a parasitic bipolar effect of the SOI-MOS field effect transistor.

The above improved source/drain structure is also capable of shortening a life-time of holes injected from the first interface J1 of the body portion 5 to the source region 10 until recombination thereof with electrons.

The above present invention of the first embodiment may be applicable to a p-channel SOI-MOS field effect transistor.

The following descriptions will highlight fabrication processes for the above n-channel SOI-MOS field effect transistor.

Figure 13A:
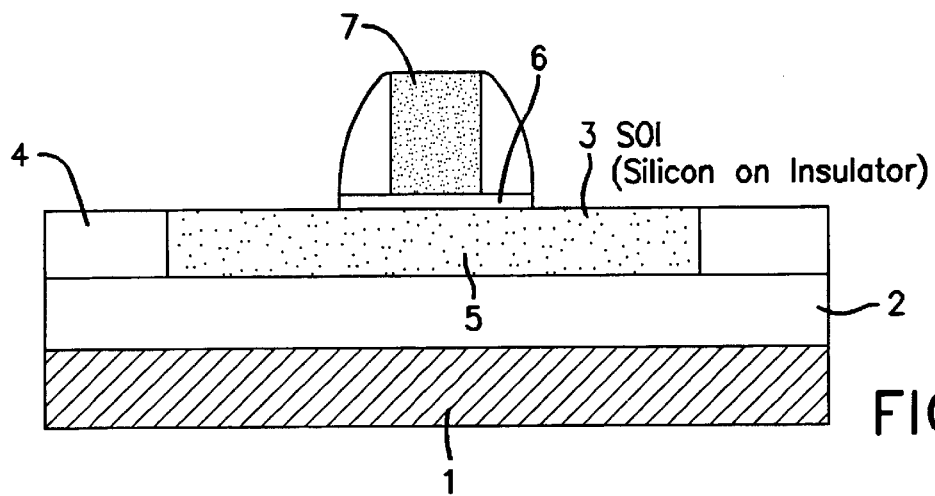
FIGS. 13A through 13E are fragmentary cross sectional elevation views illustrative of a novel SOI-MOS field effect transistor with an improved source and drain structure in sequential fabrication processes involved in a method of forming the novel SOI-MOS field effect transistor in a fourth embodiment in accordance with the present invention.

With reference to FIG. 13A, the buried oxide film 2 is formed over the silicon substrate 1. The silicon-on-insulator layer 3 of silicon is formed over the buried oxide film 2 so that an SOI-substrate is formed. The field oxide films 4 are selectively formed over the buried oxide film 2 so that the field oxide films 4 define the silicon-on-insulator layer 3. An ion-implantation of p-type impurity such as boron into at least a center region on which the body portion 5 will be formed in later process so that at least the center region of the silicon-on-insulator layer 3 for formation of the body portion 5 is controlled in threshold voltage. The gate oxide film 6 is formed over the center region of the silicon-on-insulator layer 3 for formation of the body portion. The gate electrode 7 made of polysilicon is then formed over the gate oxide film 6. It is optionally possible to carry out an ion-implantation of n-type impurity such as phosphorus or arsenic into the p-type body portion 5 to form lightly doped drain regions which are even not illustrated.

Figure 13B:
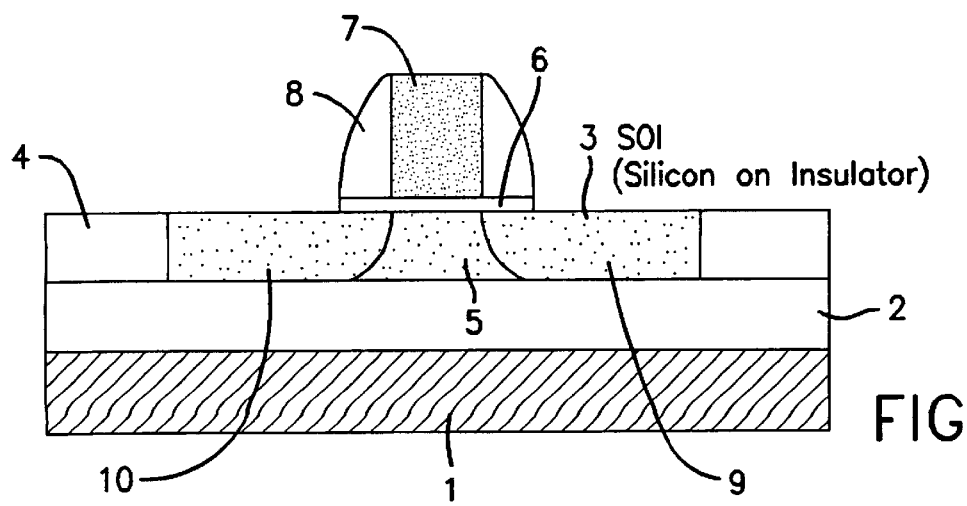

With reference to FIG. 13B, an insulation film 8 is entirely deposited which extends over the field oxide films 4, the silicon-on-insulator layer 3 and the gate electrode 7 before the insulation film 8 is then subjected to an anisotropic etching to leave the insulation film 8 only on the opposite side walls of the gate electrode 7 and over the gate oxide film 6 whereby the side wall insulation films 8 are formed on the opposite side walls of the gate electrode 7 and over the gate oxide film 6. The $n^+$-type source and drain regions 10 and 9 are formed in the silicon-on-insulator layer 3 so that the $n^+$-type source and drain regions 10 and 9 are separated by the p-type body portion 5, whereby the body portion 5 is defined between the source and drain regions 10 and 9. The body portion 5 increases in width downwardly wherein the top portion of the body portion 5 has almost the same width as the gate electrode 7 whilst the bottom portion of the body portion 5 is wider than the top portion thereof.

Figure 13C:
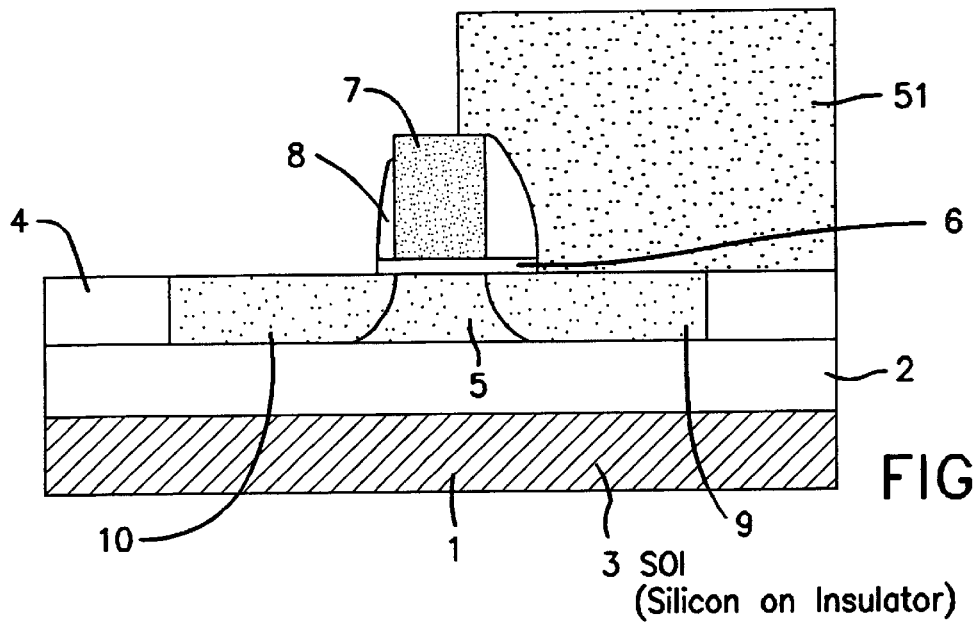

With reference to FIG. 13C, a photo-resist film 51 is selectively formed which covers the drain region 9, the side wall insulation film 8 of the drain side and the drain side portion of the gate electrode 7. The side wall insulation film 8 in the source side and the gate oxide film in the source side are etched by use of the above photo-resist film 51 as a mask, whereby the thickness of the side wall insulation film 8 in the source side is reduced.

Figure 13D:
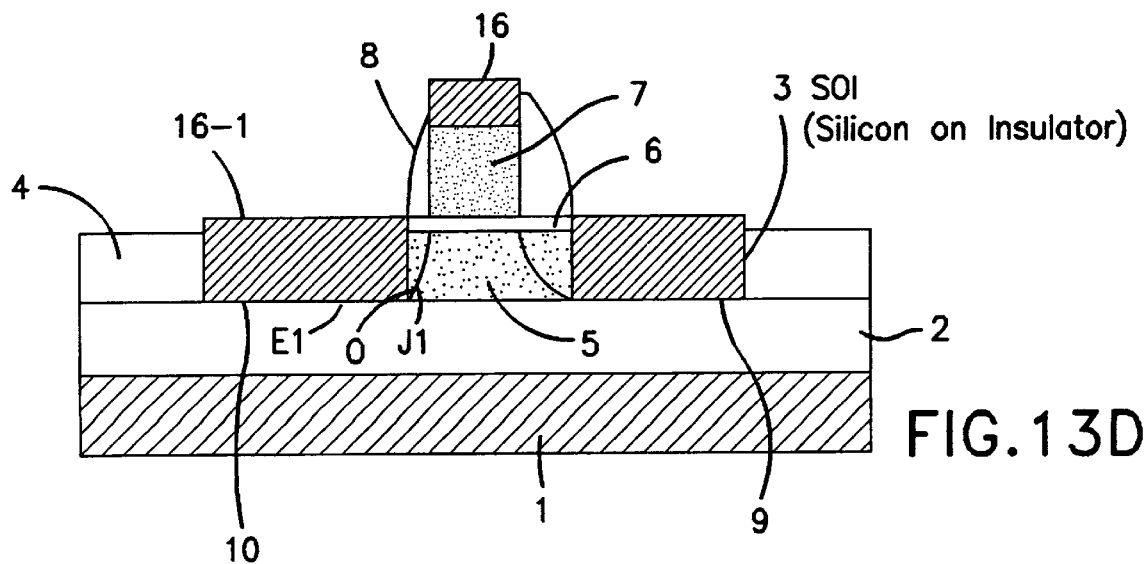

With reference to FIG. 13D, a refractory metal layer made of, for example, titanium or cobalt is entirely deposited over the source and drain regions 10 and 9, the field oxide films 4 and the gate electrode 7 as well as the side wall insulation films 8 by sputtering a refractory metal target. The refractory metal layer is thick. A heat treatment is carried out to cause a silicidation reaction of the refractory metal with silicon thereby to selectively form the first and second silicide layers 16-1 and 16-2 in the source and drain regions 10 and 9 respectively as well as form another silicide layer 16 over the gate electrode 7 which is made of polysilicon. The first silicide layer 16-1 is formed in the source region 10 up to the bottom level and except in the vicinity of the body portion 5 and under the first side wall oxide film 8-1. The second silicide layer 16-2 is also formed in the drain region 10 up to the bottom level and except in the vicinity of the body portion 5 and under the second side wall oxide film 8-2. As a result, an unreacted refractory metal layer remains over the side wall insulation films 8 and the field oxide films 4. The unreacted refractory metal layer is then removed. The first and second silicide layers 16-1 and 16-2 are self-aligned by the gate electrode 7 and the first and second side wall insulation films 8-1 and 8-2 which differ in thickness from each other as described above.

The inside edge of the first silicide layer 16-1 is positioned just inside in plane view of the outside edge of the first side wall oxide film 8-1. On the level of the surface of the silicon-on-insulator layer 3, the inside edge of the first silicide layer 16-1 is distanced in a lateral direction from the body portion 5 by a distance just smaller the first thickness d1 of the first side wall oxide film 8-1. The inside bottom edge E1 of the first silicide layer 16-1 is in contact with the outside bottom edge of the body portion 5 or in contact with the first interface J1 of the body portion 5 to the source region 10. In the points on the first interface J1 of the body portion5 to the source region 10, the outside bottom edge of the body portion 5 is in contact with the inside bottom edge E1 of the first silicide layer 16-1.

The inside edge of the second silicide layer 16-2 corresponds in plane view to the outside edge of the second side wall oxide film 8-2. On the level of the surface of the silicon-on-insulator layer 3, the inside edge of the second silicide layer 16-2 is distanced in a lateral direction from the body portion 5 by a distance corresponding to the second thickness d2 of the second side wall oxide film 8-2. The inside bottom edge E2 of the second silicide layer 16-2 is most close to the outside bottom edge of the body portion 5. In the points on the second interface J2 of the body portion5 to the drain region 9, the outside bottom portion of the body portion 5 is most close to the inside bottom edge E2 of the second silicide layer 16-2. As described above, the first thickness d1 of the first side wall oxide film 8-1 is thinner than the second thickness d2 of the second side wall oxide film 8-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Therefore, the first distance between the inside bottom edge E1 of the first silicide layer 16-1 and the point on the first interface J1 of the body portion 5 is zero and shorter than the second distance between the inside bottom edge E2 of the second silicide layer 16-2 and the point on the second interface J2 of the body portion 5.

Figure 13E:
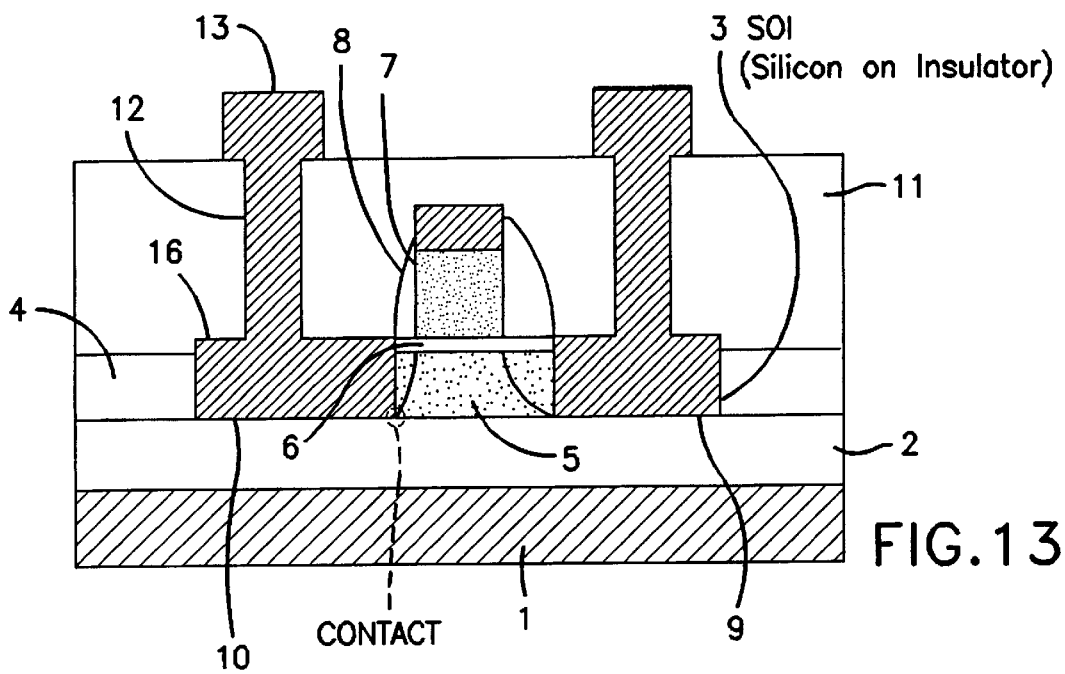

With reference to FIG. 13E, the inter-layer insulator 11 is entirely formed over the field oxide films 4, the first and second silicide layers 16-1 and 16-2 and the other silicide layer over the gate electrode 7 as well as over the side wall insulation films 8-1 and 8-2. The contact holes 12 are formed in the inter-layer insulator 11 so that the contact holes 12 are positioned over the first and second silicide layers 16-1 and 16-2 of the source and drain regions 10 and 9. Contact layers are formed in the contact holes 12 so that the contact layers are made into contact with the first and second silicide layers 16-1 and 16-2 of the source and drain regions 10 and 9. Interconnections 13 are then formed over the inter-layer insulator 11 and connected with the contact layers so that the interconnections 13 are electrically connected to the first and second silicide layers 16-1 and 16-2 of the source and drain regions 10 and 9.

Figure 14:
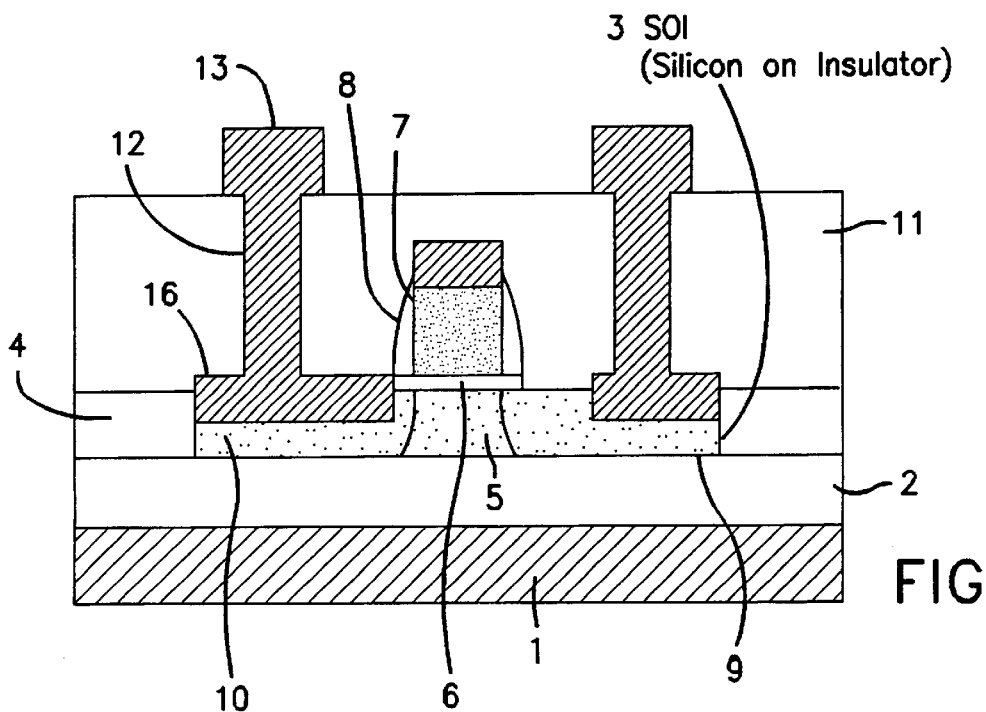
FIG. 14 is a fragmentary cross sectional elevation view illustrative of a novel SOI-MOS field effect transistor with an improved source and drain structure in a fifth embodiment in accordance with the present invention.

Fifth Embodiment:

A fifth embodiment according to the present invention will be described in detail with reference to FIG. 14 which illustrates a novel SOI-MOS field effect transistor with an improved source/drain structure. A buried oxide film 2 is provided over a silicon substrate 1. Field oxide films 4 are selectively formed on the buried oxide film 2. A silicon-on-insulator layer 3 made of silicon is formed over the buried oxide film 2 wherein the silicon-on-insulator layer 3 is defined by the field oxide films 4. The silicon-on-insulator layer 3 has $n^+$-type source/drain regions 10 and 9 and a p-type body portion 5 between the $n^+$-type source/drain regions 10 and 9. A gate oxide film 6 is provided which extends over the p-type body portion 5 and inside portions of the n-type source/drain regions 10 and 9 in the vicinity of the body portion 5. A gate electrode 7 is provided on the gate oxide film 6 so that the gate electrode 7 is positioned over the body portion 5. A first side wall oxide film 8-1 is also provided on a side wall of the gate electrode 7 in the source side and over the gate oxide film 6. The first side wall oxide film 8-1 has a first thickness d1 which may, for example, be in the range of 200–300 angstroms. A second side wall oxide film 8-2 is also provided on a side wall of the gate electrode 7 in the drain side and over the gate oxide film 6. The second side wall oxide film 8-2 has a second thickness d2 which is the same as the first thickness d1 of the first side wall oxide film 8-1. The gate electrode 7 has an upper region which comprises a silicide layer. The silicide layer may preferably be made of a refractory metal silicide which is selected from titanium silicide, cobalt silicide, nickel silicide, and tungsten silicide.

A first silicide layer 16-1 is further formed in an upper region of the source region 10 except in the vicinity of the body portion 5 and except under the first side wall oxide film 8-1. The first silicide layer 16-1 may have a thickness F. The first silicide layer 16-1 may preferably be made of a refractory metal silicide which is selected from titanium silicide, cobalt silicide, nickel silicide, and tungsten silicide. An inside edge of the first silicide layer 16-1 corresponds in plane view to an outside edge of the first side wall oxide film 8-1. On the level of the surface of the silicon-on-insulator layer 3, the inside edge of the first silicide layer 16-1 is distanced in a lateral direction from the body portion 5 by a distance corresponding to the first thickness d1 of the first side wall oxide film 8-1. The body portion 5 increases in width downwardly but gradually as illustrated in FIG. 14. An inside bottom edge E1 of the first silicide layer 16-1 is most close to a first interface J1 of the body portion 5 to the source region 10. In the points on the first interface J1 of the body portion 5 to the source region 10, a point of a level, which is lower than the inside bottom edge E1 of the first silicide layer 16-1 and higher than the bottom level of the body portion 5, is most close to the inside bottom edge E1 of the first silicide layer 16-1.

A second silicide layer 16-2 is further formed in an upper region of the drain region 9 except in the vicinity of the body portion 5 and except under the second side wall oxide film 8-2. The second silicide layer 16-2 may preferably be made of a refractory metal silicide which is selected from titanium silicide, cobalt silicide, nickel silicide, and tungsten silicide. The second silicide layer 16-2 may have the same thickness as that of the first silicide layer 16-1. An inside edge of the second silicide layer 16-2 corresponds in plane view to an outside edge of the second side wall oxide film 8-2. On the level of the surface of the silicon-on-insulator layer 3, the inside edge of the second silicide layer 16-2 is distanced in a lateral direction from the body portion 5 by a distance much larger than the second thickness d2 of the second side wall oxide film 8-2. An inside bottom edge E2 of the second silicide layer 16-2 is most close to a second interface J2 of the body portion 5 to the drain region 9. In the points on the second interface J2 of the body portion 5 to the drain region 9, a point of a level, which is lower than the inside bottom edge E2 of the second silicide layer 16-2 and higher than the bottom level of the body portion 5, is most close to the inside bottom edge E2 of the second silicide layer 16-2. On the level of the surface of the silicon-on-insulator layer 3, the distance of the inside edge of the second silicide layer 16-2 in the lateral direction from the body portion 5 is larger than the distance of the inside edge of the first silicide layer 16-1 from the body portion 5.

Therefore, the first distance between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5.

An inter-layer insulator 11 is further provided over the field oxide films 4, the first and second silicide layers 16-1 and 16-2 and the gate electrode 7 as well as over the first and second side wall oxide films 8-1 and 8-2. Contact holes 12 are formed in the inter-layer insulator 11 so that the contact holes 12 are positioned over the first and second silicide layers 16-1 and 16-2 over the source and drain regions 10 and 9 respectively. Contact layers are formed in the contact holes 12 so that the contact layers are in contact with the first and second silicide layers 16-1 and 16-2 over the source and drain regions 10 and 9 respectively. Metal interconnections 13 are provided which are connected to the contact layers so that the metal interconnections 13 are electrically connected to the source/drain regions 10 and 9.

The provision is, therefore, made of the first silicide layer 16-1 in the source region 10 at a short distance of the inside edge portion of the first silicide layer 16-1 from the first interface J1 between the source region 10 and the body portion 5, thereby to shorten the distance S1 between the first silicide layer 16-1 and the body portion 5. Therefore, the first distance S1 between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5. The life-time of the holes injected from the first interface J1 of the body portion 5 into the source region 10 until the recombination of the injected holes with electrons is defined by the first distance S1 of the inside bottom edge E1 of the first silicide layer 16-1 from the first interface J1 between the source region 10 and the body portion 5. For this reason, the shortening of the first distance S1 of the inside bottom edge E1 of the first silicide layer 16-1 from the first interface J1 between the source region 10 and the body portion 5 does result in shortening of the life-time of the holes injected from the first interface J1 of the body portion 5 into the source region 10 until the recombination of the injected holes with electrons. The current amplification factor of the parasitic bipolar transistor caused in the silicon-on-insulator layer is defined by the life-time of the holes injected from the first interface J1 of the body portion 5 into the source region 10 until the recombination of the injected holes with electrons. Therefore, the shortening of the life-time of the holes injected from the first interface J1 of the body portion 5 into the source region 10 until the recombination of the injected holes with electrons does result in a certain reduction in the current amplification factor of the parasitic bipolar transistor. The reduction in current amplification factor of the parasitic bipolar transistor suppresses the parasitic bipolar effect of the SOI-MOS field effect transistor.

In order to reduce the parasitic resistances of the shallow source region 10 including the first silicide layer 16-1 and also to suppress the parasitic bipolar effect of the SOI-MOS field effect transistor, it is effective to form the first silicide layer 16-1 in the source region 10 and the inside bottom edge E1 of the first silicide layer 16-1 is positioned in the vicinity of the first interface J1 of the body portion 5 to the source region 10, so that a relatively large leakage of current between the body portion 5 and the source region 10 is allowed, and further so that the life-time of the holes injected from the first interface J1 of the body portion 5 into the source region 10 until the recombination of the injected holes with electrons is shortened, whereby the current amplification factor of the parasitic bipolar transistor is suppressed and the parasitic bipolar effect of the SOI-MOS field effect transistor is thus suppressed. The provision of the first silicide layer 16-1 in the source region 10 and in the vicinity of the first interface J1 of the body portion 5 to the source region 10 renders the SOI-MOS field effect transistor free from the kink effect.

On the other hand, the drain region 9 has the second silicide layer 16-2 which has the inside bottom edge E2 sufficiently distanced from the second interface J2 of the body portion 5 to the drain region 9. The drain region 9 including the second silicide layer 16-2 is applied with the drain voltage which is usually a high voltage. Further, the second distance S2 of the inside bottom edge E2 of the second silicide layer 16-2 from the point of the second interface J2 between the drain region 9 and the body portion 5 is long. The provision of the second silicide layer 16-2 in the drain region 9, so that the inside bottom edge E2 of the second silicide layer 16-2 is sufficiently distanced from the second interface J2 between the drain region 9 and the body portion 5, does result in substantially no or sufficiently small leakage of current between the drain region 9 and the body portion 5. This substantially no or sufficiently small leakage of current between the drain region 9 and the body portion 5 causes substantially no or sufficiently small OFF current of the SOI-MOS field effect transistor under zero gate voltage application, resulting in a remarkable decrease in power consumption of the SOI-MOS field effect transistor. The provisions of the first and second silicide layers 16-1 and 16-2 in the source and drain regions 10 and 9 respectively do reduce in resistance of the source and drain regions 10 and 9 as well as do allow a reduction in parasitic resistance by the shallow p-n junctions of the source and drain regions 10 and 9.

Accordingly, the above improved source/drain structure, such that the first distance of the inside bottom edge E1 of the first silicide layer 16-1 from the first interface J1 between the source region 10 and the body portion 5 is shorter than the second distance of the inside bottom edge E2 of the second silicide layer 16-2 from the second interface J2 between the drain region 9 and the body portion 5, do render the SOI-MOS field effect transistor free from all of the above problems as having been engaged with the first, second and third conventional SOI-MOS field effect transistors and also do provide the following advantages.

The above improved source/drain structure is capable of reducing source/drain parasitic resistance of the SOI-MOS field effect transistor.

The above improved source/drain structure also allows a reduction in thickness of the silicon-on-insulator layer 3.

The above improved source/drain structure also allows shallow p-n junctions of the source and drain regions 10 and 9.

The above improved source/drain structure is also capable of reducing the resistance of the drain region 9.

The above improved source/drain structure is also capable of suppressing the leakage of current between the body portion 5 and the drain region 9 applied with a high drain voltage.

The above improved source/drain structure is also capable of reducing the OFF current under zero gate voltage application.

The above improved source/drain structure is also capable of reducing a power consumption of the SOI-MOS field effect transistor.

The above improved source/drain structure also allows a leakage of current between the source region 10 and the body portion 5.

The above improved source/drain structure is also capable of suppressing an excess potential rising of the body portion 5.

The above improved source/drain structure is also capable of suppressing a parasitic bipolar effect of the SOI-MOS field effect transistor.

The above improved source/drain structure also enables the SOI-MOS field effect transistor to be free from kink effect in sub-threshold characteristic which can be understood from FIG. 16 being illustrative of sub-threshold characteristics (Id-Vg characteristics) or current-voltage characteristics of the above novel SOI-MOS field effect transistor when applied with drain voltages of 1.5 V and 0.05 V.

The above improved source/drain structure is also capable of reduction in current amplification factor of a parasitic bipolar effect of the SOI-MOS field effect transistor.

The above improved source/drain structure is also capable of shortening a life-time of holes injected from the first interface J1 of the body portion 5 to the source region 10 until recombination thereof with electrons.

The above present invention of the first embodiment may be applicable to a p-channel SOI-MOS field effect transistor.

The following descriptions will highlight fabrication processes for the above n-channel SOI-MOS field effect transistor.

Figure 15A:
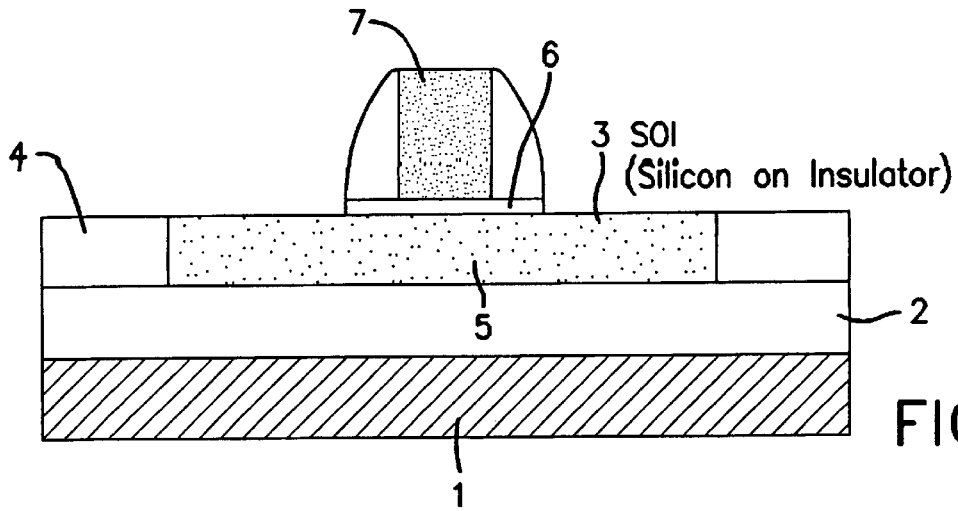
FIGS. 15A through 15E are fragmentary cross sectional elevation views illustrative of a novel SOI-MOS field effect transistor with an improved source and drain structure in sequential fabrication processes involved in a method of forming the novel SOI-MOS field effect transistor in a fifth embodiment in accordance with the present invention.

With reference to FIG. 15A, the buried oxide film 2 is formed over the silicon substrate 1. The silicon-on-insulator layer 3 of silicon is formed over the buried oxide film 2 so that an SOI-substrate is formed. The field oxide films 4 are selectively formed over the buried oxide film 2 so that the field oxide films 4 define the silicon-on-insulator layer 3. An ion-implantation of p-type impurity such as boron into at least a center region on which the body portion 5 will be formed in later process so that at least the center region of the silicon-on-insulator layer 3 for formation of the body portion 5 is controlled in threshold voltage. The gate oxide film 6 is formed over the center region of the silicon-on-insulator layer 3 for formation of the body portion. The gate electrode 7 made of polysilicon is then formed over the gate oxide film 6. It is optionally possible to carry out an ion-implantation of n-type impurity such as phosphorus or arsenic into the p-type body portion 5 to form lightly doped drain regions which are even not illustrated.

Figure 15B:
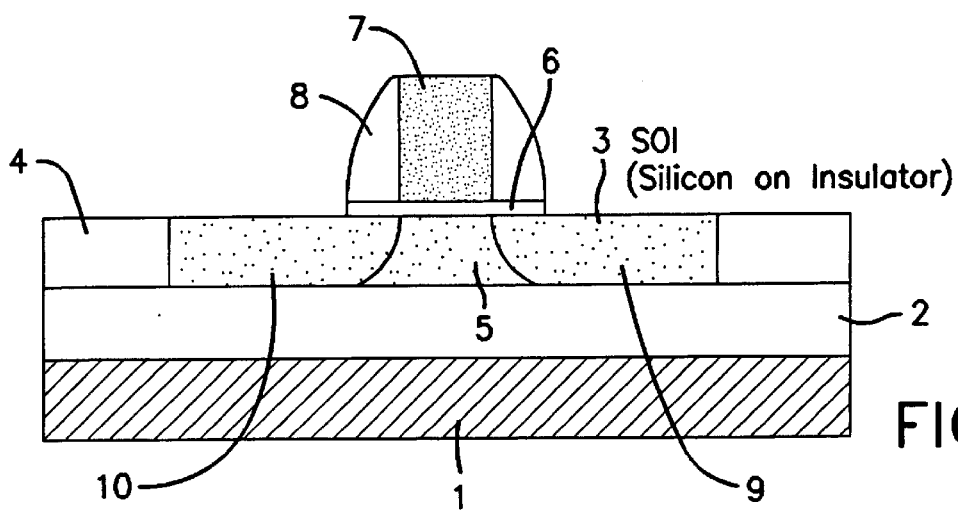

With reference to FIG. 15B, an insulation film 8 is entirely deposited which extends over the field oxide films 4, the silicon-on-insulator layer 3 and the gate electrode 7 before the insulation film 8 is then subjected to an anisotropic etching to leave the insulation film 8 only on the opposite side walls of the gate electrode 7 and over the gate oxide film 6 whereby the side wall insulation films 8 are formed on the opposite side walls of the gate electrode 7 and over the gate oxide film 6. The $n^+$-type source and drain regions 10 and 9 are formed in the silicon-on-insulator layer 3 so that the $n^+$-type source and drain regions 10 and 9 are separated by the p-type body portion 5, whereby the body portion 5 is defined between the source and drain regions 10 and 9. The body portion 5 increases in width downwardly wherein the top portion of the body portion 5 has almost the same width as the gate electrode 7 whilst the bottom portion of the body portion 5 is wider than the top portion thereof.

Figure 15C:
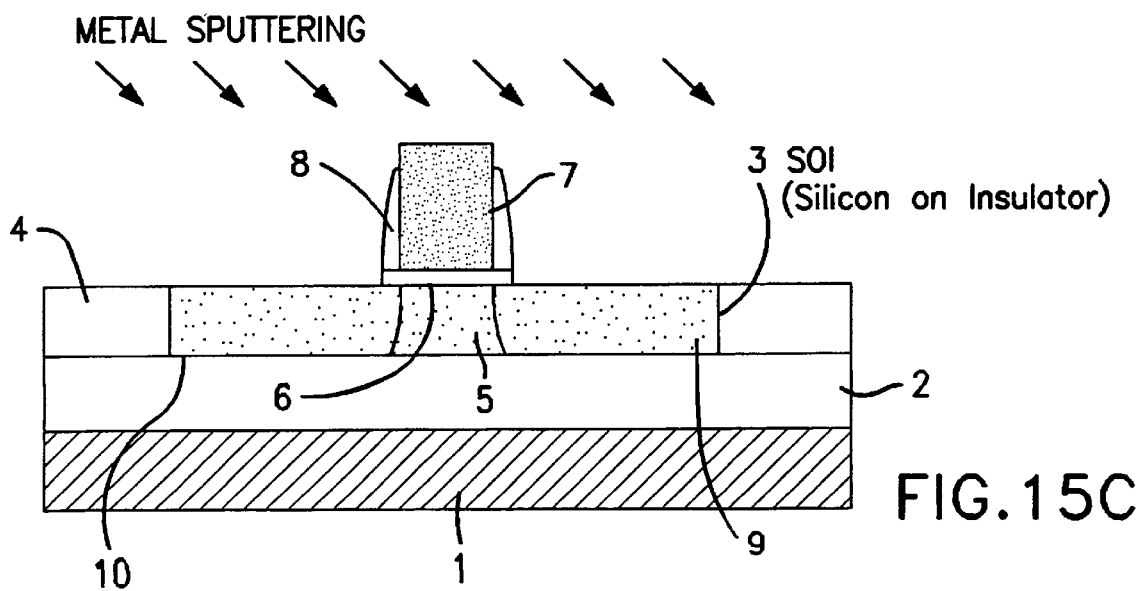

With reference to FIG. 15C, the side wall insulation films 8 of the source and drain sides are uniformly etched, whereby the thickness of the side wall insulation films 8 is reduced.

Figure 15D:
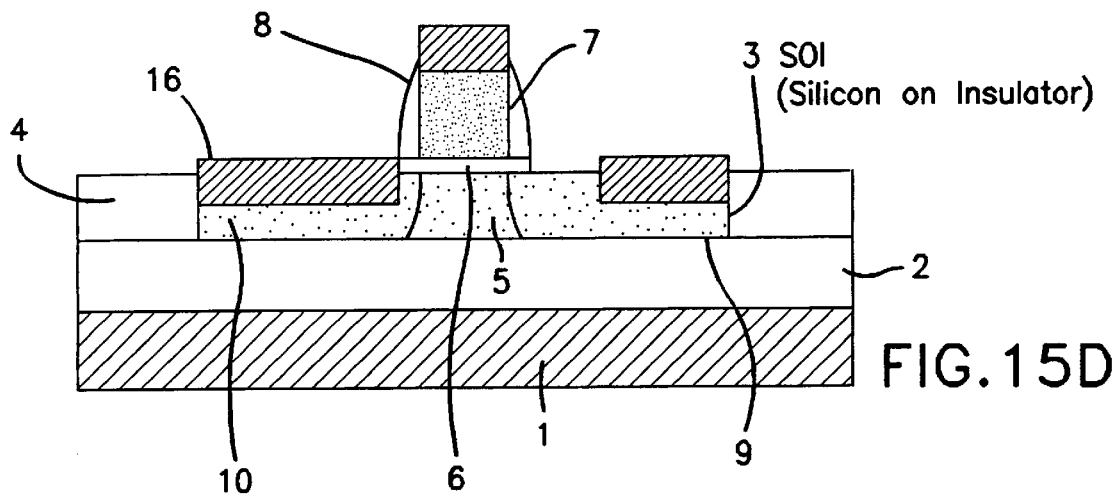

With reference to FIG. 15D, a refractory metal layer made of, for example, titanium or cobalt is entirely deposited in an oblique angle, for example, in the range of 30–45 degrees onto the source and drain regions 10 and 9, the field oxide films 4 and the gate electrode 7 as well as the side wall insulation films 8 by sputtering a refractory metal target. As a result, no refractory metal is deposited onto a shadow portion of the gate electrode 7. A heat treatment is carried out to cause a silicidation reaction of the refractory metal with silicon thereby to selectively form the first and second silicide layers 16-1 and 16-2 in upper regions of the source and drain regions 10 and 9 respectively as well as form another silicide layer 16 over the gate electrode 7 which is made of polysilicon. As a result, an unreacted refractory metal layer remains over the side wall insulation films 8 and the field oxide films 4. The unreacted refractory metal layer is then removed.

The inside edge of the first silicide layer 16-1 corresponds in plane view to the outside edge of the first side wall oxide film 8-1. On the level of the surface of the silicon-on-insulator layer 3, the inside edge of the first silicide layer 16-1 is distanced in a lateral direction from the body portion 5 by a distance corresponding to the first thickness d1 of the first side wall oxide film 8-1. The inside bottom edge E1 of the first silicide layer 16-1 is most close to a first interface J1 of the body portion 5 to the source region 10. In the points on the first interface J1 of the body portion 5 to the source region 10, the point of a level, which is lower than the inside bottom edge E1 of the first silicide layer 16-1 and higher than the bottom level of the body portion 5, is most close to the inside bottom edge E1 of the first silicide layer 16-1. A distance between the inside bottom edge E1 of the first silicide layer 16-1 and the point on the first interface J1 of the body portion 5 is defined as the first distance S1 between the inside edge portion of the first silicide layer 16-1 and the first interface J1 of the body portion 5 to the source region 10.

The inside edge of the second silicide layer 16-2 is positioned outside in plane view of the outside edge of the second side wall oxide film 8-2. On the level of the surface of the silicon-on-insulator layer 3, the inside edge of the second silicide layer 16-2 is distanced in a lateral direction from the body portion 5 by a distance much larger than the second thickness d2 of the second side wall oxide film 8-2. The inside bottom edge E2 of the second silicide layer 16-2 is most close to the second interface J2 of the body portion 5 to the drain region 9. In the points on the second interface J2 of the body portion 5 to the drain region 9, a point of a level, which is lower than the inside bottom edge E2 of the second silicide layer 16-2 and higher than the bottom level of the body portion 5, is most close to the inside bottom edge E2 of the second silicide layer 16-2. On the level of the surface of the silicon-on-insulator layer 3, the distance of the inside edge of the second silicide layer 16-2 in the lateral direction from the body portion 5 is much larger than the distance of the inside edge of the first silicide layer 16-1 from the body portion 5.

Therefore, the first distance between the inside bottom edge E1 of the first silicide layer 16-1 and the point on the first interface J1 of the body portion 5 is shorter than the second distance between the inside bottom edge E2 of the second silicide layer 16-2 and the point on the second interface J2 of the body portion 5.

Figure 15E:
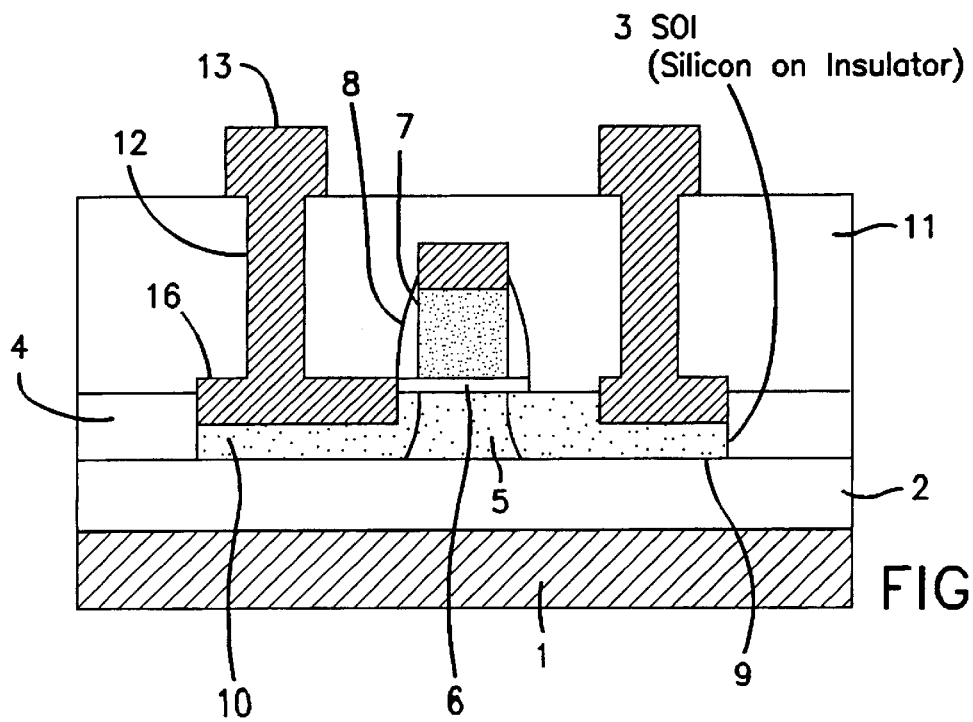

With reference to FIG. 15E, the inter-layer insulator 11 is entirely formed over the field oxide films 4, the first and second silicide layers 16-1 and 16-2 and the other silicide layer over the gate electrode 7 as well as over the side wall insulation films 8-1 and 8-2. The contact holes 12 are formed in the inter-layer insulator 11 so that the contact holes 12 are positioned over the first and second silicide layers 16-1 and 16-2 of the source and drain regions 10 and 9. Contact layers are formed in the contact holes 12 so that the contact layers are made into contact with the first and second silicide layers 16-1 and 16-2 of the source and drain regions 10 and 9. Interconnections 13 are then formed over the inter-layer insulator 11 and connected with the contact layers so that the interconnections 13 are electrically connected to the first and second silicide layers 16-1 and 16-2 of the source and drain regions 10 and 9.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A source/drain structure formed in a semiconductor layer which has source and drain regions of a first conductivity type and a body portion of a second conductivity type disposed between said source and drain regions, said body portion being positioned under a gate insulation film over which a gate electrode is provided, said source region having a first low resistive region which is lower in electrical resistivity than said source region and said drain region having a second low resistive region which is lower in electrical resistively than said source region, wherein a distance of an inside edge portion of said first low resistive region from a first interface between said source region and said body portion is shorter than a distance of an inside portion of said second low resistive region from a second interface between said drain region and said body portion.

2. The source/drain structure as claimed in claim 1, wherein said semiconductor layer comprises a silicon layer.

3. The source/drain structure as claimed in claim 2, wherein said first and second low resistive regions comprise metal silicide layers.

4. The source/drain structure as claimed in claim 3, wherein said first and second low resistive regions comprise refractory metal silicide layers.

5. The source/drain structure as claimed in claim 1, wherein said first and second low resistive regions comprise metal layers.

6. The source/drain structure as claimed in claim 1, wherein said first and second low resistive regions comprise semiconductor layers which have lower electrical resistivities than those of said source and drain regions.

7. The source/drain structure as claimed in claim 1, further comprising a first side wall insulation film formed on a first side wall of said gate electrode and in the vicinity of said source region, and a second side wall insulation film formed on a second side wall of said gate electrode and in the vicinity of said drain region, wherein said first side wall insulation film has a first thickness which is substantially the same as said distance between said inside edge portion of said first low resistive region and said first interface and said second side wall insulation film has a second thickness which is substantially the same as said distance between said inside edge portion of said second low resistive region and said second interface.

8. The source/drain structure as claimed in claim 1, wherein said first and second low resistive regions selectively extend in upper regions of said source and drain regions.

9. The source/drain structure as claimed in claim 8, wherein said first low resistive region is separated by a part of said source region from said first interface between said source region and said body portion.

10. The source/drain structure as claimed in claim 8, wherein said first low resistive region has an inside edge portion, at least a part of which is in contact with said first interface between said source region and said body portion.

11. The source/drain structure as claimed in claim 8, wherein said first low resistive region has an inside edge upper portion which is adjacent to but slightly distanced from said gate electrode.

12. The source/drain structure as claimed in claim 1, wherein said first and second low resistive regions deeply extend from top surfaces of said source and drain regions to bottom surfaces thereof.

13. The source/drain structure as claimed in claim 12, wherein said first low resistive region is separated by a part of said source region from said first interface between said source region and said body portion.

14. The source/drain structure as claimed in claim 12, wherein said first low resistive region has an inside edge portion, at least a part of which is in contact with said first interface between said source region and said body portion.

15. The source/drain structure as claimed in claim 12, wherein said first low resistive region has an inside edge upper portion which is adjacent to but slightly distanced from said gate electrode.

16. The source/drain structure as claimed in claim 1, wherein said first and second low resistive regions deeply extend from top surfaces of said source and drain regions to deep levels slightly upper than bottom surfaces of said source and drain regions.

17. The source/drain structure as claimed in claim 16, wherein said first low resistive region is separated by a part of said source region from said first interface between said source region and said body portion.

18. The source/drain structure as claimed in claim 16, wherein said first low resistive region has an inside edge portion, at least a part of which is in contact with said first interface between said source region and said body portion.

19. The source/drain structure as claimed in claim 16, wherein said first low resistive region has an inside edge upper portion which is adjacent to but slightly distanced from said gate electrode.

20. The source/drain structure as claimed in claim 1, wherein said first low resistive region has an inside edge portion, at least a part of which is in contact with said first interface between said source region and said body portion.

21. The source/drain structure as claimed in claim 20, wherein said first and second low resistive regions selectively extend in upper regions of said source and drain regions.

22. The source/drain structure as claimed in claim 20, wherein said first and second low resistive regions deeply extend from top surfaces of said source and drain regions to bottom surfaces thereof.

23. The source/drain structure as claimed in claim 20, wherein said first and second low resistive regions deeply extend from top surfaces of said source and drain regions to deep levels slightly upper than bottom surfaces of said source and drain regions.

24. The source/drain structure as claimed in claim 20, wherein said first low resistive region has an inside edge lower portion which is in contact with said first interface between said source region and said body portion, and wherein said first low resistive region also has an inside edge upper portion which is adjacent to but slightly distanced from said gate electrode.

25. The source/drain structure as claimed in claim 1, wherein said first low resistive region is separated by a part of said source region from said first interface between said source region and said body portion.

26. The source/drain structure as claimed in claim 25, wherein said first and second low resistive regions selectively extend in upper regions of said source and drain regions.

27. The source/drain structure as claimed in claim 25, wherein said first and second low resistive regions deeply extend from top surfaces of said source and drain regions to bottom surfaces thereof.

28. The source/drain structure as claimed in claim 25, wherein said first and second low resistive regions deeply extend from top surfaces of said source and drain regions to deep levels slightly upper than bottom surfaces of said source and drain regions.

29. The source/drain structure as claimed in claim 25, wherein said first low resistive region has an inside edge lower portion which is in contact with said first interface between said source region and said body portion, and wherein said first low resistive region also has an inside edge upper portion which is adjacent to but slightly distanced from said gate electrode.

30. The source/drain structure as claimed in claim 1, wherein said first low resistive region has an inside edge upper portion which is adjacent to but slightly distanced from said gate electrode.

31. The source/drain structure as claimed in claim 30, wherein said first and second low resistive regions selectively extend in upper regions of said source and drain regions.

32. The source/drain structure as claimed in claim 30, wherein said first and second low resistive regions deeply extend from top surfaces of said source and drain regions to bottom surfaces thereof.

33. The source/drain structure as claimed in claim 30, wherein said first and second low resistive regions deeply extend from top surfaces of said source and drain regions to deep levels slightly upper than bottom surfaces of said source and drain regions.

34. The source/drain structure as claimed in claim 30, wherein said first low resistive region has an inside edge lower portion which is in contact with said first interface between said source region and said body portion.

35. The source/drain structure as claimed in claim 1, wherein said distance of said inside edge portion of said first low resistive region from said first interface between said source region and said body portion is a half or less than said distance of said inside portion of said second low resistive region from said second interface between said drain region and said body portion.

36. The source/drain structure as claimed in claim 1, wherein said distance of said inside edge portion of said first low resistive region from said first interface between said source region and said body portion is in the range of 200–300 angstroms, whilst said distance of said inside portion of said second low resistive region from said second interface between said drain region and said body portion is about 1000 angstroms.

37. The source/drain structure as claimed in claim 1, wherein said semiconductor layer is a silicon-on-insulator layer which is formed on an buried insulation layer over a silicon substrate so that said body portion is electrically isolated from said silicon substrate.

38. The source/drain structure as claimed in claim 1, further comprising a first contact layer having a bottom portion which is in contact with said first low resistive low resistive region and also having a top portion which is connected to a first interconnection, and a second contact layer having a bottom portion which is in contact with said second low resistive low resistive region and also having a top portion which is connected to a second interconnection.

39. The source/drain structure as claimed in claim 1, wherein said first low resistive region has a bottom which lies at a deeper level than that of said second low resistive region.

40. The source/drain structure as claimed in claim 1, further comprising a first side wall insulation film formed on a first side wall of said gate electrode and in the vicinity of said source region, and a second side wall insulation film formed on a second side wall of said gate electrode and in the vicinity of said drain region, wherein said first side wall insulation film has a first thickness which is substantially the same as said distance between said inside edge portion of said first low resistive region and said first interface, and wherein said second side wall insulation film has a second thickness which is substantially the same as said first thickness of said first side wall insulation film and which is smaller than said distance between said inside edge portion of said second low resistive region and said second interface.

41. A semiconductor device comprising:

a semiconductor substrate;

a buried insulation layer provided on said semiconductor substrate;

a silicon layer provided on said buried insulation layer so that said silicon layer is electrically isolated from said semiconductor substrate, said silicon layer having source and drain regions of a first conductivity type and a body portion of a second conductivity type disposed between said source and drain regions, and said source region having a first low resistive region which is lower in electrical resistivity than said source region and said drain region having a second low resistive region which is lower in electrical resistively than said source region;

a gate insulation film extending over said body portion and over inside portions of said source and drain regions in the vicinity of said body portion; and a gate electrode on said gate insulation film so that said gate electrode is positioned over said body portion;

wherein a distance of an inside edge portion of said first low resistive region from a first interface between said source region and said body portion is shorter than a distance of an inside portion of said second low resistive region from a second interface between said drain region and said body portion.

42. The semiconductor device as claimed in claim 41, wherein said semiconductor substrate comprises a silicon substrate.

43. The semiconductor device as claimed in claim 42, wherein said first and second low resistive regions comprise metal silicide layers.

44. The semiconductor device as claimed in claim 43, wherein said first and second low resistive regions comprise refractory metal silicide layers.

45. The semiconductor device as claimed in claim 41, wherein said first and second low resistive regions comprise metal layers.

46. The semiconductor device as claimed in claim 41, wherein said first and second low resistive regions comprise semiconductor layers which have lower electrical resistivities than those of said source and drain regions.

47. The semiconductor device as claimed in claim 41, further comprising a first side wall insulation film formed on a first side wall of said gate electrode and in the vicinity of said source region, and a second side wall insulation film formed on a second side wall of said gate electrode and in the vicinity of said drain region, wherein said first side wall insulation film has a first thickness which is substantially the same as said distance between said inside edge portion of said first low resistive region and said first interface and said second side wall insulation film has a second thickness which is substantially the same as said distance between said inside edge portion of said second low resistive region and said second interface.

48. The semiconductor device as claimed in claim 41, wherein said first and second low resistive regions selectively extend in upper regions of said source and drain regions.

49. The semiconductor device as claimed in claim 48, wherein said first low resistive region is separated by a part of said source region from said first interface between said source region and said body portion.

50. The semiconductor device as claimed in claim 48, wherein said first low resistive region has an inside edge portion, at least a part of which is in contact with said first interface between said source region and said body portion.

51. The semiconductor device as claimed in claim 48, wherein said first low resistive region has an inside edge upper portion which is adjacent to but slightly distanced from said gate electrode.

52. The semiconductor device as claimed in claim 41, wherein said first and second low resistive regions deeply extend from top surfaces of said source and drain regions to bottom surfaces thereof.

53. The semiconductor device as claimed in claim 52, wherein said first low resistive region is separated by a part of said source region from said first interface between said source region and said body portion.

54. The semiconductor device as claimed in claim 52, wherein said first low resistive region has an inside edge portion, at least a part of which is in contact with said first interface between said source region and said body portion.

55. The semiconductor device as claimed in claim 52, wherein said first low resistive region has an inside edge upper portion which is adjacent to but slightly distanced from said gate electrode.

56. The semiconductor device as claimed in claim 41, wherein said first and second low resistive regions deeply extend from top surfaces of said source and drain regions to deep levels slightly upper than bottom surfaces of said source and drain regions.

57. The semiconductor device as claimed in claim 56, wherein said first low resistive region is separated by a part of said source region from said first interface between said source region and said body portion.

58. The semiconductor device as claimed in claim 56, wherein said first low resistive region has an inside edge portion, at least a part of which is in contact with said first interface between said source region and said body portion.

59. The semiconductor device as claimed in claim 56, wherein said first low resistive region has an inside edge upper portion which is adjacent to but slightly distanced from said gate electrode.

60. The semiconductor device as claimed in claim 41, wherein said first low resistive region has an inside edge portion, at least a part of which is in contact with said first interface between said source region and said body portion.

61. The semiconductor device as claimed in claim 60, wherein said first and second low resistive regions selectively extend in upper regions of said source and drain regions.

62. The semiconductor device as claimed in claim 60, wherein said first and second low resistive regions deeply extend from top surfaces of said source and drain regions to bottom surfaces thereof.

63. The semiconductor device as claimed in claim 60, wherein said first and second low resistive regions deeply extend from top surfaces of said source and drain regions to deep levels slightly upper than bottom surfaces of said source and drain regions.

64. The semiconductor device as claimed in claim 60, wherein said first low resistive region has an inside edge lower portion which is in contact with said first interface between said source region and said body portion, and wherein said first low resistive region also has an inside edge upper portion which is adjacent to but slightly distanced from said gate electrode.

65. The semiconductor device as claimed in claim 41, wherein said first low resistive region is separated by a part of said source region from said first interface between said source region and said body portion.

66. The semiconductor device as claimed in claim 65, wherein said first and second low resistive regions selectively extend in upper regions of said source and drain regions.

67. The semiconductor device as claimed in claim 65, wherein said first and second low resistive regions deeply extend from top surfaces of said source and drain regions to bottom surfaces thereof.

68. The semiconductor device as claimed in claim 65, wherein said first and second low resistive regions deeply extend from top surfaces of said source and drain regions to deep levels slightly upper than bottom surfaces of said source and drain regions.

69. The semiconductor device as claimed in claim 65, wherein said first low resistive region has an inside edge lower portion which is in contact with said first interface between said source region and said body portion, and wherein said first low resistive region also has an inside edge upper portion which is adjacent to but slightly distanced from said gate electrode.

70. The semiconductor device as claimed in claim 41, wherein said first low resistive region has an inside edge upper portion which is adjacent to but slightly distanced from said gate electrode.

71. The semiconductor device as claimed in claim 70, wherein said first and second low resistive regions selectively extend in upper regions of said source and drain regions.

72. The semiconductor device as claimed in claim 70, wherein said first and second low resistive regions deeply extend from top surfaces of said source and drain regions to bottom surfaces thereof.

73. The semiconductor device as claimed in claim 70, wherein said first and second low resistive regions deeply extend from top surfaces of said source and drain regions to deep levels slightly upper than bottom surfaces of said source and drain regions.

74. The semiconductor device as claimed in claim 70, wherein said first low resistive region has an inside edge lower portion which is in contact with said first interface between said source region and said body portion.

75. The semiconductor device as claimed in claim 41, wherein said distance of said inside edge portion of said first low resistive region from said first interface between said source region and said body portion is a half or less than said distance of said inside portion of said second low resistive region from said second interface between said drain region and said body portion.

76. The semiconductor device as claimed in claim 41, wherein said distance of said inside edge portion of said first low resistive region from said first interface between said source region and said body portion is in the range of 200–300 angstroms, whilst said distance of said inside portion of said second low resistive region from said second interface between said drain region and said body portion is about 1000 angstroms.

77. The semiconductor device as claimed in claim 41, further comprising a first contact layer having a bottom portion which is in contact with said first low resistive low resistive region and also having a top portion which is connected to a first interconnection, and a second contact layer having a bottom portion which is in contact with said second low resistive low resistive region and also having a top portion which is connected to a second interconnection.

78. The semiconductor device as claimed in claim 41, wherein said first low resistive region has a bottom which lies at a deeper level than that of said second low resistive region.

79. The semiconductor device as claimed in claim 41, further comprising a first side wall insulation film formed on a first side wall of said gate electrode and in the vicinity of said source region, and a second side wall insulation film formed on a second side wall of said gate electrode and in the vicinity of said drain region, wherein said first side wall insulation film has a first thickness which is substantially the same as said distance between said inside edge portion of said first low resistive region and said first interface, and wherein said second side wall insulation film has a second thickness which is substantially the same as said first thickness of said first side wall insulation film and which is smaller than said distance between said inside edge portion of said second low resistive region and said second interface.

* * * * *